(12) United States Patent
Granik et al.

(10) Patent No.: US 7,552,416 B2
(45) Date of Patent: Jun. 23, 2009

(54) CALCULATION SYSTEM FOR INVERSE MASKS

(76) Inventors: Yuri Granik, 554 Driscoll Pl., Palo Alto, CA (US) 94306; Kyohei Sakajiri, 1948 Southwest River Square, Portland, OR (US) 97201

( * ) Notice: Subject to any disclaimer, the term of this patent is extended or adjusted under 35 U.S.C. 154(b) by 0 days.

(21) Appl. No.: 11/621,082

(22) Filed: Jan. 8, 2007

(65) Prior Publication Data
US 2007/0198963 A1 Aug. 23, 2007

Related U.S. Application Data

(63) Continuation-in-part of application No. 11/364,802, filed on Feb. 28, 2006.

(60) Provisional application No. 60/792,476, filed on Apr. 14, 2006, provisional application No. 60/657,260, filed on Feb. 28, 2005, provisional application No. 60/658,278, filed on Mar. 2, 2005, provisional application No. 60/722,840, filed on Sep. 30, 2005.

(51) Int. Cl.
*G06F 17/50* (2006.01)
(52) U.S. Cl. .......................................... 716/19; 716/21
(58) Field of Classification Search .................. None
See application file for complete search history.

(56) References Cited

U.S. PATENT DOCUMENTS 7,266,803 B2 * 9/2007 Chou et al. .................... 716/21

2007/0006113 A1 * 1/2007 Hu et al. ........................ 716/19

OTHER PUBLICATIONS

Granik, "Source optimization for image fidelity and throughput," 2004 Society of Photo-Optical Instrumentation Engineers, pp. 509-522.*
Granik, "Illuminator Optimization Methods in Microlithography," 2004 Proc. of SPIE vol. 5524, pp. 217-229.*
Barouch, E., et al., "Illuminator Optimization for Projection Printing," Proceedings of the SPIE 3679:697-703, Jul. 1999.
Cobb, N., and A. Zakhor, "Fast, Low-Complexity Mask Design," Proceedings of the SPIE 2440:313-327, May 1995.
Cobb, N.B., "Fast Optical and Process Proximity Correction Algorithms for Integrated Circuit Manufacturing," Dissertation, University of California at Berkeley, 1998, 123 pages.
Erdmann, A., et al., "Towards Automatic Mask and Source Optimization for Optical Lithography," Proceedings of the SPIE 5377:646-657, May 2004.

(Continued)

*Primary Examiner*—Leigh Marie Garbowski
(74) *Attorney, Agent, or Firm*—Christensen O'Connor Johnson Kindness PLLC

(57) ABSTRACT

A system for calculating mask data to create a desired layout pattern on a wafer reads all or a portion of a desired layout pattern. Mask data having pixels with transmission values is defined along with corresponding optimal mask data pixel transmission values. An objective function is defined that compares image intensities as would be generated on a wafer with an optimal image intensity at a point corresponding to a pixel. The objective function is minimized to determine the transmission values of the mask pixels that will reproduce the desired layout pattern on a wafer.

9 Claims, 37 Drawing Sheets

OTHER PUBLICATIONS

Fienup, J.R., "Phase Retrieval Algorithms: A Comparison," Applied Optics 21:2758-2769, 1982.

Gamo, H., "Matrix Treatment of Partial Coherence," Progress in Optics 3:189-332, Amsterdam, 1963.

Gerchberg, R.W., and W.O. Saxton, "A Practical Algorithm for the Determination of Phase From Image and Diffraction Plane Pictures," Optik 35:237-246, 1972.

Gould, N., "Quadratic Programming: Theory and Methods," 3rd FNRC Cycle in Math. Programming, Belgium, 2000, pp. 1-67.

Granik, Y., "Solving Inverse Problems of Optical Microlithography," Proceedings of the SPIE 5754:506-526, 2004.

Granik, Y., "Source Optimization for Image Fidelity and Throughput," J. Microlith. Microfab. Microsyst. 3:509-522, Oct. 2004.

Han, C.-G., et al., "On the Solution of Indefinite Quadratic Problems Using an Interior-Point Algorithm," Informatica 3(4):474-496, 1992.

Hwang, C., et al., "Layer-Specific Illumination for Low k1 Periodic and Semi-Periodic DRAM Cell Patterns: Design Procedure and Application," Proceedings of the SPIE 5377:947-952, May 2004.

Inoue, S., et al., "Optimization of Partially Coherent Optical System for Optical Lithography," Journal of Vacuum Science and Technology B 10(6):3004-3007, 1992.

Jang, S.-H., et al., "Manufacturability Evaluation of Model-Based OPC Masks," Proceedings of the SPIE 4889:520-529, 2002.

Liu, Y., and A. Zachor, "Binary and Phase-Shifting Image Design for Optical Lithography," Proceedings of the SPIE 1463:382-399, 1991.

Liu, Y., and A. Zachor, "Optimal Binary Image Design for Optical Lithography," Proceedings of the SPIE 1264:401-412, 1990.

Nashold, K., "Image Synthesis—a Means of Producing Super-resolved Binary Images Through Bandlimited Systems," Dissertation, University of Wisconsin, Madison, 1987, pp. 1-127.

Oh, Y.-H., et al., "Optical Proximity Correction of Critical Layers in DRAW Process of 12 um Minimum Feature Size," Proceedings of the SPIE 4346:1567-1574, 2001.

Oh, Y.-H., et al., "Resolution Enhancement Through Optical Proximity Correction and Stepper Parameter Optimization for 0.12 um Mask Pattern,"Proceedings of the SPIE 3679:607-613, 1999.

Pati, Y.C., and T. Kailath, "Phase-Shifting Masks for Microlithography: Automated Design and Mask Requirements," Journal of the Optical Society of America A 11(9):2438-2452, Sep. 1994.

Poonawala, A., and P. Milanfar, "Prewarping Techniques in Imaging: Applications in Nanotechnology and Biotechnology," Proceedings of the SPIE 5674:114-127, 2005.

Qi, L., et. al., "Global Minimization of Normal Quartic Polynomials Based on Global Descent Directions," SIAM Journal on Optimization 15(1):275-302, 2005.

Rosenbluth, A., et al., "Optimum Mask and Source Patterns to Print a Given Shape," Journal of Microlithography, Microfabrication, and Microsystems 1:13-30, 2002.

Saleh, B.E.A., "Optical Bilinear Transformation: General Properties," Optica Acta 26(6):777-799, 1979.

Saleh, B.E.A., and K. Nashold, "Image Construction: Optimum Amplitude and Phase Masks in Photolithography," Applied Optics 24:1432-1437, 1985.

Sandstrom, T., et. al., "OML: Optical Maskless Lithography for Economic Design Prototyping and Small-Volume Production," Proceedings of the SPIE 5377:777-797, 2004.

Sayegh, S.I., "Image Restoration and Image Design in Non-Linear Optical Systems," Dissertation, University of Wisconsin, Madison, 1982, pp. 1-161.

Socha, R., et al., "Contact Hole Reticle Optimization by Using Interference Mapping Lithography (IML)," Proceedings of the SPIE 5446:516-534, Aug. 2004.

Sorensen, D.C., "Newton's Method With a Model Trust Region Modification," SIAM Journal of Numerical Analysis 19:409-426, 1982.

Takajo, H., et al., "Further Study on the Convergence Property of the Hybrid Input-Output Algorithm Used for Phase Retrieval," Journal of the Optical Society of America A 16(9):2163-2168, 1999.

Vallishayee, R.R., et al., "Optimization of Stepper Parameters and Their Influence on OPC," Proceedings of the SPIE 2726:660-665, Jun. 1996.

* cited by examiner

INITIAL RANDOM MASK

CONVERGENCE AT = 0.9, Y = 1

MASK CONTOURS

IMAGE CONTOURS

IMAGE CUTLINE

INITIAL RANDOM MASK

SAGNATION AT
= 0, Y = 0

MASK CONTOURS

PHASE ENTANGLEMENT

IMAGE CONTOURS

IMAGE CUTLINE

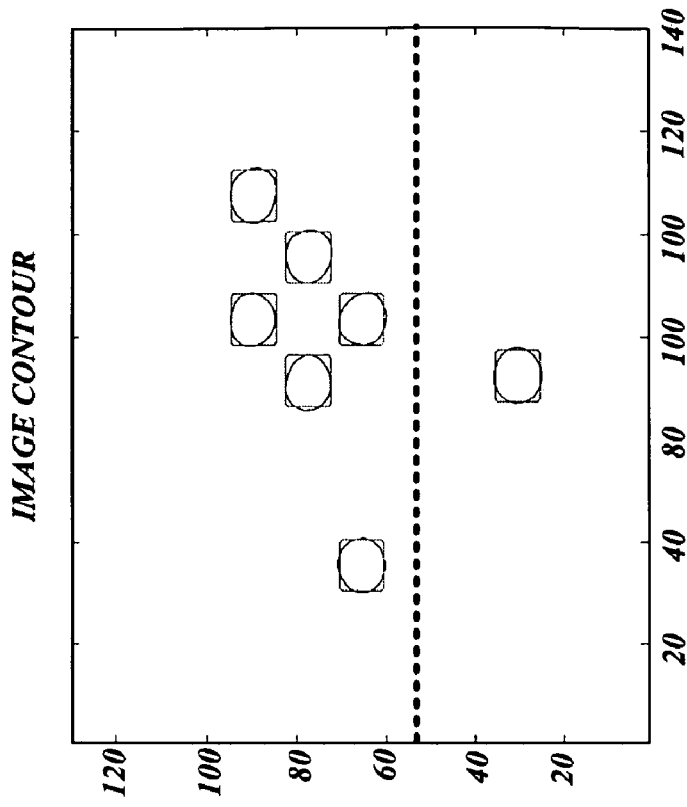
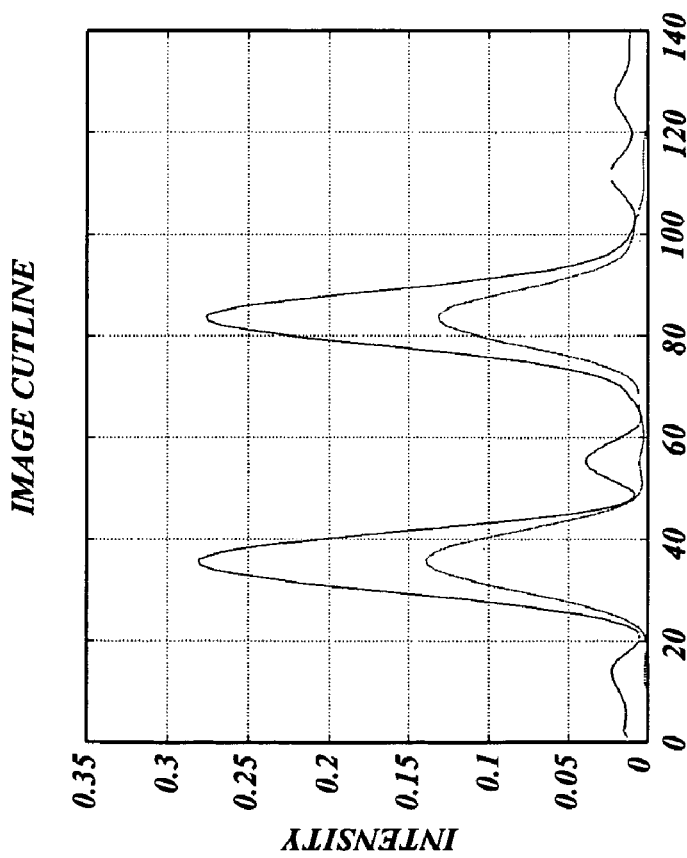
Fig. 9C.
Fig. 9B.

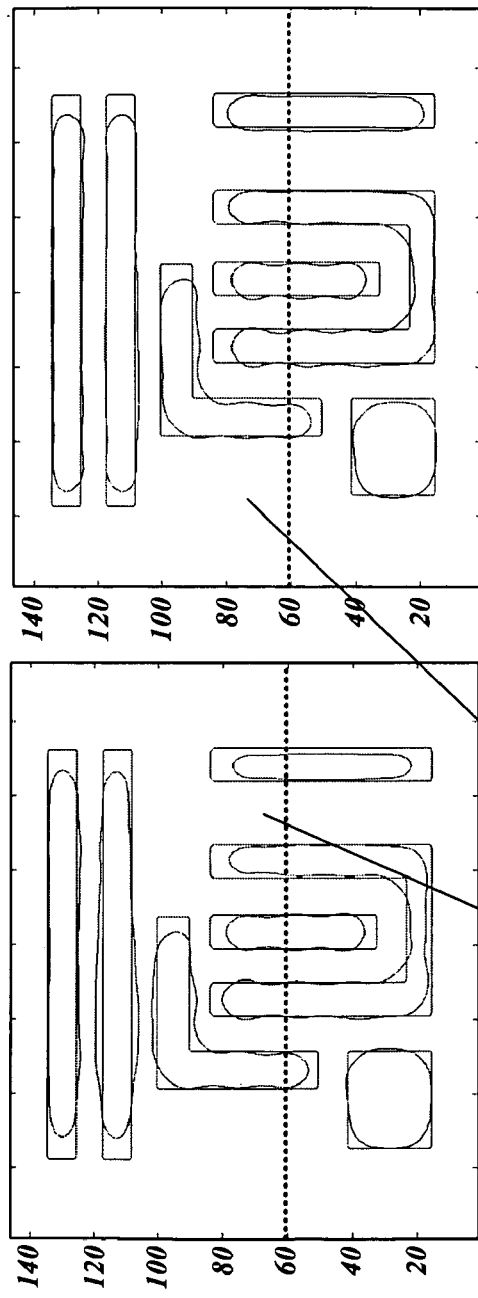
Fig.11B. CONTOURS AFTER DECONVOLUTION
Fig.11A. IMAGE CONTOURS WHEN MASK IS THE SAME AS TARGET
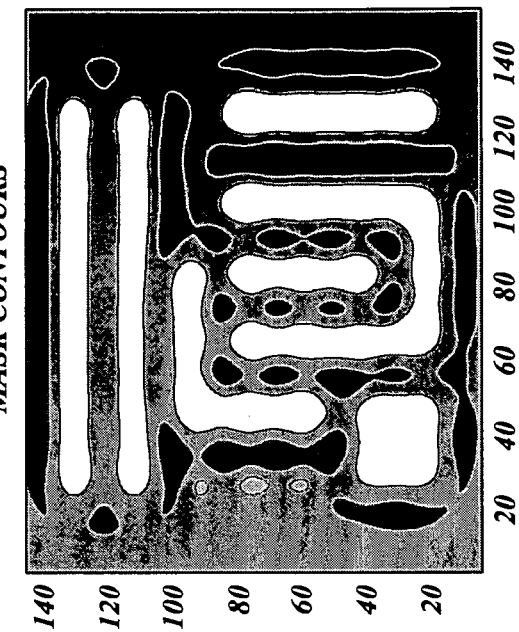
Fig.11D. MASK CONTOURS
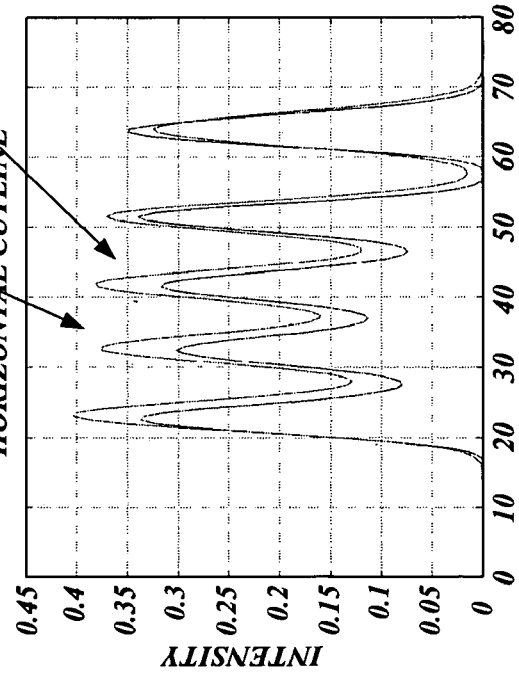
Fig.11C. HORIZONTAL CUTLINE

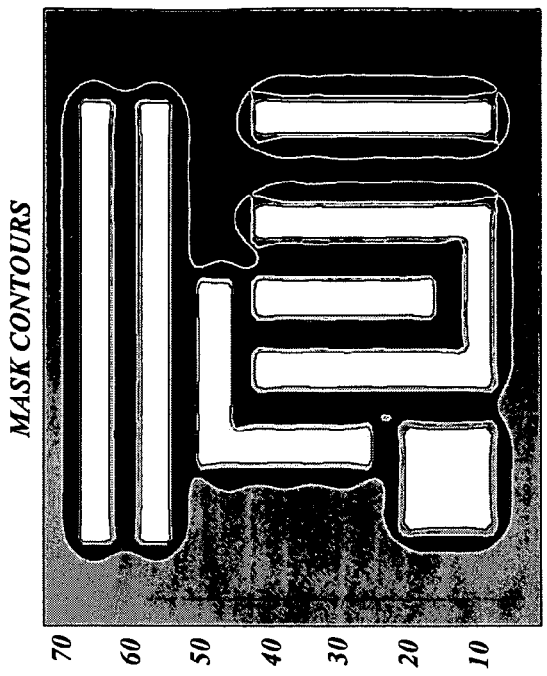
*Fig. 12D.*
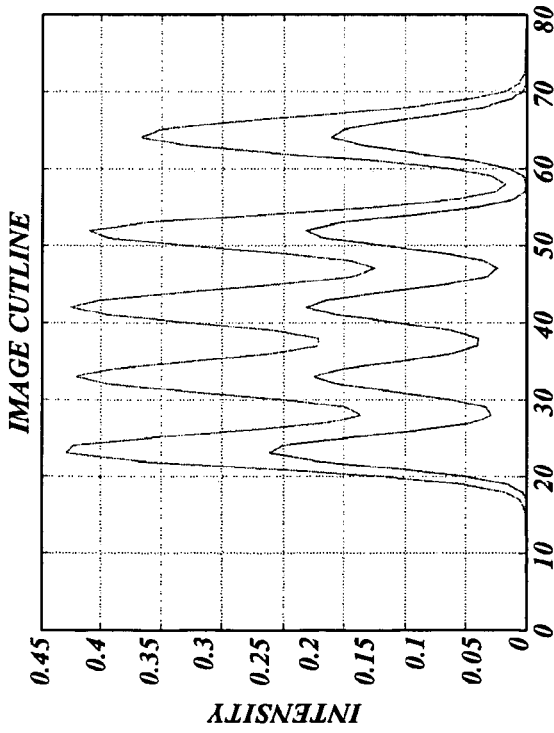
*Fig. 12B.*
*Fig. 12C.*

CALCULATION SYSTEM FOR INVERSE MASKS

CROSS-REFERENCES TO RELATED APPLICATIONS

This application claims the benefit of U.S. Provisional Patent Application No. 60/792,476 filed Apr. 14, 2006, and is a continuation-in-part of U.S. patent application Ser. No. 11/364,802 filed Feb. 28, 2006, which in turn claims the benefit of U.S. Provisional Patent Application No. 60/657,260 filed Feb. 28, 2005; U.S. Provisional Patent Application No. 60/658,278, filed Mar. 2, 2005; and U.S. Provisional Patent Application No. 60/722,840 filed Sep. 30, 2005, which are all expressly incorporated by reference herein.

FIELD OF THE INVENTION

The present invention relates to photolithography, and in particular to methods of creating a semiconductor mask or reticle to print a desired layout pattern.

BACKGROUND OF THE INVENTION

With conventional photolithographic processing techniques, integrated circuits are created on a semiconductor wafer by exposing photosensitive materials on the wafer through a mask or reticle. The wafer is then chemically and mechanically processed to build up the integrated circuit or other device on a layer-by-layer basis.

As the components of the integrated circuit or other device to be created become ever smaller, optical distortions occur whereby a pattern of features defined on a mask or reticle do not match those that are printed on the wafer. As a result, numerous resolution enhancement techniques (RETs) have been developed that seek to compensate for the expected optical distortions so that the pattern printed on a wafer will more closely match the desired layout pattern. Typically, the resolution enhancement techniques include the addition of one or more subresolution features to the mask pattern or creating features with different types of mask features such as phase shifters. Another resolution enhancement technique is optical and process correction (OPC), which analyzes a mask pattern and moves the edges of the mask features inwardly or outwardly or adds features such as serifs, hammerheads, etc., to the mask pattern to compensate for expected optical distortions.

While RETs improve the fidelity of a pattern created on a wafer, further improvements can be made.

SUMMARY OF THE INVENTION

To improve the fidelity by which a desired layout pattern can be printed on a wafer with a photolithographic imaging system, the present invention is a method and apparatus for calculating a mask or reticle layout pattern from a desired layout pattern. A computer system executes a sequence of instructions that cause the computer system to read all or a portion of a desired layout pattern and define a mask layout pattern as a number of pixel transmission characteristics. The computer system analyzes an objective function equation that relates the transmission characteristic of each pixel in the mask pattern to an image intensity on a wafer. In one embodiment, a maximum image intensity for points on a wafer is obtained from a maximum image intensity determined from a simulation of the image that would be formed using a test pattern of mask features. In one embodiment, the objective function also includes one or more penalty functions that enhance solutions meeting desired manufacturing restraints. Once the pixel transmission characteristics for the mask layout pattern are determined, the data are provided to a mask writer to fashion one or more corresponding masks for use in printing the desired layout pattern.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 9A-9C illustrate contact holes for strong PSM masks;

FIGS. 11A-11D illustrate a deconvolution by a Wiener filter in accordance with one embodiment of the present invention;

FIGS. 12A-12D illustrate a result of a least square unconstrained optimization in accordance with an embodiment of the present invention;

DETAILED DESCRIPTION OF THE PREFERRED EMBODIMENTS

Figure 19:
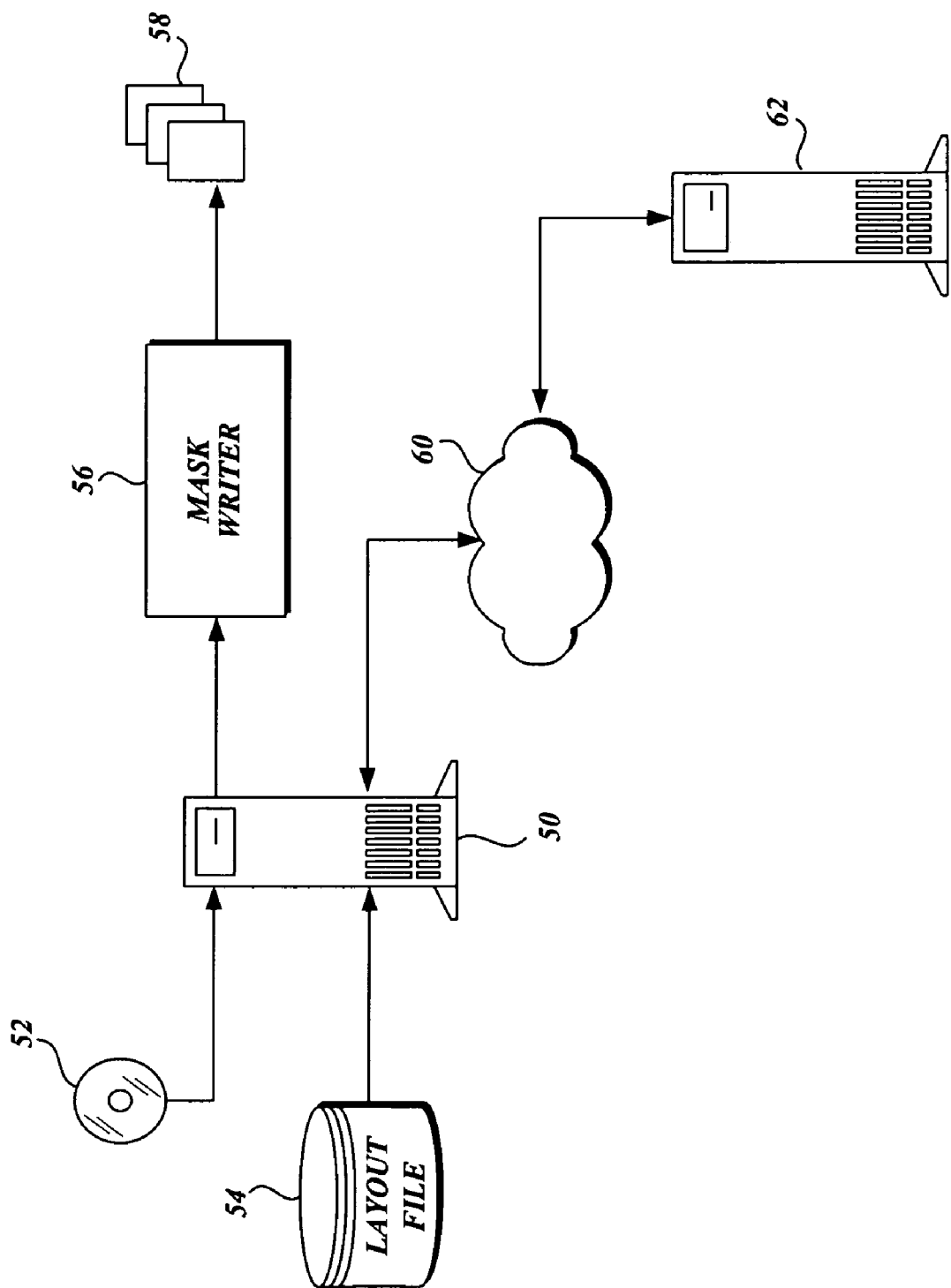
FIG. 19 illustrates a representative computer system that can be used to implement the present invention.

As will be explained in further detail below, the present invention is a method and apparatus for calculating a mask pattern that will print a desired layout or portion thereof on a wafer. FIG. 19 illustrates a representative computer system that can be used to calculate a mask layout pattern in accordance with one embodiment of the present invention. A computer system 50, including one or more programmable processors, receives a set of executable instructions on a computer-readable media 52 such as a CD, DVD, or from a communication link such as a wired or wireless communication network such as the Internet. The computer system 50 executes the instructions to read all or a portion of a desired layout file from a database 54 or other storage media. The computer system 50 then calculates data for a mask layout by dividing a mask layout into a number of discrete pixels. The computer system determines the transmission characteristic of each of the pixels so that the result on a wafer will substantially match the pattern defined in the desired layout file. After calculating the mask pixel transmission characteristics, the mask pixel data is used by a mask writer 56 in order to produce one or more corresponding masks or reticles 58. In another embodiment of the invention, the computer system 50 transmits the desired layout file or a portion thereof over a communication link 60 such as the Internet, etc., to one or more remotely located computers 62 that perform the mask data calculations.

Figure 20A:
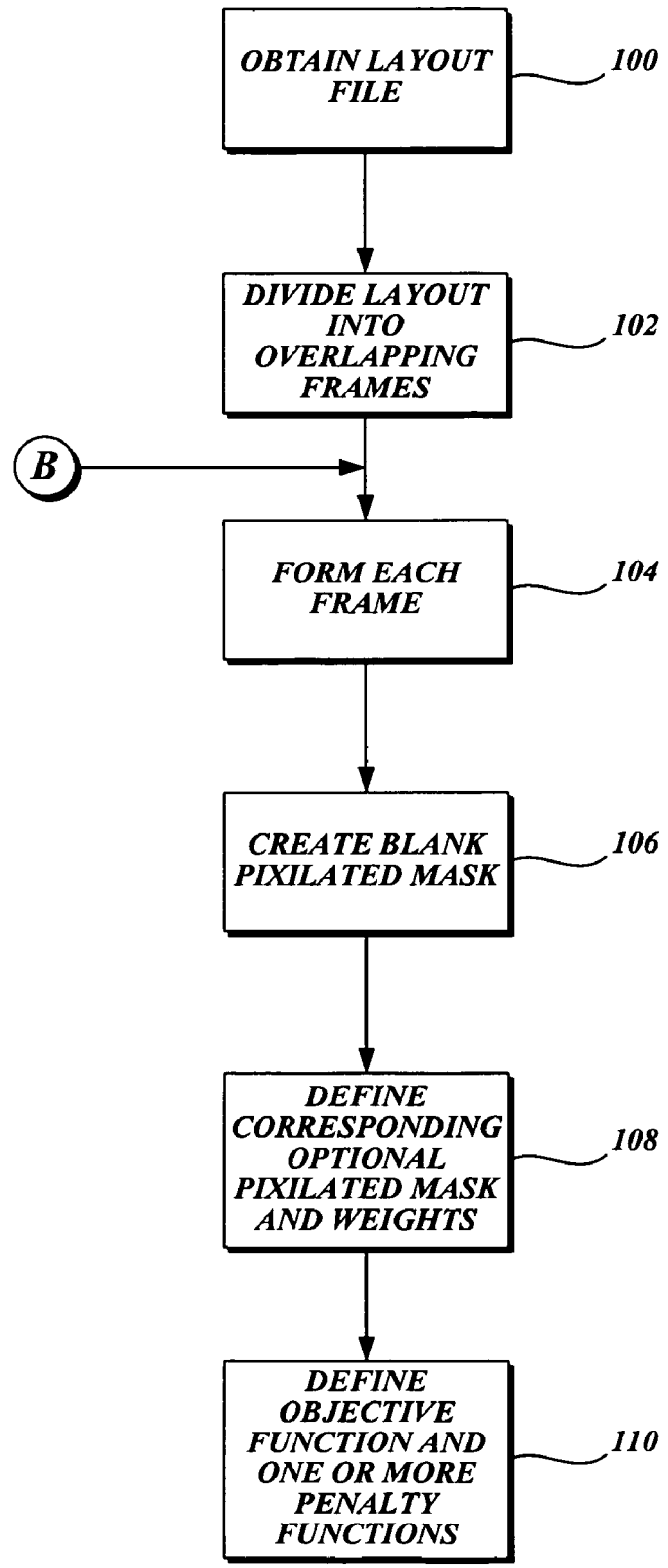
FIGS. 20A and 20B illustrate a series of steps used to calculate a mask layout pattern in accordance with one embodiment of the present invention.
Figure 20B:
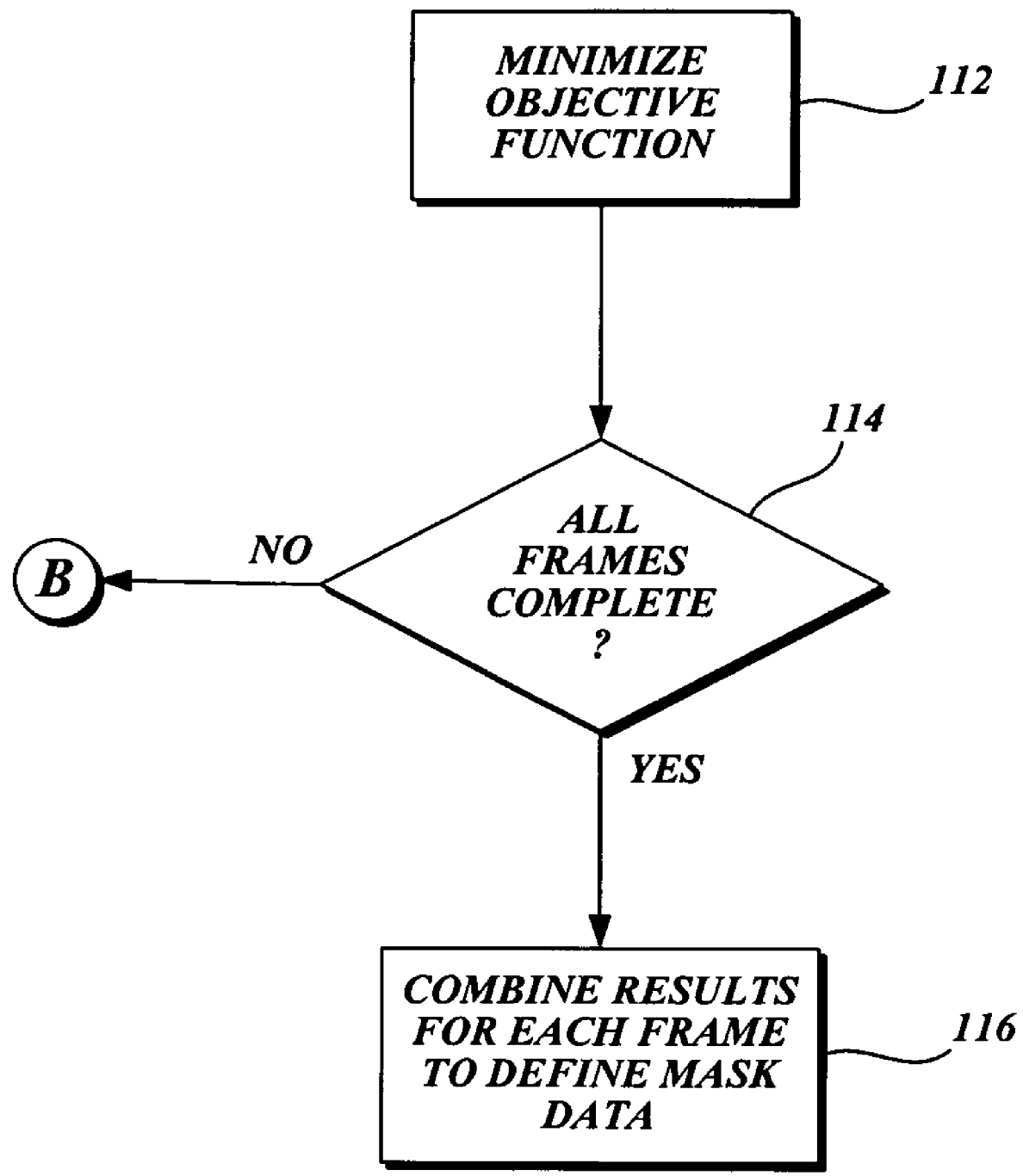

FIGS. 20A-20B illustrate one sequence of steps used to calculate the mask pixel data in accordance with an embodiment of the present invention. Although the steps are discussed in a particular order, it will be appreciated by those skilled in the art that the steps may be performed in a different order while still obtaining the functionality described.

Beginning at 100, a computer system obtains all or a portion of a layout file that defines a desired pattern of features to be created on a semiconductor wafer. At 102, the computer system divides the desired layout into a number of frames. In one embodiment, the frames form adjacent, partially overlapping areas in the layout. Each frame, for example, may occupy an area of 5×5 microns. The size of each frame may depend of the amount of memory available and the processing speed of the computer system being used.

At 104, the computer system begins processing each of the frames. At 106, the computer defines a blank area of mask data that is pixilated. At 108, the computer defines a corresponding set of optimal mask data. In one embodiment, the optimal mask data defines a corresponding set of pixels whose transmission characteristics are defined by the desired layout data. For example, each optimal mask data pixel in an area that corresponds to a wafer feature may have a transmission characteristic of 0 (e.g. opaque) and each optimal mask data pixel that corresponds to an area of no wafer feature may have a transmission characteristic of 1 (e.g. clear). In some embodiments, it may be desirable to change the data for the optimal mask data from that defined strictly by the desired layout pattern. For example, the corners of features may be rounded or otherwise modified to reflect what is practical to print on a wafer. In addition or alternatively, pixel transmission characteristics may be changed from a binary 0/1 value to a grayscale value, to positive and negative values (representing phase shifters) or to complex values (representing partial phase shifters).

In some embodiments the optimal mask data may also include or be modified by a weighting function. The weighting function allows a user to determine how close the solution for a given pixel should be to the transmission characteristic defined by the corresponding pixel in the optimal mask data. The weighting function may be a number selected between 0 and 1 that is defined for each pixel in the optimal mask data.

At 110, an objective function is defined that relates a simulation of the image intensity on wafer to the pixel transmission characteristics of the mask data and the optics of the photolithographic printing system. The objective function may be defined for each frame of mask data or the same objective function may be used for more than one frame of mask data. Typically, the objective function is defined so that the value of the objective is minimized with the best possible mask, however other possibilities could be used.

In one embodiment of the present invention, one or more penalty functions are also defined for the objective function. The penalty functions operate to steer the optimization routine described below to a solution that can be or is desired to be manufactured on a mask. For example, it may be that the objective function has a number of possible solutions of which only one can actually be made as a physical mask. Therefore, the penalty functions operate to steer the solution in a direction selected by the programmer to achieve a mask that is manufacturable. Penalty functions can be defined that promote various styles of resolution enhancement techniques such as: assist features, phase shifters, partial phase shifters, masks having features with grayscale transmission values or multiple transmission values, attenuated phase shifters, combinations of these techniques or the like.

For example, a particular mask to be made may allow each pixel to have one of three possible values with a transmission characteristic of 0 (opaque) +1 (clear) or −1 (clear with phase shift). By including a penalty function in the objective function prior to optimization, the solution is steered to a solution that can be manufactured as this type of mask.

An example of a penalty function is $\alpha_4 \|(m+e)m(m-e)\|_2^2$, where e is a one vector, as set forth in Equation 57 described in the "Fast Pixel-Based Mask Optimization for Inverse Lithography" paper below. In one embodiment, the penalty functions are defined as polynomials having zeroes at desired pixel transmission characteristics. In another embodiment, the penalty functions can represent logical operations. For example, if the area of a wafer is too dark, the corresponding pixels in the mask data can be made all bright or clear. This in combination with other mask constraints has the effect of adding subresolution assist features to the mask data.

At 112, the objective function, including penalty functions, for the frame is optimized. In one embodiment the optimized solution is found using a gradient descent. If the objective function is selected to have the form described by Equation 57, its gradient can be mathematically computed using convolution or cross-correlation, which is efficient to implement on a computer. The result of the optimization is a calculated transmission characteristic for each pixel in the mask data for the frame.

At 114, it is determined if each frame has been analyzed. If not, processing returns to 104 and the next frame is processed. If all frames are processed, the mask pixel data for each of the frames is combined at 116 to define the pixel data for one or more masks. The mask data is then ready to be delivered to a mask writer in order to manufacture the corresponding masks.

More mathematical detail of the method for computing the mask pixel transmission characteristics is described U.S. Patent Application No. 60/722,840 filed Sep. 30, 2005 and incorporated by reference herein, as well as in the paper "Fast Pixel-Based Mask Optimization for Inverse Lithography" by Yuri Granik of Mentor Graphics Corporation, 1001 Ridder Park Drive, San Jose, Calif. 95131, reproduced below (with slight edits).

The direct problem of optical microlithography is to print features on a wafer under given mask, imaging system, and process characteristics. The goal of inverse problems is to find the best mask and/or imaging system and/or process to print the given wafer features. In this study we proposed strict formalization and fast solution methods of inverse mask problems. We stated inverse mask problems (or "layout inversion" problems) as non-linear, constrained minimization problems over domain of mask pixels. We considered linear, quadratic, and non-linear formulations of the objective function. The linear problem is solved by an enhanced version of the Nashold projections. The quadratic problem is addressed by eigenvalue decompositions and quadratic programming methods. The general non-linear formulation is solved by the local variations and gradient descent methods. We showed that the gradient of the objective function can be calculated analytically through convolutions. This is the main practical result because it enables layout inversion on large scale in order of M log M operations for M pixels.

INTRODUCTION

The layout inversion goal appears to be similar or even the same as found in Optical Proximity Correction (OPC) or Resolution Enhancement Techniques (RET). However, we would like to establish the inverse mask problem as a mathematical problem being narrowly formulated, thoroughly formalized, and strictly solvable, thus differentiating it from the engineering techniques to correct ("C" in OPC) or to enhance ("E" in RET) the mask. Narrow formulation helps to focus on the fundamental properties of the problem. Thorough formalization gives opportunity to compare and advance solution techniques. Discussion of solvability establishes existence and uniqueness of solutions, and guides formulation of stopping criteria and accuracy of the numerical algorithms.

The results of pixel-based inversions can be realized by the optical maskless lithography (OML) [31]. It controls pixels of 30×30 nm (in wafer scale) with 64 gray levels. The mask pixels can be negative to achieve phase-shifting.

Strict formulations of the inverse problems, relevant to the microlithography applications, first appear in pioneering studies of B. E. A. Saleh and his students S. Sayegh and K. Nashold. In [32], Sayegh differentiates image restoration from the image design (a.k.a. image synthesis). In both, the image is given and the object (mask) has to be found. However, in image restoration, it is guaranteed that the image is achieved by some object. In image design the image may not be achievable by any object, so that we have to target the image as close as possible to the desired ideal image. The difference is analogical to solving for a function zero (image restoration) and minimizing a function (image design). Sayegh states the image design problem as an optimization problem of minimizing the threshold fidelity error $F_C$ in trying to achieve given threshold $\theta$ at the boundary C of the target image ([32], p. 86):

$$F_C[m(x, y)] = \oint_C (I(x, y) - \theta)^n dl \to \min, \quad (1)$$

where n=2 and n=4 options are explored; I(x,y) is image from the mask m(x,y); x,y are image and mask planar coordinates. Optical distortions are modeled by the linear system of convolution with the point-spread function h(x, y), so that $$I(x,y)=h(x,y)*m(x,y), \quad (2)$$

and for the binary mask (m(x, y)=0 or m(x, y)=1). Sayegh proposes algorithm of one at a time "pixel flipping". Mask is discretized, and then pixel values 0 and 1 are tried. If the error (1) decreases, then the pixel value is accepted, otherwise it is rejected, and we try the next pixel.

Nashold [22] considers a bandlimiting operator in the place of the point-spread function (2). Such formulation facilitates application of the alternate projection techniques, widely used in image processing for the reconstruction and is usually referenced as Gerchberg-Saxton phase retrieval algorithm [7]. In Nashold formulation, one searches for a complex valued mask that is bandlimited to the support of the point-spread function, and also delivers images that are above the threshold in bright areas B and below the threshold in dark areas D of the target:

$$x,y \in B: I(x,y) > \theta,$$

$$x,y \in D: I(x,y) < \theta \quad (4)$$

Both studies [32] and [22] advanced solution of inverse problems for the linear optics. However, the partially coherent optics of microlithography is not a linear but a bilinear system [29], so that instead of (2) the following holds:

$$I(x, y) = \iiint\int q\left(\begin{array}{c} x-x_1, x-x_2, \\ y-y_1, y-y_2 \end{array}\right) m(x_1, y_1) m^*(x_2, y_2) dx_1 dx_2 dy_1 dy_2, \quad (5)$$

where q is a 4D kernel of the system. While the pixel flipping [32] is also applicable to the bilinear systems, Nashold technique relies on the linearity. To get around this limitation, Pati and Kailath [25] propose to approximate bilinear operator by one coherent kernel h, the possibility that follows from Gamo results [6]:

$$I(x,y) \approx \lambda |h(x,y)*m(x,y)|^2, \quad (6)$$

where constant $\lambda$ is the largest eigenvalue of q, and h is the correspondent eigenfunction. With this the system becomes linear in the complex amplitude A of the electrical field $$A(x,y)=\sqrt{\lambda}h(x,y)*m(x,y). \quad (7)$$

Because of this and because h is bandlimited, the Nashold technique is applicable.

Liu and Zakhor [19, 18] advanced along the lines started by the direct algorithm [32]. In [19] they introduced optimization objective as a Euclidean distance $\|\cdot\|_2$ between the target $I_{ideal}$ and the actual wafer images $$F_I[m(x,y)]=\|I(x,y)-I_{ideal}(x,y)\|_2 \to \min. \tag{8}$$

This was later used in (1) as image fidelity error in source optimization. In addition to the image fidelity, the study [18] optimized image slopes in the vicinity of the target contour C:

$$F_S[m(x,y)] = \oint_{C-\varepsilon} I(x,y)dl - \oint_{C+\varepsilon} I(x,y)dl \to \min, \tag{9}$$

where $C+\epsilon$ is a sized-up and $C-\epsilon$ is a sized down contour C; $\epsilon$ is a small bias. This objective has to be combined with the requirement for the mask to be a passive optical element $m(x,y)m^*(x,y) \leq 1$ or, using infinity norm $\|.\|_\infty = \max|.|$, we can express this as $$\|m(x,y)\|_\infty \leq 1. \tag{10}$$

In case of the incoherent illumination $$I(x,y)=h(x,y)^2*(m(x,y)m^*(x,y)) \tag{12}$$

the discrete version of (9,10) is a linear programming (LP) problem for the square amplitude $p_i=m_i m_i^*$ of the mask pixels, and was addressed by the "branch and bound" algorithm. When partially coherent optics (4) is considered, the problem is complicated by the interactions $m_i m_j^*$ between pixels and becomes a quadratic programming (QP) problem. Liu [18] applied simulated annealing to solve it. Consequently, Liu and Zakhor made important contributions to the understanding of the problem. They showed that it belongs to the class of the constrained optimization problems and should be addressed as such. Reduction to LP is possible; however, the leanest relevant to microlithography and rigorous formulation must account for the partial coherence, so that the problem is intrinsically not simpler than QP. New solution methods, more sophisticated than the "pixel flipping," have also been introduced.

The first pixel-based pattern optimization software package was developed by Y.-H. Oh, J-C Lee, and S. Lim [24], and called OPERA, which stands for "Optical Proximity Effect Reducing Algorithm". The optimization objective is loosely defined as "the difference between the aerial image and the goal image," so we assume that some variant of (7) is optimized. The solution method is a random "pixel flipping," which was first tried in [32]. Despite the simplicity of this algorithm, it can be made adequately efficient for small areas if image intensity can be quickly calculated when one pixel is flipped. The drawback is that pixel flipping can easily get stuck in the local minima, especially for PSM optimizations. In addition, the resulting patterns often have numerous disjoined pixels, so they have to be smoothed, or otherwise post-processed, to be manufacturable [23]. Despite these drawbacks, it has been experimentally proven in [17] that the resulting masks can be manufactured and indeed improve image resolution.

The study [28] of Rosenbluth, A., et al., considered mask optimization as a part of the combined source/mask inverse problem. Rosenbluth indicates important fundamental properties of inverse mask problems, such as non-convexity, which causes multiple local minima. The solution algorithm is designed to avoid local minima and is presented as an elaborate plan of sequentially solving several intermediate problems.

Inspired by the Rosenbluth paper and based on his dissertation and the SOCS decomposition [2], Socha delineated the interference mapping technique [34] to optimize contact hole patterns. The objective is to maximize sum of the electrical fields A in the centers $(x_k, y_k)$ of the contacts $k=1 \ldots N$:

$$F_B[m(x,y)] = -\sum_k A(x_k, y_k) \to \min. \tag{13}$$

Here we have to guess the correct sign for each $A(x_k, y_k)$, because the beneficial amplitude is either a large positive or a large negative number ([34] uses all positive numbers, so that the larger A the better). When kernel h of (7) is real (which is true for the unaberrated clear pupil), A and $F_B$ are also real-valued under approximation (7) and for the real mask m. By substituting (7) into (13), we get $$-\sum_k A(x_k, y_k) = -\sum_k (h*m)\bigg|_{x=x_k, y=y_k} \tag{14}$$
$$= \sum_k (h*m) \cdot \delta(x-x_k, x-x_k)$$
$$= -(h*m) \cdot \left(\sum_k \delta(x-x_k, x-x_k)\right),$$

where the dot denotes an inner product $f \cdot g = \iint fg dx dy$. Using the following relationship between the inner product, convolution*, and cross-correlation $\circ$ of real functions $$(f*g)\cdot p = f\cdot(g\circ p), \tag{15}$$

we can simplify (14) to $$-\sum_k A(x_k, y_k) = -\left(h \cdot \sum_k \delta(x-x_k, x-x_k)\right) \cdot m = -G_b \cdot m, \tag{16}$$

where function $G_I$ is the interference map [34]. With (16) the problem (13) can be treated as LP with simple bounds (as defined in [8]) for the mask pixel vector $m=\{m_i\}$ $$-G_b \cdot m \to \min$$
$$-1 \leq m_i \leq 1 \tag{17}$$

In an innovative approach to the joined mask/source optimization by Erdmann, A., et al. [4], the authors apply genetic algorithms (GA) to optimize rectangular mask features and parametric source representation. GA can cope with complex non-linear objectives and multiple local minima.

REDUCTION TO LINEAR AND THRESHOLDING OPERATORS

The inverse mask problem can be reduced to a linear problem as it is shown above for IML or in [11]. This however requires substantial simplifications. Perhaps richer and more interesting is modeling with a linear system and thresholding.

The linearization (7) can be augmented by the threshold operator to model the resist response. Inverse problems for such systems can be solved by Nashold projections [22]. Nashold projections belong to the class of the image restoration techniques, rather than to the image optimizations, meaning that the method might not find the solution (because it does not exists at all), or in the case when it does converge, we cannot state that this solution is the best possible. It has been noted in [30] that the solutions strongly depend on initial guesses and do not deliver the best phase assignment unless the algorithm is steered to it by a good initial guess. Moreover, if the initial guess has all phases set to 0, then so has the solution.

Nashold projections are based on Gerchberg-Saxton [7] phase retrieval algorithm. It updates the current mask iterate $m^k$ via $$m^{k+1} = (P_m P_s) m^k, \quad (31)$$

where $P_s$ is a projection operator into the frequency support of the kernel h, and $P_m$ is a projection operator that forces the thresholding (4). Gerchberg-Saxton iterations tend to stagnate. Fienap [5] proposed basic input-output (BIO) and hybrid input-output (HIO) variations that are less likely to be stuck in the local minima. These variations can be generalized in the expression $$m^{k+1} = (P_m P_s + \alpha(\gamma(P_m P_s - P_s) - P_m + I)) m^k, \quad (32)$$

where I is an identity operator; $\alpha=1, \gamma=0$ for BIO, $\alpha=1, \gamma=1$ for HIO, and $\alpha=0, \gamma=0$ for the Gerchberg-Saxton algorithm.

We implemented operator $P_m$ as a projection onto the ideal image $$P_m m^k = \frac{m_k}{|m^k|} \sqrt{I_{ideal}}, \quad (33)$$

and $P_s$ as a projection to the domain of the kernel h, i.e. $P_s$ zeros out all frequencies of m which are high than the frequencies of the kernel h. The iterates (32) are very sensitive to the values of its parameters and the shape of ideal image. We have found meaningful solutions only when the ideal image is smoothed. Otherwise the phases come out "entangled," i.e. the phase alternates along the lines as in FIG. 1E, right, instead of alternating between lines. We used Gaussian kernel with the diffusion length of 28 nm, which is slightly larger than the pixel size 20 nm in our examples. The behavior of iterates (32) is not yet sufficiently understood [36], which complicates choice of $\alpha,\gamma$. In our examples the convergence is achieved for $\alpha=0.9, \gamma=1$ after T=5000 iterations. When $\alpha 0$, $\gamma=0$ which corresponds to the original Nashold projections (31), the iterations quickly stagnate converging to a non-printable mask. The runtime is proportional to T*M*log M, M-number of pixels. The convergence is slow because T is large, so that application to the large layout areas is problematic.

Figure 1A:
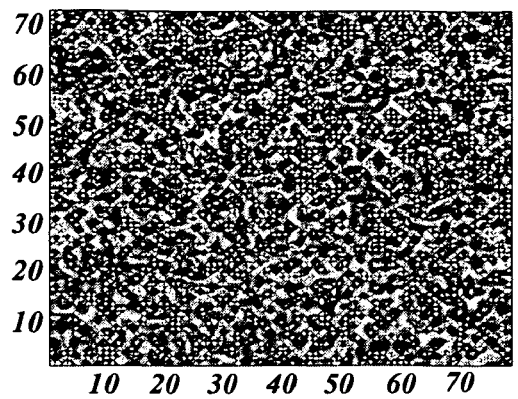
FIGS. 1A-1H illustrate conventional Nashold projections.
Figure 1B:
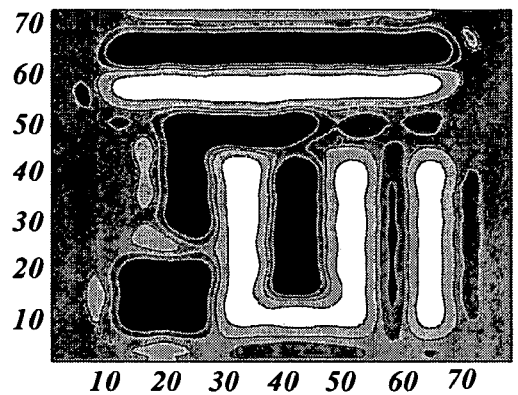
Figure 1C:
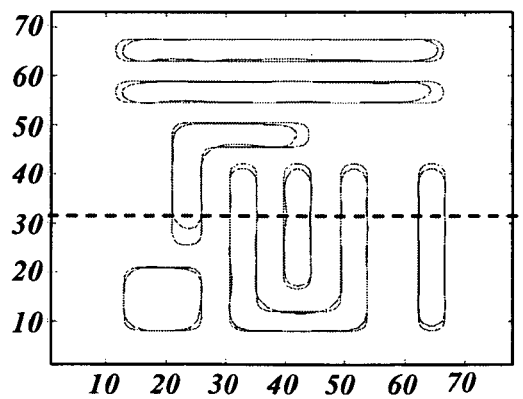
Figure 1D:
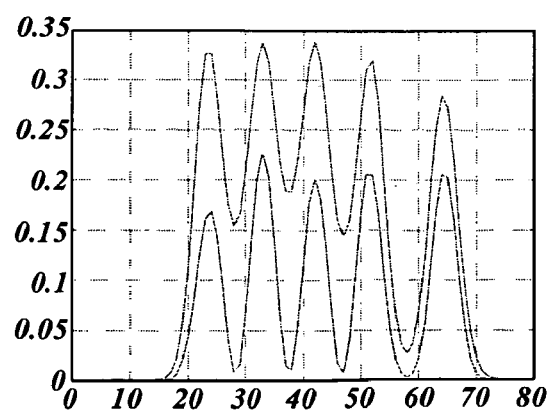
Figure 1E:
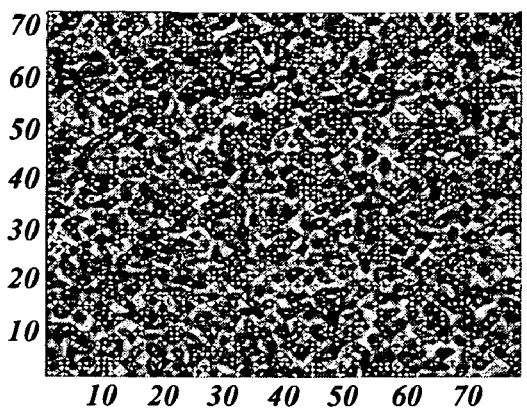
Figure 1F:
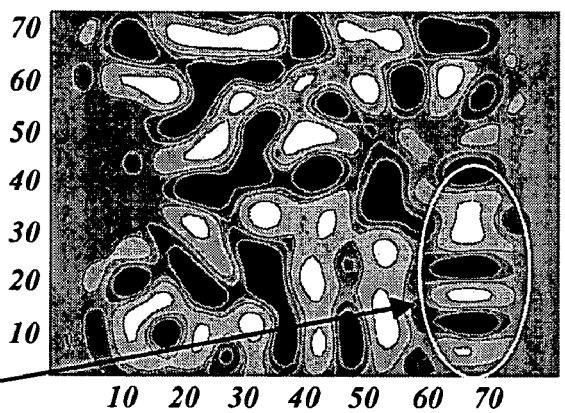
Figure 1G:
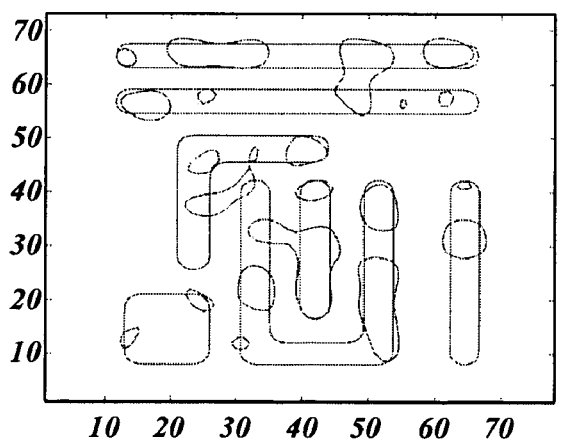
Figure 1H:
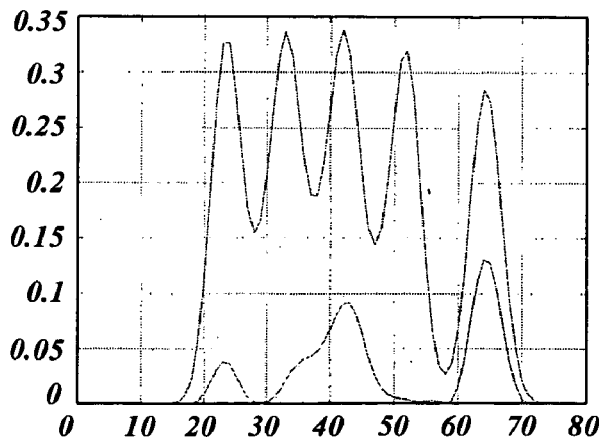

As shown in FIG. 1B, generalized Nashold projections (32) assign alternating phases to the main features and insert assists between lines. The lines widths are on-target, but line-ends are not corrected. The solution has good contrast. When projections stagnate, the phases alternate along the lines. This "phase entanglement" is observed sometimes in the non-linear problems (considered in a section below) when their iterations start from the random pixel assignments.

QUADRATIC PROBLEMS

In the quadratic formulations of the inverse problems, the coherent linearization (6) is not necessarily. We can directly use bilinear integral (5). Our goal here is to construct objective function as is a quadratic form of mask pixels. We start with (8) and replace Euclidean norm (norm 2) with Manhattan norm (norm 1):

$$F_I[m(x,y)] = \|I(x,y) - I_{ideal}(x,y)\|_1 \to \min. \quad (34)$$

The next step is to assume that the ideal image is sharp, 0 in dark regions and 1 in bright regions, so that $I(x, y) \geq I_{ideal}(x, y)$ in the dark regions and $I(x, y) \leq I_{ideal}(x, y)$ in the bright regions. This lets us to remove the module operation from the integral (34):

$$\|(x,y) - I_{ideal}(x,y)\|_1 = \iint |I - I_{ideal}| dxdy = \iint w(x,y)(I(x,y) - I_{ideal}(x,y))dxdy, \quad (35)$$

where w(x, y) is 1 in dark regions and −1 in bright regions. Finally we can ignore the constant term in (35), which leads to the objective $$F_w[m(x,y)] = \iint wI(x,y) \to \min. \quad (36)$$

The weighting function w can be generalized to have any positive value in dark regions, any negative value in bright regions, and 0 in the regions which we choose to ignore. Proper choice of this function covers the image slope objective (9), but not the threshold objective (1). Informally speaking, we seek to make bright regions as bright as possible, and dark regions as dark as possible. Substituting (5) into (36), we get $$\iint wI(x,y)dxdy = \iiiint Q(x_1,y_1,x_2,y_2)m(x_1,y_1)m^*(x_2,y_2) dx_1 dx_2 dy_1 dy_2, \quad (37)$$

where $$Q(x_1,y_1,x_2,y_2) = \iint w(x,y)q(x-x_1,x-x_2,y-y_1,y-y_2)dxdy \quad (38)$$

Discretization of (37) results to the following constrained QP $$F_w[m] = m^*Qm \to \min \quad (39)$$

$$\|m\|_\infty \leq 1$$

The complexity of this problem depends on the eigenvalues of matrix Q. When all eigenvalues are non-negative, then it is convex QP and any local minimizer is global. This is a very advantageous property, because we can use any of the numerous QP algorithms to find the global solution and do not have to worry about local minima. Moreover, it is well known that the convex QP can be solved in polynomial time. The next case is when all eigenvalues are non-positive, a concave QP. If we remove constraints, the problem becomes unbounded, with no minimum and no solutions. This means that the constraints play a decisive role: all solutions, either local or global, end up at some vertex of the box $\|m\|_\infty \leq 1$. In the worst case scenario, the solver has to visit all vertices to find the global solution, which means that the problem is NP-complete, i.e. it may take an exponential amount of time to arrive at the global minima. The last case is an indefinite QP when both positive and negative eigenvalues are present. This is the most complex and intractable case: an indefinite QP can have multiple minima, all lie on the boundary.

We conjecture that the problem (39) belongs to the class of indefinite QP. Consider case of the ideal coherent imaging, when Q is a diagonal matrix. Vector w lies along its diagonal. This means that eigenvalues $\mu_1, \mu_2 \ldots$ of Q are the same as components of the vector w, which are positive for dark pixels and negative for bright pixels. If there is at least one dark and one bright pixel, the problem is indefinite. Another consideration is that if we assume that (39) is convex, then the stationary internal point m=0 where the gradient is zero $$\frac{dF_w[m]}{dm} = 2Qm = 0 \quad (40)$$

is the only solution, which is a trivial case of mask being dark. This means that (39) is either has only a trivial solution, or it is non-convex.

Related to (39) QP was considered by Rosenbluth [28]:

$$m^*Q_d m \to \min$$

$$m^*Q_b m \geq b, \qquad (41)$$

where $Q_d$ and $Q_b$ deliver average intensities in bright and dark regions correspondingly. The objective is to keep dark regions as dark as possible while maintaining average intensity not worse than some value b in bright areas. Using Lagrange multipliers, we can convert (41) to $$m^*(Q_d - \lambda Q_b)m \to \min$$

$$\|m\|_\infty \geq 1,$$

$$\lambda \geq 0 \qquad (42)$$

which is similar to (39).

Another metric of the complexity of (39) is number of the variables, i.e. the pixels in the area of interest. According to Gould [10], the problems with order of 100 variables are small, more than $10^3$ are large, and more than $10^5$ are huge. Considering that the maskless lithography can control transmission of the 30 nm by 30 nm pixel [31], the QP (39) is large for the areas larger than 1 um by 1 um, and is huge for the areas lager than 10 um by 10 um. This has important implications for the type of the applicable numerical methods: in large problems we can use factorizations of matrix Q, in huge problems factorizations are unrealistic.

For the large problems, when factorization is still feasible, a dramatic simplification is possible by replacing the infinity norm by the Euclidean norm in the constraint of (39), which results in $$F_w[m] = m^*Qm \to \min$$

$$\|m\|_2 1 \qquad (43)$$

Here we search for the minimum inside a hyper-sphere versus a hyper-cube in (39). This seemingly minor fix carries the problem out of the class of NP-complete to P (the class of problems that can be solved in polynomial time). It has been shown in [35] that we can find global minima of (43) using linear algebra. This result served as a base for the computational algorithm of "trust region" [13] which specifically addresses indefinite QP.

The problem (43) has the following physical meaning: we optimize the balance of making bright regions as bright as possible and dark regions as dark as possible while limiting light energy $\|m\|_2^2$ coming through the mask. To solve this problem, we use procedures outlined in [35, 13]. First we form Lagrangian function of (43)

$$L(m,\lambda) = m^*Qm + \lambda(\|m\|^2 - 1). \qquad (44)$$

From here we deduce the first order necessary optimality conditions of Karush-Kuhn-Tucker (or KKT conditions, [12]):

$$2(Q + \lambda I)m = 0$$

$$\lambda(\|m\| - 1) = 0$$

$$\lambda \geq 0$$

$$\|m\| \leq 1 \qquad (45)$$

Using Sorensen [35], we can state what that (43) has a global solution if and only if we can find such $\lambda$ and m that (45) is satisfied and the matrix $Q + \lambda I$ is positive semidefinite or positively defined. Let us find this solution.

First we notice that we have to choose $\lambda$ large enough to compensate the smallest (negative) eigenvalue of Q, i.e.

$$\lambda \geq |\mu_1| > 0. \qquad (46)$$

From the second condition in (45) we conclude that $\|m\|=1$, that is the solution lies on the surface of hyper-sphere and not inside it. The last equation to be satisfied is the first one from (45). It has a non-trivial $\|m\| > 0$ solution only when the lagrange multiplier $\lambda$ equals to a negative one of the eigenvalues $\lambda = -\mu_i$. This condition and (46) has a unique solution $\lambda = -\mu_1$, because other eigenvalues $\mu_2, \mu_3, \ldots$ are either positive so that $\lambda \leq 0$ does not hold, or they are negative, but with absolute value that is smaller than $\mu_1$ so that $\lambda \geq |\mu_1|$ does not hold.

After we determined that $\lambda = -\mu_1$, we can find m from $2(Q - \mu_1 I)m = 0$ as the corresponding eigenvector $m = v_1$. This automatically satisfies $\|m\|=1$, because all eigenvectors are normalized to have a unit length. We conclude that (43) has a global solution which corresponds to the smallest negative eigenvalue of Q.

As we have shown, the minimum eigenvalue of Q and its eigenvector play special role in the problem by defining the global minimum. However, other negative eigenvectors are also important, because it is easy to see that any pair $$\lambda = -\mu_i > 0$$

$$m = v_i \qquad (47)$$

is a KKT point and as such defines a local minimum. The problem has as many local minima as negative eigenvalues. We may also consider starting our numerical minimization from one of these "good" minima, because it is possible that a local minimum leads to a better solution in the hyper-cube than a global minimum of the spherical problem.

Figure 2A:
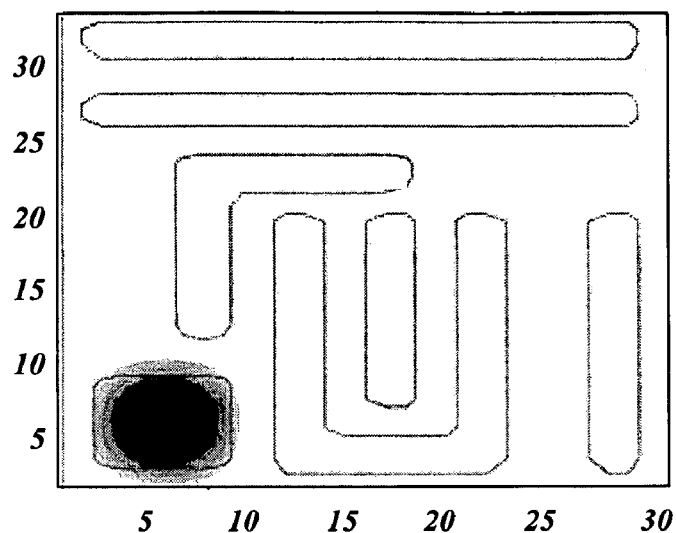
FIGS. 2A-2C illustrate local minima for the structure shown in FIG. 1 IA.
Figure 2B:
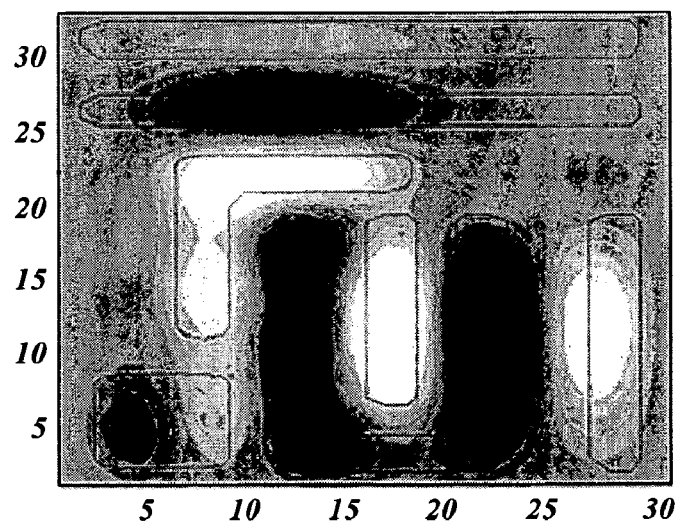
Figure 2C:
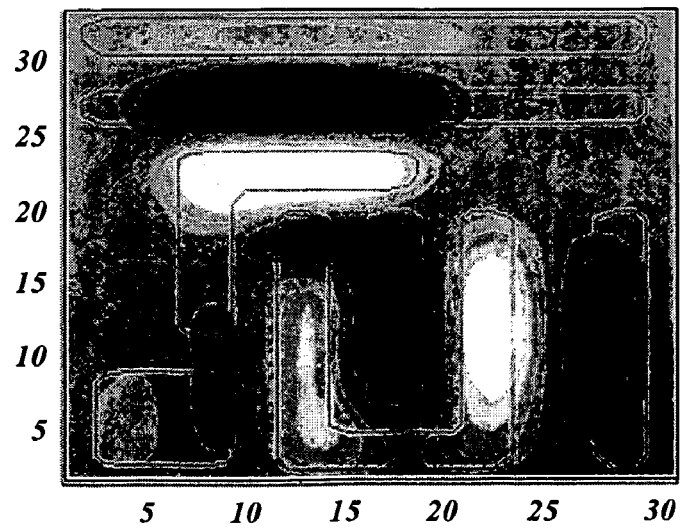

FIGS. 2A, 2B, 2C shows three strongest local minima of the problem (39) for the structure of FIG. 1B. These local minima are pointing to the beneficial interactions between layout features, suggesting alternating phase assignments. For example, the second solution suggests that the L-shape transmission should be chosen positive, while the comb has negative transmission, the dense vertical line of the comb has positive transmission, and the second horizontal line has negative transmission.

Results of the similar analysis for the case of the contact holes are displayed in FIGS. 3A-3D. These results are stronger, and can be used directly in applications. The method "proposes" beneficial phases for the contacts and position and phases of the assists. The most interesting solution is shown in the low right inset, where all contacts have well-defined transmissions, with 3 contacts positive and 4 contacts negative. The advantages of this method comparing to IML [34] is that this method automatically finds the best phases of the contacts and is not based of the coherent approximation.

Figure 3B:
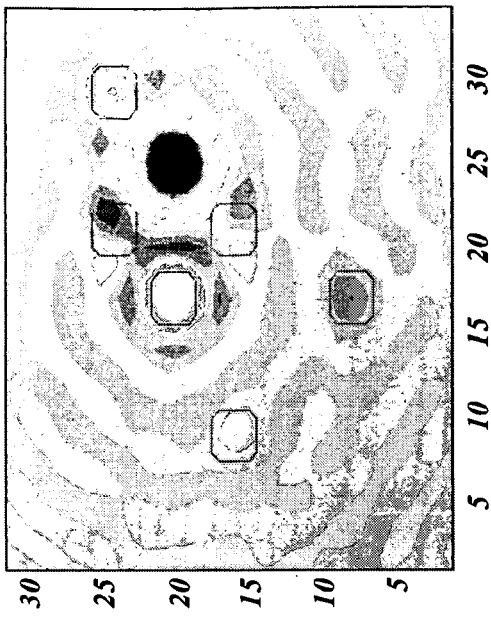
FIGS. 3A-3D illustrate local minima for a pattern of contact holes.
Figure 3D:
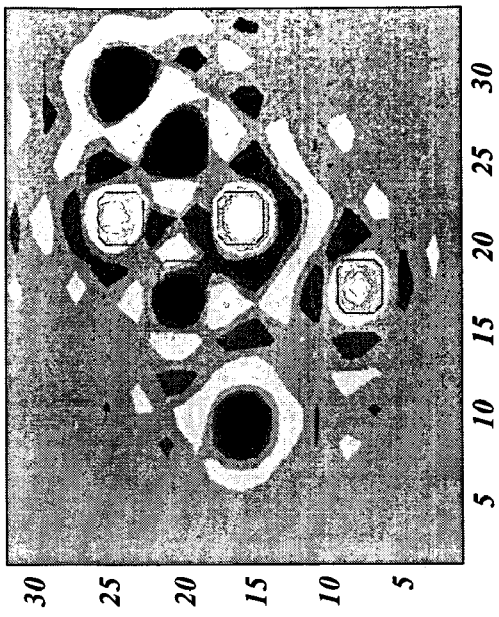
Figure 3A:
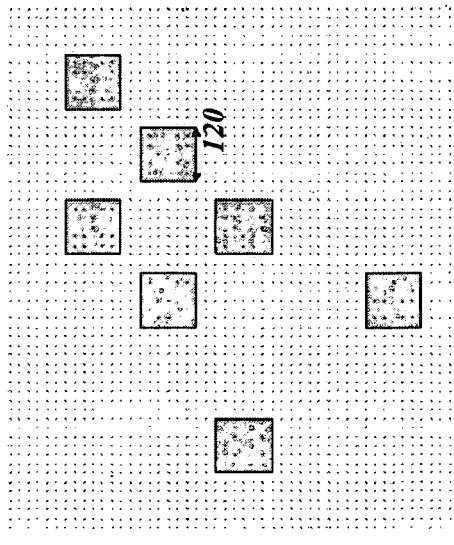
Figure 3C:
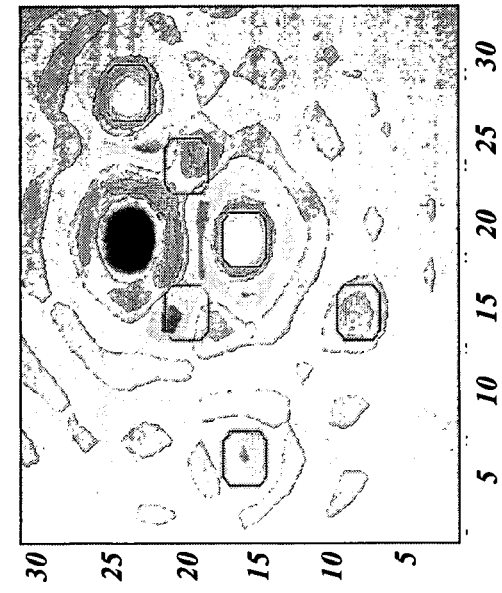

FIGS. 3B, 3C, 3D illustrate the first three local minima for QP on a hyper-sphere for the contact holes and process conditions from Socha [34]. The third solution has the clearest phase assignments and the position of assists.

For the positive masks, in particular for the binary masks, the constraint has to be tightened to $\|m - 0.5\|_\infty \leq 0.5$. Then the correspondent to (39) problem is $$F_w[m] = m^*Qm \to \min$$

$$\|m - 0.5\|_\infty \leq 0.5. \qquad (48)$$

This is also an indefinite QP and is NP-complete. Replacing here infinity norm with Euclidean norm, we get a simpler problem $$m*Qm \to \min$$

$$\|\Delta m\|_2 \leq 0.5$$

$$\Delta m = m - m_0, m_0 = \{0.5, 0.5, \ldots, 0.5\} \quad (49)$$

The Lagrangian can be written as $$L(m, \lambda) = m*Qm + \lambda(\|m-m_0\|^2 - 0.25) \quad (50)$$

The KKT point must be found from the following conditions $$(Q + \lambda I)\Delta m = -Qm_0$$

$$\lambda(\|\Delta m\|^2 - 0.25) = 0$$

$$\lambda \geq 0$$

$$\|\Delta m\| \leq 0.5 \quad (51)$$

This is more complex problem than (45) because the first equation is not homogeneous and the pairs $\lambda = -\mu_i$, $\Delta m = v_i$ are clearly not the solutions. We can still apply the condition of the global minimum $\lambda \geq -\mu_1 > 0$ (Sorensen [35]). From the second condition we conclude that $\mu\|\Delta m\|^2 = 0.25$, meaning that all solutions lie on the hyper-sphere with the center at $m_0$. The case $\lambda = -\mu_1$ is eliminated because the first equation is not homogeneous, so that we have to consider only $\lambda > -\mu_1$. Then $Q + \lambda I$ is non-singular, we can invert it, and find the solution $$\Delta m = -(Q + \lambda I)^{-1} Qm_0. \quad (52)$$

The last step is to find the Lagrange multiplier $\lambda$ that satisfy the constraint $\|\Delta m\|^2 = 0.25$, that is we have to solve $$\|(Q + \lambda I)^{-1} Qm_0\| = 0.5. \quad (53)$$

The norm on the right monotonically increases from 0 to infinity in the interval $-\infty < \lambda < -\mu_1$, thus (53) has to have exactly one solution in this interval. The pair $\lambda$, $\Delta m$ that solves (52-53) is a global solution of (49). We conjecture that there are fewer KKT points of local minima of (49) than in (45) (may be there are none), but this remains to be proven by analyzing behavior of the norm (53) when Lagrange multiplier is between negative eigenvalues. The solutions of (49) are supposed to show how to insert assist features when all contacts have the same phases.

GENERAL NON-LINEAR PROBLEMS

Consider objective (8) of image fidelity error $$F_I[m(x,y)] = \|I(x,y) - I_{ideal}(x,y)\| \to \min. \quad (54)$$

We can state this in different norms, Manhattan, infinity, Euclidean, etc. The simplest case is a Euclidean norm, because (54) becomes a polynomial of the forth degree (quartic polynomial) of mask pixels. The objective function is very smooth in this case, which ease application of the gradient-descent methods.

We can generalize (54) by introducing weighting $w = w(x, y)$ to emphasize important layout targets and consider smoothing in Sobolev norms as in [20]:

$$F_w[m(x,y)]^2 = \|\sqrt{w} \cdot (I - I_{ideal})\|_2^2 + \alpha_1\|L_1 m\|_2^2 + \alpha_2\|L_2 m\|_2^2 + \alpha_3\|m - m_0\|_2^2 \to \min, \quad (55)$$

where $L_1$, $L_2$ are the operators of first and second derivatives, $m_0 = m_0(x, y)$ is some preferred mask configuration that we want to be close to (for example, the target), and $\alpha_1, \alpha_2, \alpha_3$ are smoothing weights. The solutions of (55) increase image fidelity; however, the numerical experiments show that the contour fidelity of the images is not adequate. To address, we explicitly add (1) into (55):

$$F_{wc}[m]^2 = \|\sqrt{w} \cdot (I - I_{ideal})\|_2^2 + \oint_C (I - \theta)^n dl + \\ \alpha_1\|L_1 m\|_2^2 + \alpha_2\|L_2 m\|_2^2 + \alpha_3\|m - m_0\|_2^2 \to \min \|m\|_\infty \leq 1. \quad (56)$$

If the desired output is a two-, tri-, any other multi-level tone mask, we can add penalty for the masks with wrong transmissions. The simplest form of the penalty is a polynomial expression, so for example for the tri-tone Levenson-type masks with transmissions −1, 0, and 1, we construct the objective as $$F_{wce}[m]^2 = \\ \|\sqrt{w} \cdot (I - I_{ideal})\|_2^2 + \oint_C (I - \theta)^n dl + \alpha_1\|L_1 m\|_2^2 + \alpha_2\|L_2 m\|_2^2 + \\ \alpha_3\|m - m_0\|_2^2 \to \min + \alpha_4\|(m+e)m(m-e)\|_2^2 \|m\|_\infty \leq 1, \quad (57)$$

where e is a one-vector. Despite all the complications, the objective function is still a polynomial of the mask pixels. To optimize for the focus depth, the optimization of (57) can be conducted off-focus, as was suggested in [16, 20]. After discretization, (55) becomes a non-linear programming problem with simple bounds.

We expect that this problem inherits property of having multiple minima from the corresponding simpler QP, though smoothing operators of (57) have to increase convexity of the objective. In the presence of multiple local minima the solution method and staring point are highly consequential: some solvers tend to converge to the "bad" local solutions with disjoined masks pixels and entangled phases, others better navigate solution space and chose smoother local minima. The Newton-type algorithms, which rely on the information about second derivatives, should be used with a caution, because in the presence of concavity in (57), the Newtonian direction may not be a descent direction. The branch-and-bound global search techniques [18] are not the right choice because they are not well-suited for the large multi-dimensional optimization problems. It is also tempting to perform non-linear transformation of the variables to get rid of the constraints and convert problem to the unconstrained case, for example by using transformation $x_i = \tanh(m_i)$ or $m_i = \sin(x_i)$ as in [26].

SOLUTION METHODS

The reasonable choices to solve (57) are descent algorithms with starting points found from the analytical solutions of the related QP. We apply algorithms of local variations ("one variable at a time"), which is similar in spirit to the pixel flipping [32, 17], and also use a variation of the steepest descent by Frank and Wolfe [21] to solve constrained optimization problems.

In the method of local variation, we chose the step $\Delta_1$ to compare three exploratory transmissions for the pixel $i: m_i^1$, $m_i^1 + \Delta_1$, and $m_i^1 - \Delta_1$. If one of these values violates constraints, then it is pulled back to the boundary. The best of these three values is accepted. We try all pixels, optionally in random exhaustive or circular order, until no further improvement is possible. Then we reduce step $\Delta_2 < \Delta_1$ and repeat the process until the step is deemed sufficiently small. This algorithm is simple to implement. It naturally takes care of the simple (box) constraints and avoids the general problem of other more sophisticated techniques, which may converge prematurely to a non-stationary point. This algorithm calculates the objective function numerous times; however, the runtime cost of its exploratory calls is relatively low with the electrical field caching (see the next section). Other algorithms may require fewer but more costly non-exploratory calls. This makes method of local variation a legitimate tool in solving the problem, though descent methods that use convolution for the gradient calculations are faster.

Frank and Wolfe method is an iterative gradient descent algorithm to solve constrain problems. At each step k we calculate the gradient $\nabla F^k$ of the objective and then replace the non-linear objective with its linear approximation. This reduces the problem to LP with simple bounds:

$$\nabla F^k \cdot m \to \min$$

$$\|m\|_\infty \leq 1 \tag{59}$$

The solution of this $m=l^k$ is used to determine the descent direction $$p^k = l^k - m^{k-1}. \tag{60}$$

Then the line search is performed in the direction of $p^k$ to minimize the objective as a function one variable $\gamma \in [0,1]$:

$$F[m^{k-1} + \gamma p^k] \to \min. \tag{61}$$

The mask $m^k = m^{k-1} + \gamma p^k$ is accepted as the next iterate. The iterations continue until convergence criteria are met. Electrical field caching helps to speedup line search and the gradient calculations if numerical differentiation is used.

Figure 4B:
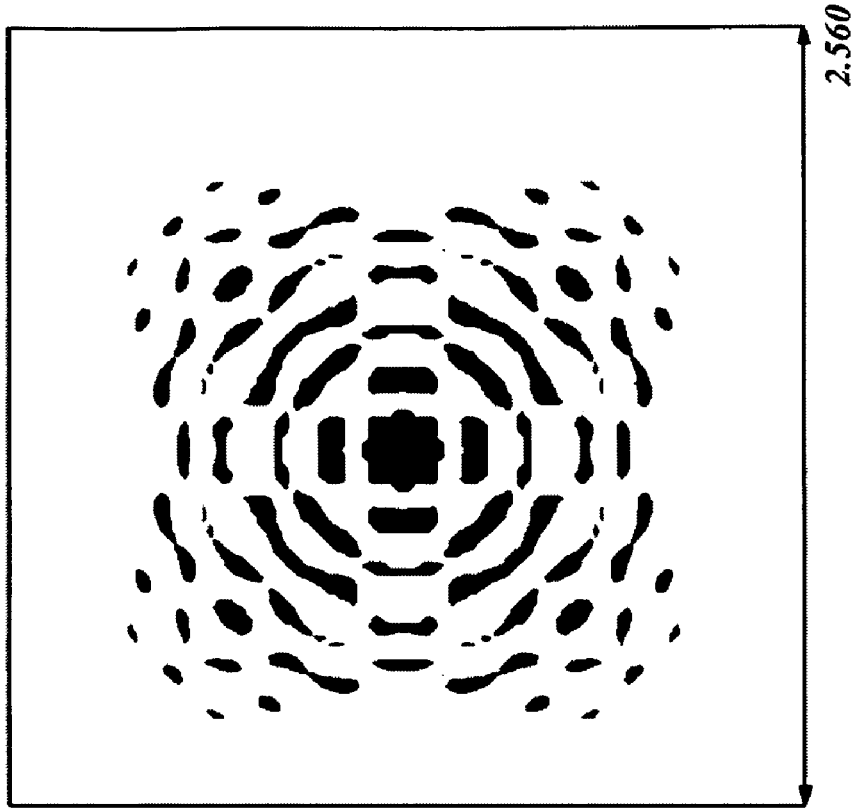
FIGS. 4A-4B illustrate a comparison between local variations and gradient descent optimizations in accordance with an embodiment of the present invention.
Figure 4A:
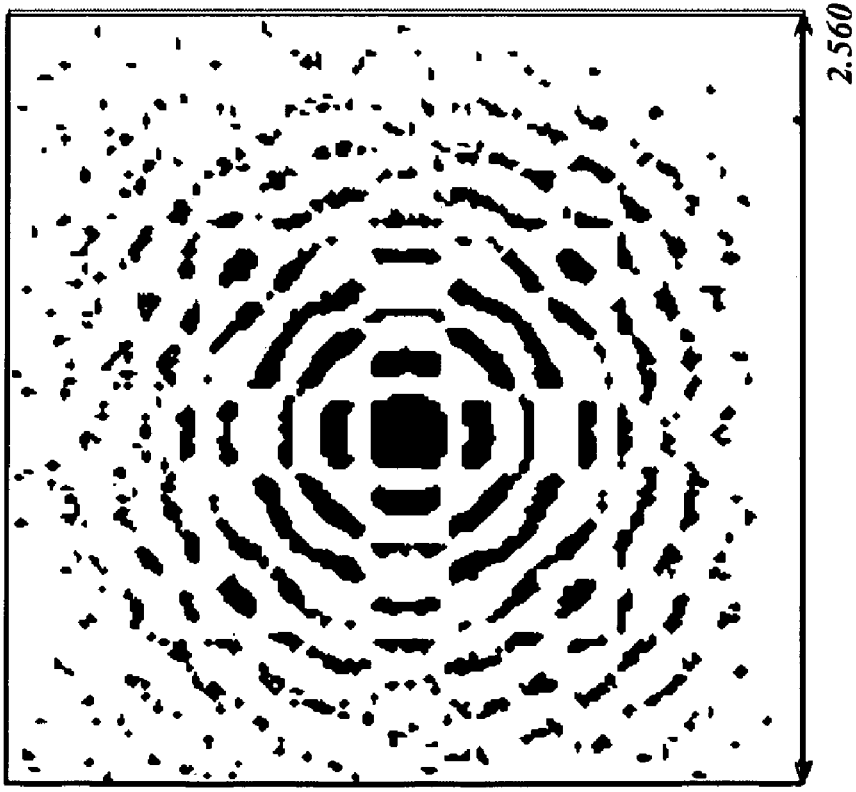
Figure 5C:
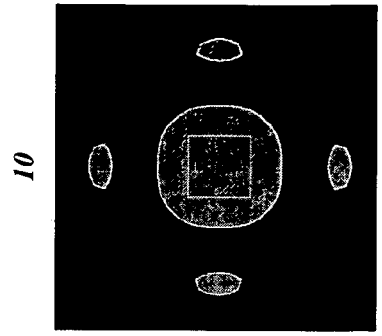
FIGS. 5A-5E illustrate gradient descent solutions after 1, 5, 10, 20, and 50 iterations in accordance with an embodiment of the present invention.
Figure 5B:
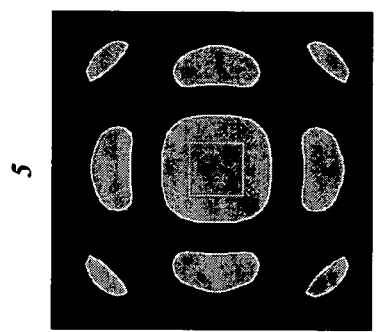
Figure 5A:
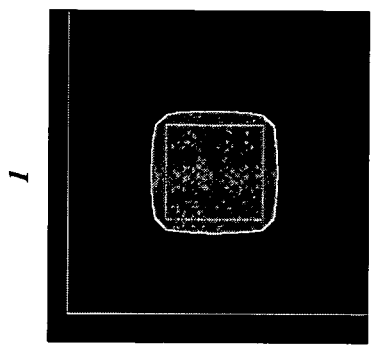
Figure 5E:
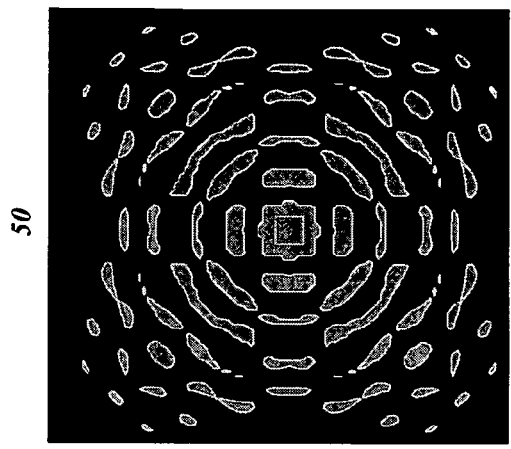
Figure 5D:
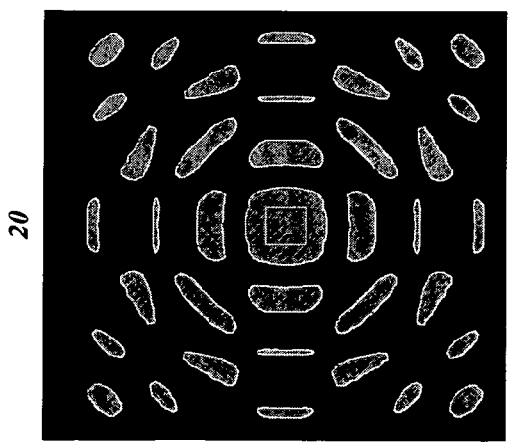

FIGS. 4A and 4B show a comparison between (FIG. 4A) local variations and gradient descent optimizations (FIG. 4B) for the target as an isolated contact hole of 100 nm size, printed with quadrupole illumination. The mask pixels of 10 nm size are thresholded at 0.5 level (the dark areas have transmissions >0.5) and cover 2.56 by 2.65 um layout area. The simulation time of gradient descent with analytically calculated gradient is about 2 seconds on SunBlade station. Solution with local variations is less regular than with the gradient descent, because pixels are iterated randomly. Up to 8 assist rinds are discernable.

FIGS. 5A-5E show gradient descent mask iterations after 1, 5, 10, 20, and 50 iterations. The assist features become more and more complicated as the descent iterations improve objective function. This is simulated under the same process conditions and a target layout as in FIG. 4B.

GRADIENT OF OBJECTIVE FUNCTION

The gradient descent algorithms require recalculation of the objective and its gradient at each iteration. The gradient of the objective function can be calculated numerically or analytically. When the objective is expressed in norm 2 as in (55), the derivatives can be calculated analytically, yielding efficient representation through convolutions.

Consider objective in the form of the weighted inner product $(f, g) = \int\int wfg \, dxdy$:

$$F_w^2[m] = \|\sqrt{w} \cdot (I - I_{ideal})\|^2 = (I - I_{ideal}, I - I_{ideal}). \tag{63}$$

Small variations $\delta m$ of the mask m cause the following changes in the objective:

$$F_w^2[m + \delta m] = (I(m + \delta m) - I_{ideal}, I(m + \delta m) - I_{ideal}) \tag{64}$$

$$= (I(m) + \delta I - I_{ideal}, I(m) + \delta I - I_{ideal})$$

$$\approx F_w^2[m] + 2(I - I_{ideal}, \delta I).$$

Let us find $\delta I = I(m+\delta m) - I(m)$. Using SOCS formulation (60), and neglecting $O(\delta m^2)$ terms, we get $$\delta I = I(m + \delta m) - I(m) \tag{65}$$

$$= \sum_{i=1}^{N} \lambda_i (h_i * (m + \delta m))(h_i * (m + \delta m))^* - \sum_{i=1}^{N} \lambda_i (h_i * m)(h_i * m)^* \approx$$

$$\approx \sum_{i=1}^{N} \lambda_i [A_i (h_i * \delta m)^* + A_i^* (h_i * \delta m)]$$

where $A_i$ is defined in (60). To use this in (64), we have to find scalar product of $\delta I$ with $\Delta I = I - I_{ideal}$:

$$(\Delta I, \delta I) = \sum_{i=1}^{N} \lambda_i [(\Delta I, A_i (h_i * \delta m)^*) + (\Delta I, A_i^* (h_i * \delta m))] \tag{66}$$

$$= \sum_{i=1}^{N} \lambda_i [(A_i \Delta I, h_i^* * \delta m^*) + (A_i^*, \Delta I, h_i * \delta m)]$$

$$= 2 \sum_{i=1}^{N} \lambda_i \mathrm{Re}(A_i^* \Delta I, h_i * \delta m)$$

Using the following property of the weighted inner product $$(f^* g, h) = f(g^* \circ wh) \tag{67}$$

we can convert (66) to the form $$(\Delta I, \delta I) = 2 \sum_{i=1}^{N} \lambda_i \mathrm{Re}(\delta m * h_i, A_i^* \Delta I) \tag{68}$$

$$= 2 \sum_{i=1}^{N} \lambda_i \mathrm{Re}(\delta m \cdot (h_i^* \cdot wA_i^* \Delta I))$$

Substituting this into (64) gives us an analytical expression for the gradient of the objective $$F_w^2[m + \delta m] - F_w^2[m] \approx \nabla F_w^2 \cdot \delta m \tag{69}$$

$$\nabla F_w^2 = 4 \sum_{i=1}^{N} \lambda_i \mathrm{Re}(h_i^* \cdot wA_i^* \Delta I)$$

This formula let us calculate gradient of the objective through cross-correlation or convolution as $O(NM \log(M))$ FFT operation, which is significantly faster than numerical differentiation with $O(NM^2)$ runtime.

ELECTRICAL FIELD CACHING

The speed of the local variation algorithm critically depends on the ability to quickly re-calculate image intensity when one or a few pixels change. We use electrical field caching procedure to speedup this process.

According to SOCS approximation [3], the image intensity is the following sum of convolutions of kernels $h_i(x, y)$ with the mask $m(x, y)$:

$$I(x, y) = \sum_{i=1}^{N} \lambda_i A_i(x, y) A_i^*(x, y), \quad (60A)$$

$$A_i = h_i(x, y) * m(x, y).$$

Suppose that we know the electrical fields $A_i^0$ for the mask $m^0$ and want to calculate intensity for the slightly different mask $m'$. Then $$A'_i = A_i^0 + h_i * (m' m^0) \quad (61A)$$

These convolutions can be quickly calculated by the direct multiplication, which is $O(d \cdot M \cdot N)$ operation, where d is the number of different pixels between $m^0$ and $m'$, M is pixel count of the kernels, and N is number of kernels. This may be faster than convolution by FFT. Constantly updating the cache $A_i^0$, we can quickly re-calculate intensities for small evolutionary mask changes.

The additivity of the electrical fields can also be exploited to speedup intensity calculations in the line search (61A). If the mask $M^{k-1}$ delivers electrical fields $A_i^{k-1}$, and the mask $p^k$ delivers $B_i^k$, then the intensity from the mask $m = m^{k-1} + \gamma p^k$ can be quickly calculated through its electrical fields $A_i$:

$$A_i = A_i^{k-1} + \gamma B_i^k. \quad (62A)$$

This avoids convolutions of (60A) and reduces intensity calculation to multiplication of the partial electrical fields $A_i$.

SIMULATION RESULTS

Figure 6A:
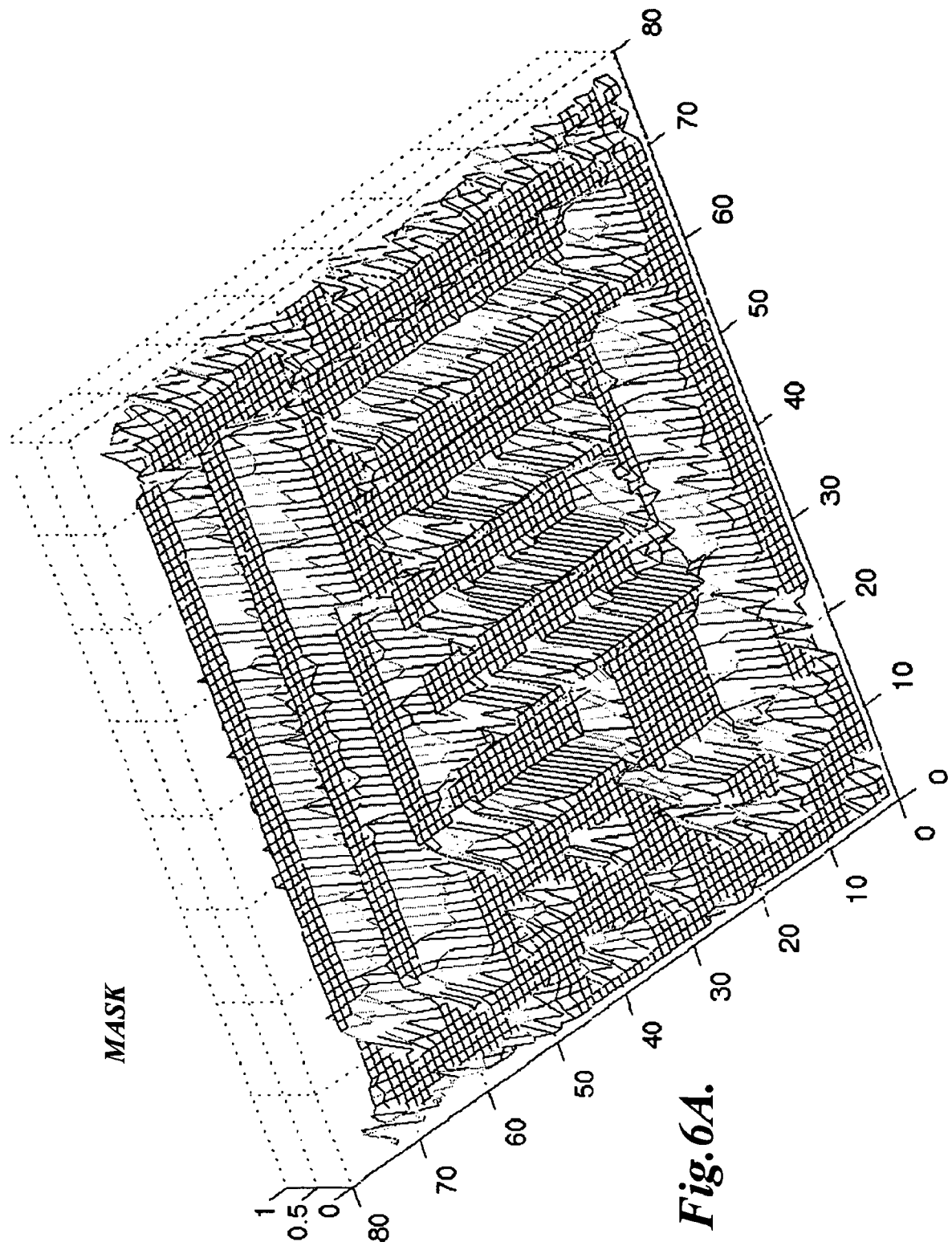
FIGS. 6A-6C illustrate the results of solving an inverse mask problem with contour fidelity metric for a positive mask in accordance with an embodiment of the present invention.
Figure 6C:
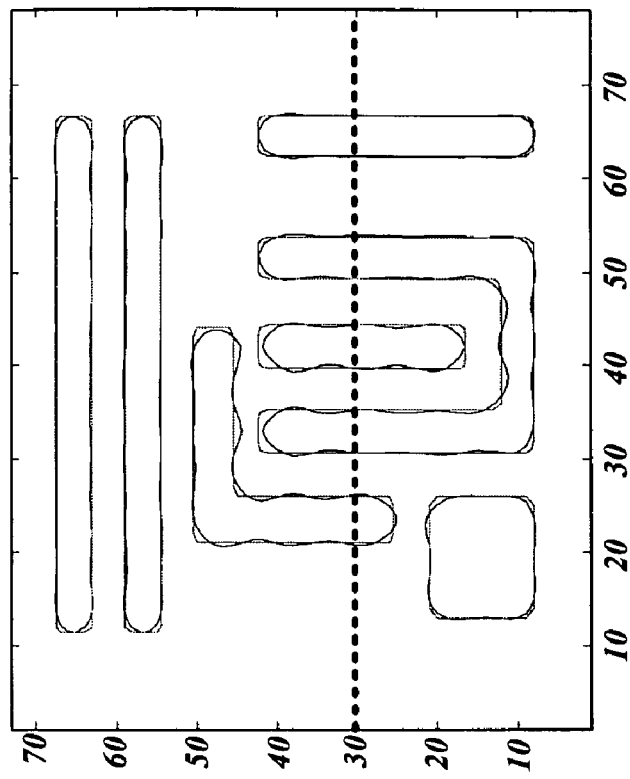
Figure 6B:
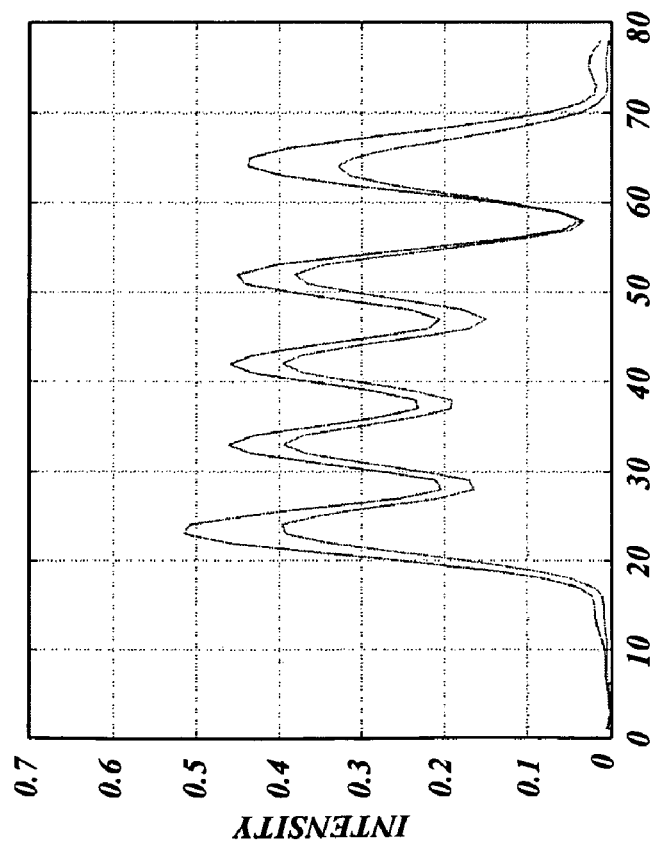

In FIGS. 6A-6C we show results of solving (56) with the contour fidelity metric for the positive mask $0 \leq m \leq 1$. The assist features can be seen around main structures.

FIGS. 6A-6C show local variations method for the objective (57) with contour fidelity. The contours are on target almost everywhere, including line ends. The image contrast is improved. Mask has rows of assist features and serifs.

Figure 7A:
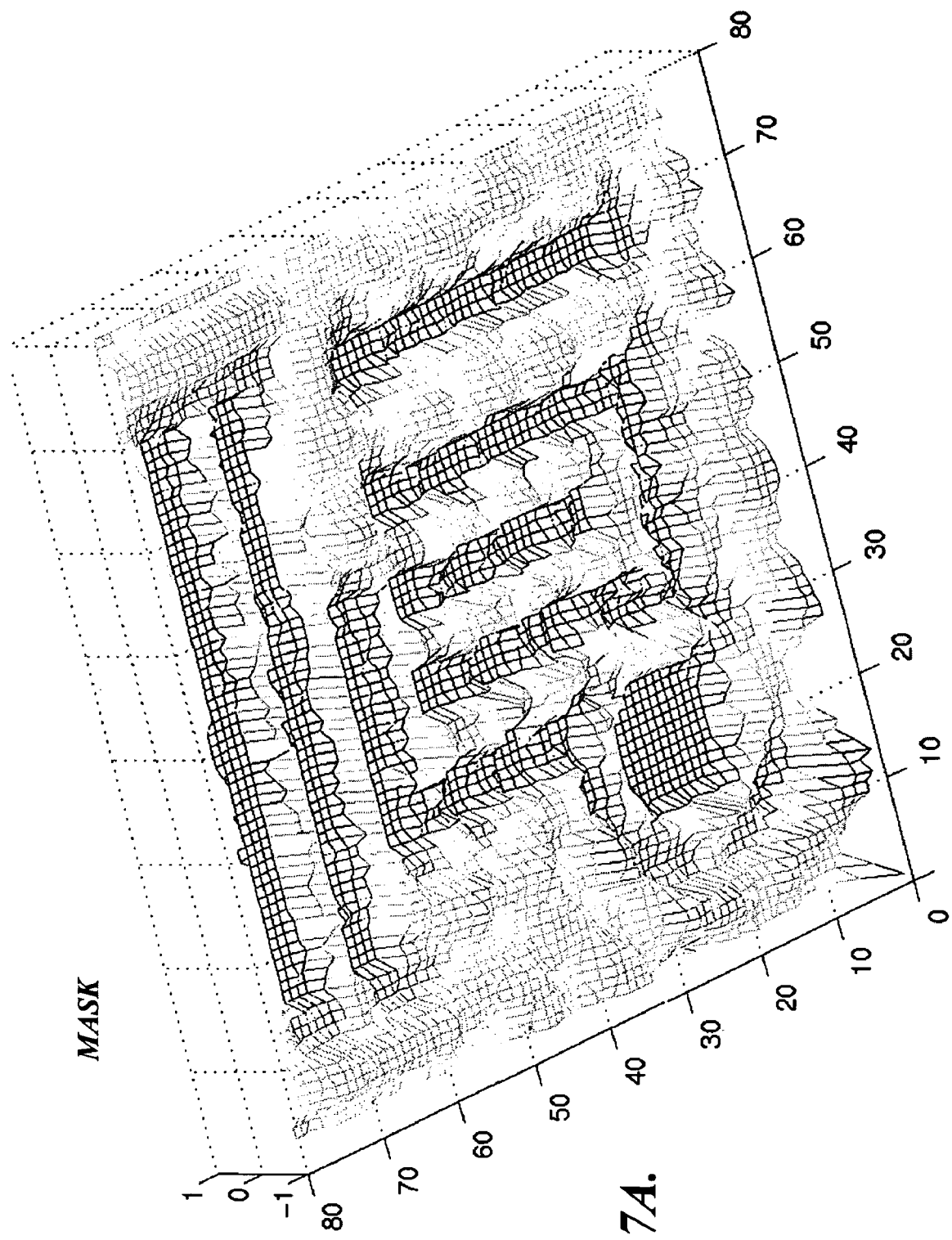
FIGS. 7A-7C illustrate a method of local variations with contour fidelity and PSM masks in accordance with another embodiment of the present invention.
Figure 7C:
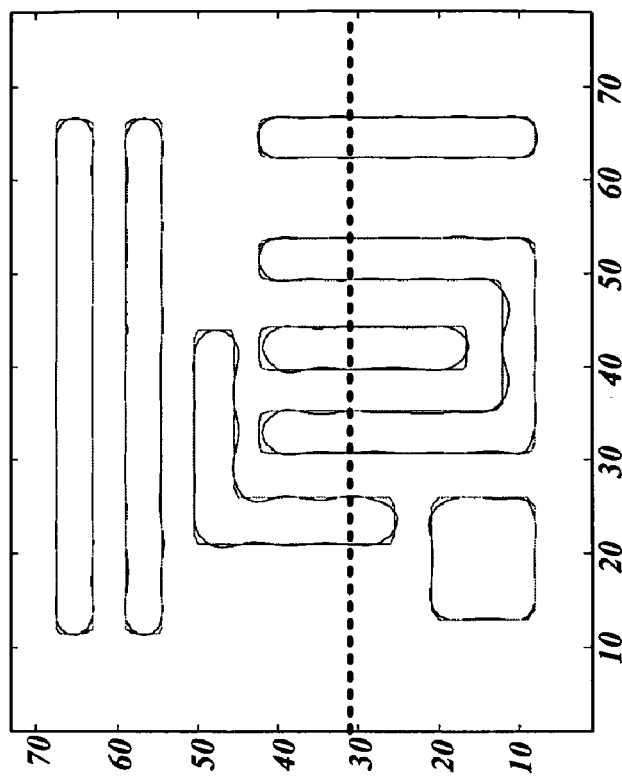
Figure 7B:
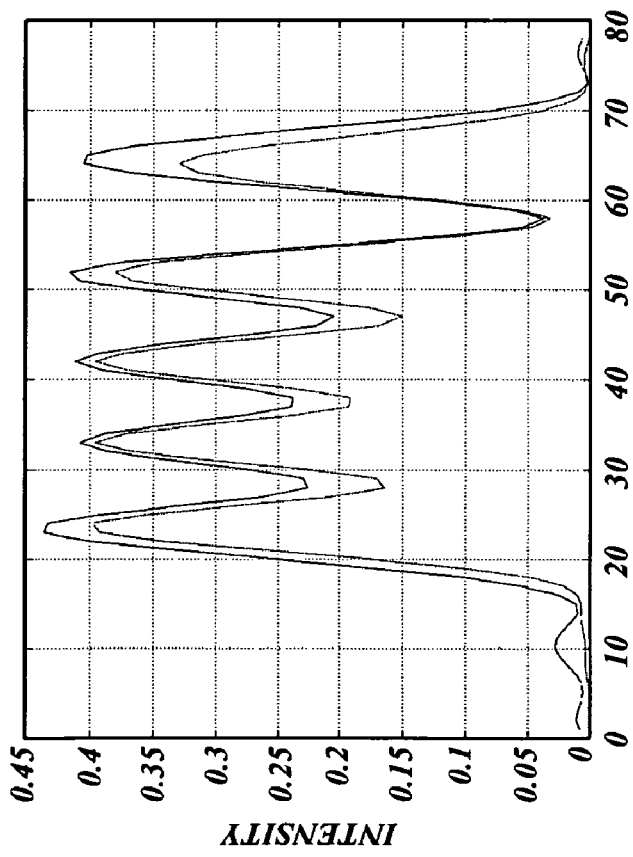

Next example demonstrates solutions when main features have the same phase and assist features can have phase shift, FIGS. 7A-7C. We observe negative transmission of the assists on the mask. The contrast along the cutline is improved in comparison to the ideal case (mask equal target). Contour fidelity is very good, the third inset. The last example is contact holes, FIGS. 10A-10B and 11A-11D. The method is capable of inserting assist contacts and deliver complex interferometric assist features in PSM case.

FIGS. 7A-7C illustrate a method of local variations for the objective (57) with contour fidelity and PSM mask with assist features.

Figure 8A:
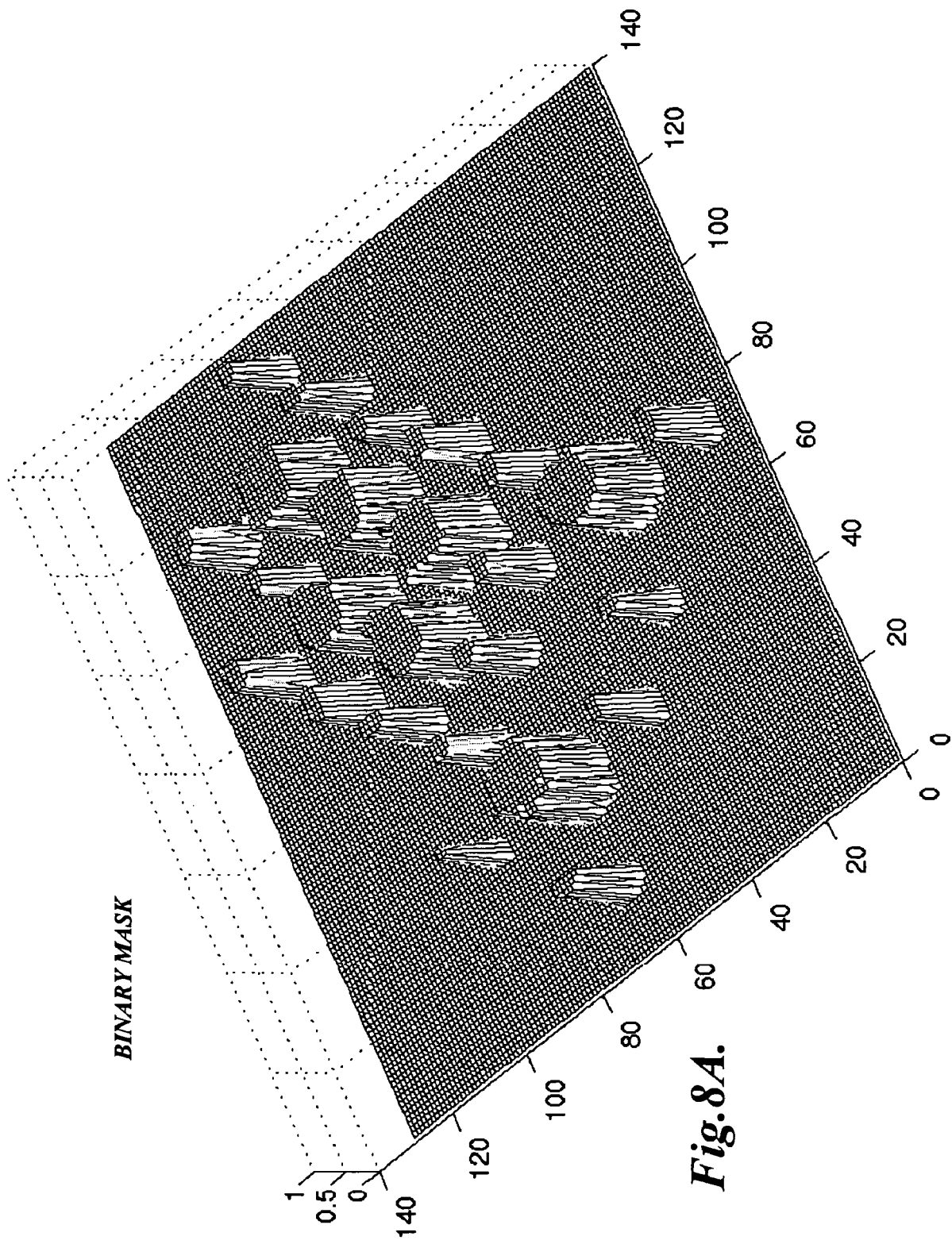
FIGS. 8A-8C illustrate contact holes inserted around main contacts.
Figure 8C:
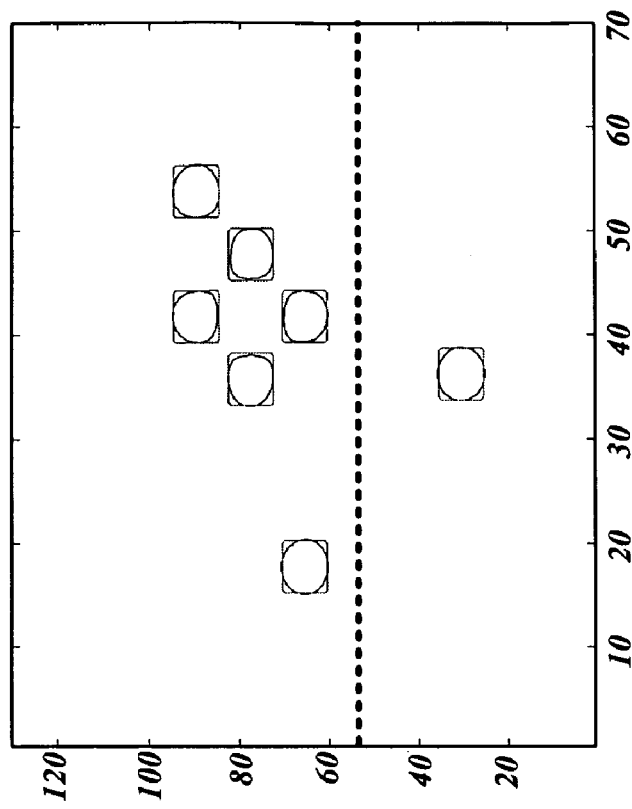
Figure 8B:
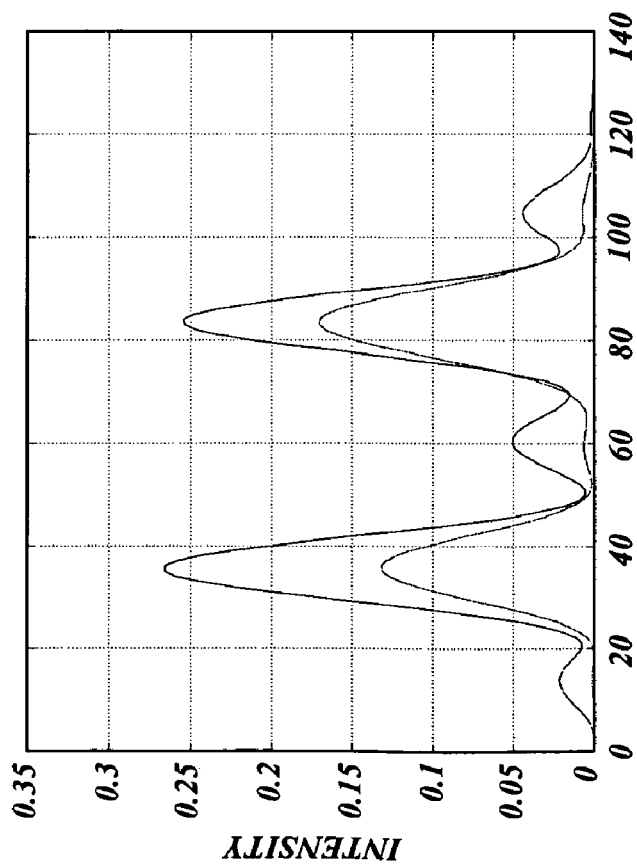

FIGS. 8A-8C illustrate contact holes example for the binary mask. Small assist contact holes are inserted around main contacts. The image contrast is compared to the case when mask is the same as target. The contrast is improved significantly. Image contours are on target, the third column.

Figure 9A:
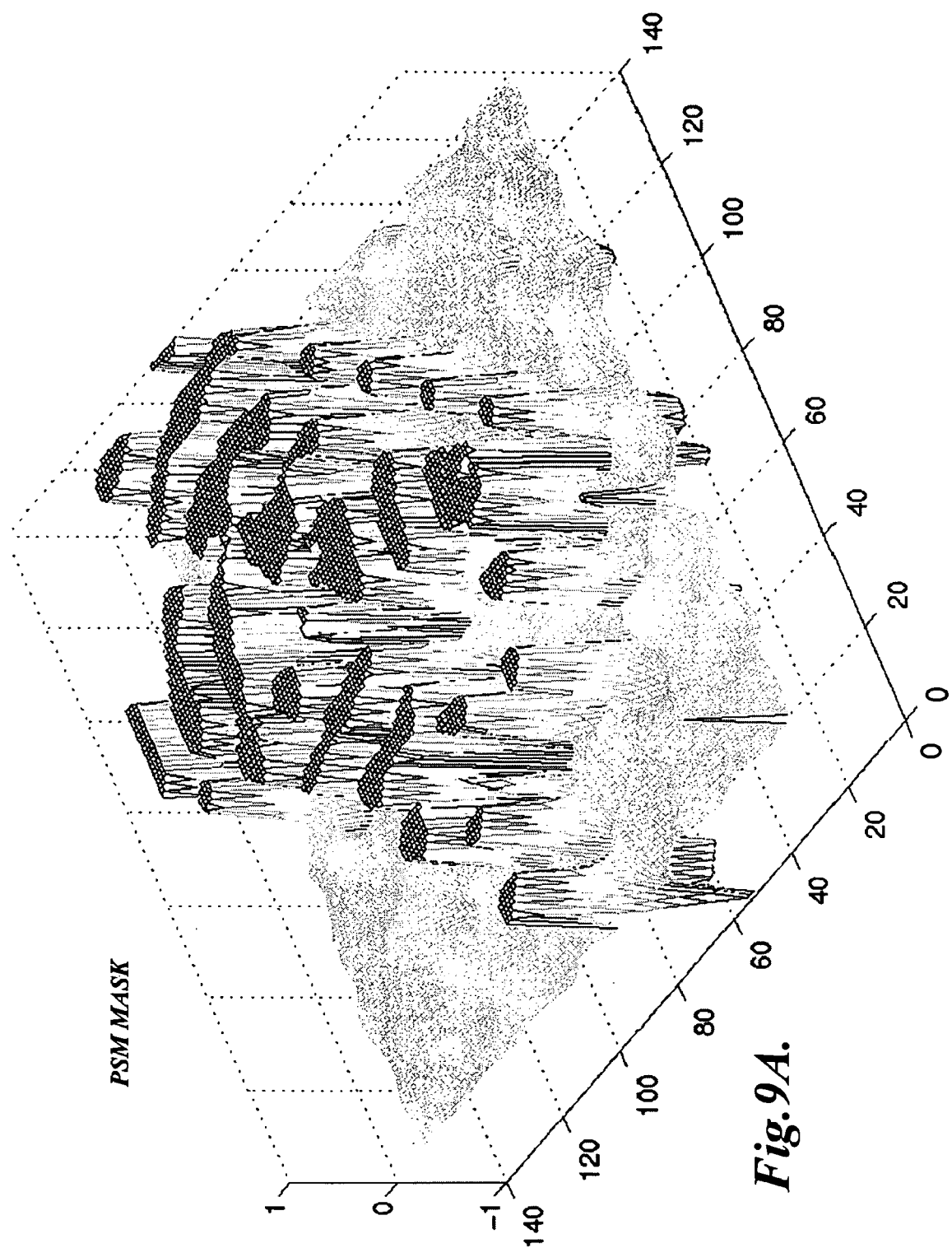

FIGS. 9A-9C illustrate contact holes example for strong PSM mask. Resulting PSM mask has complex structure of assists holes, which are hard to separate from the main features. The contrast is even better than for the binary mask. Despite very complex mask, the contours are on target (lower right inset) and sidelobs do not print.

Figure 10B:
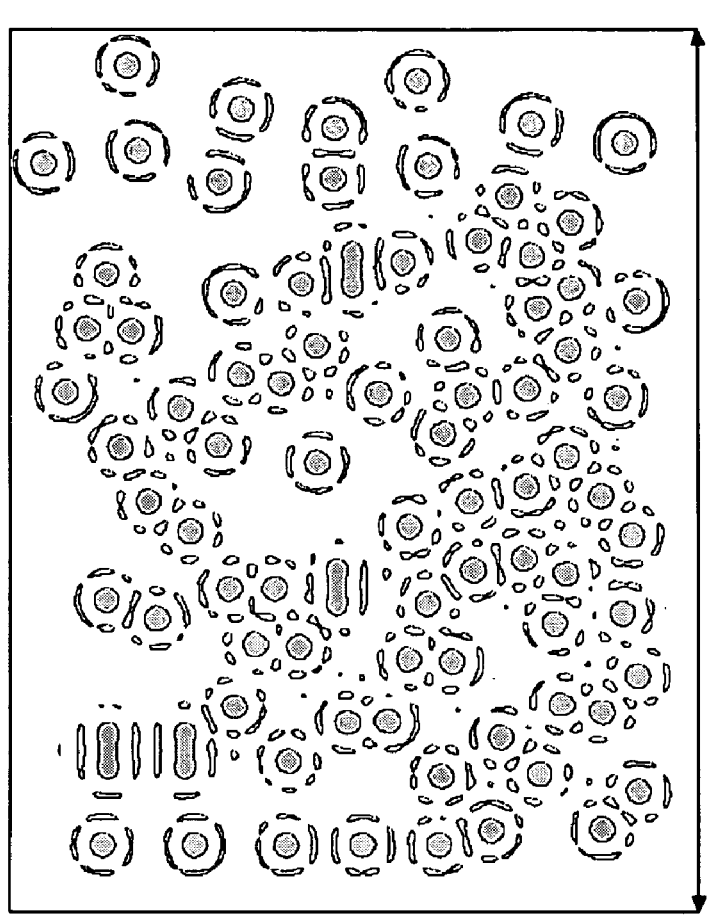
FIGS. 10A-10B illustrate a layout inversion for random logic and an SRAM cell.
Figure 10A:
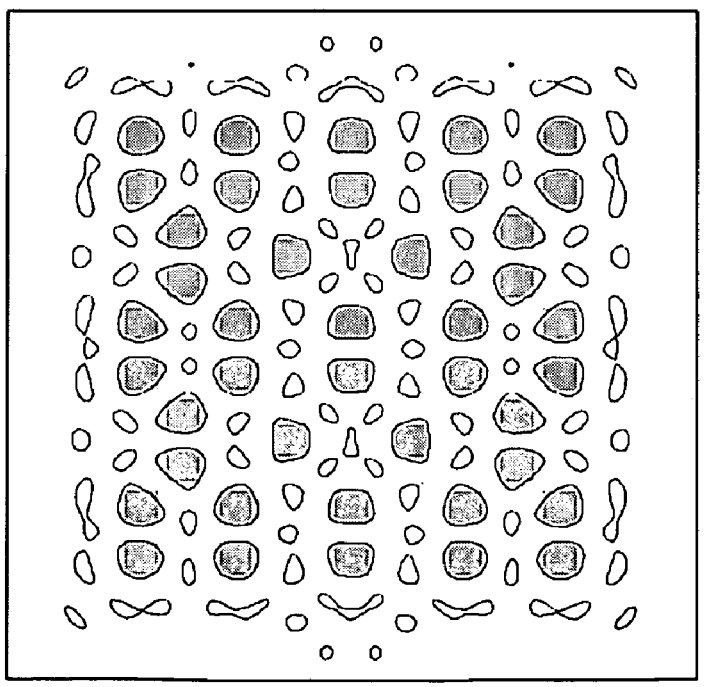
Figure 12A:
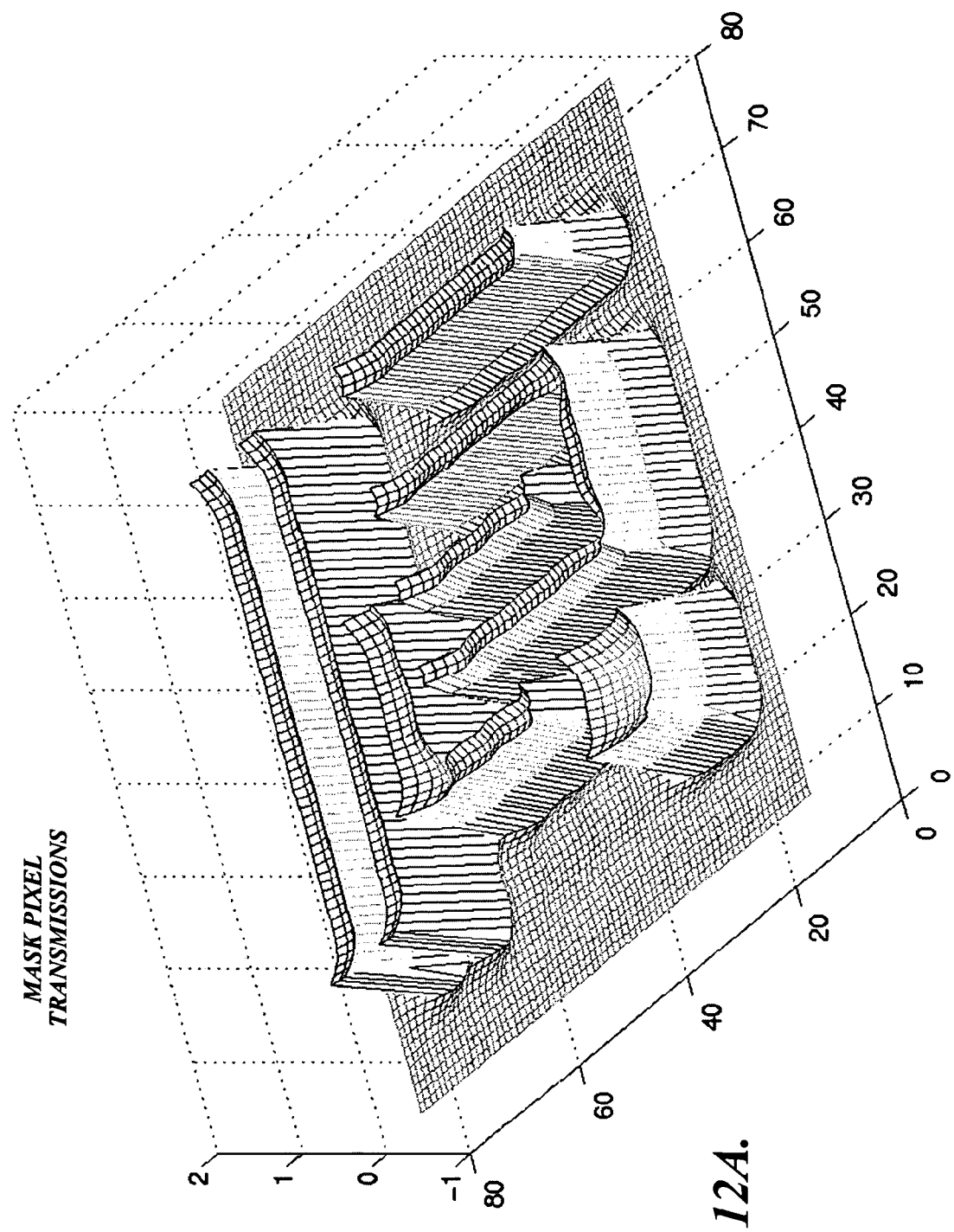
Figure 13A:
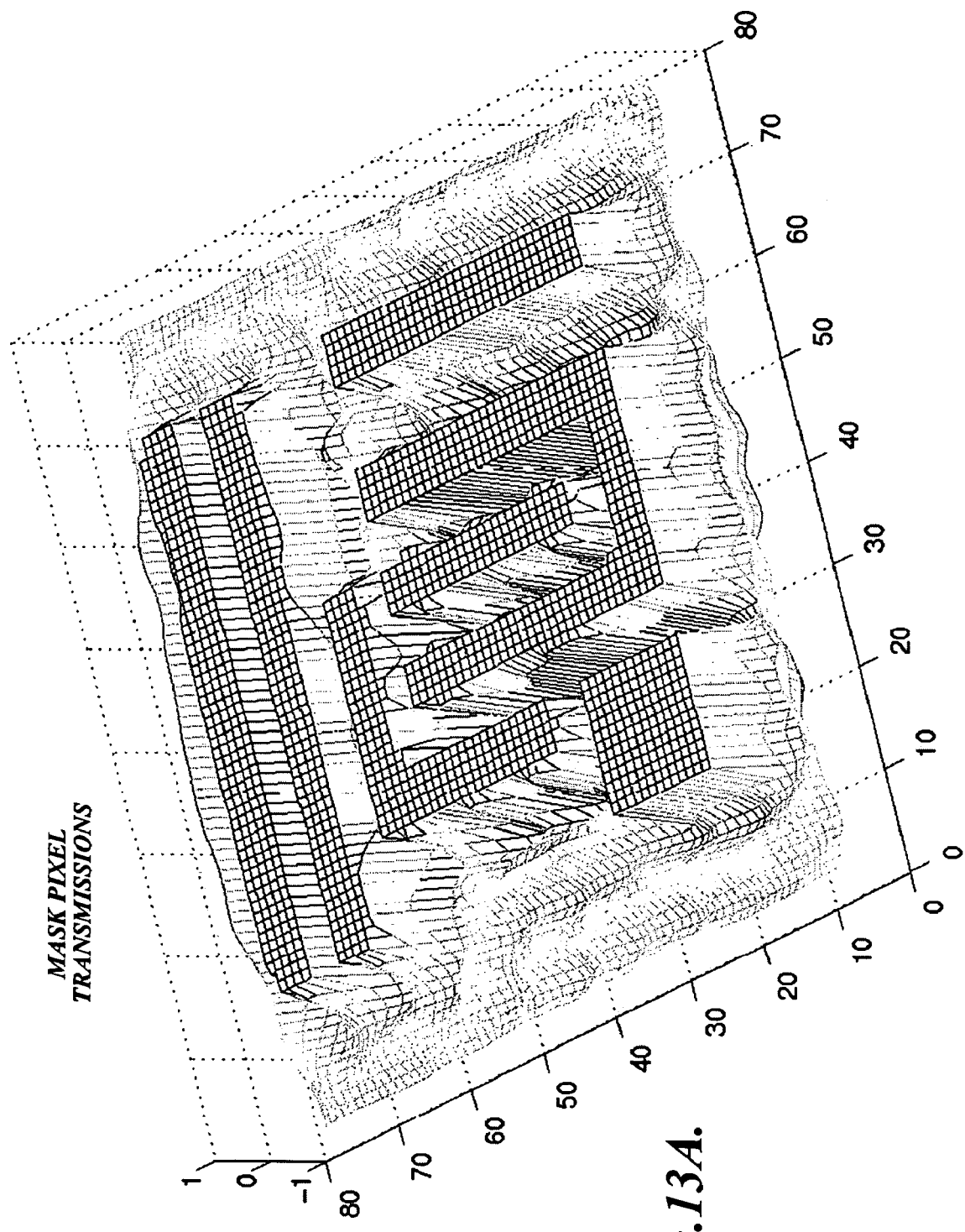
FIGS. 13A-13D illustrate a result of a constrained least square optimization in accordance with an embodiment of the present invention.
Figure 13D:
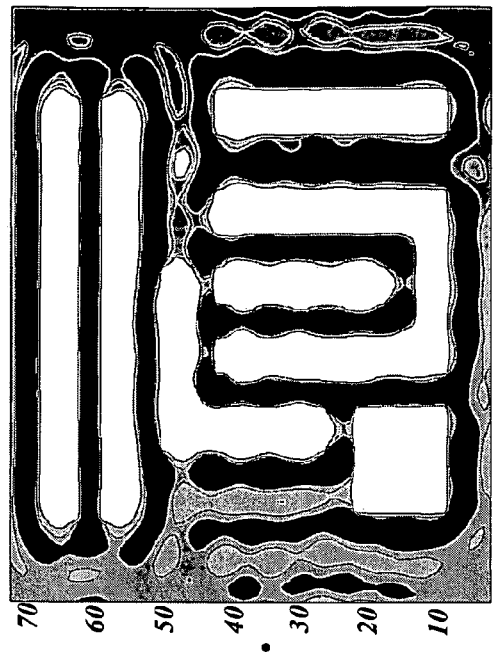
Figure 13B:
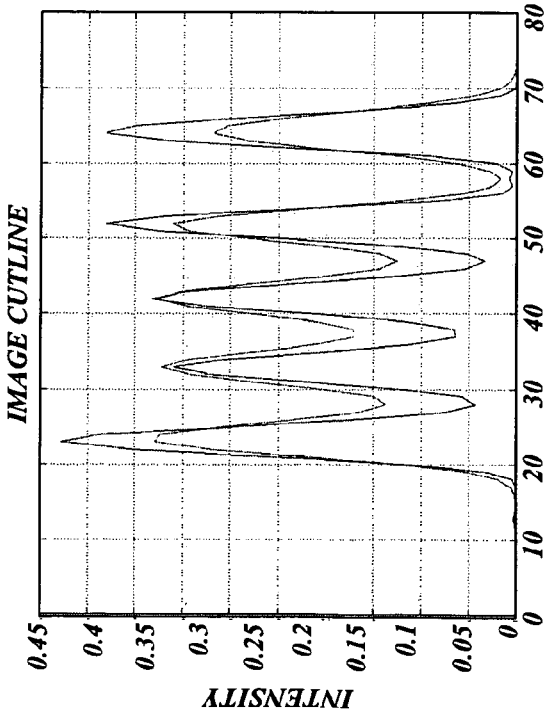
Figure 13C:
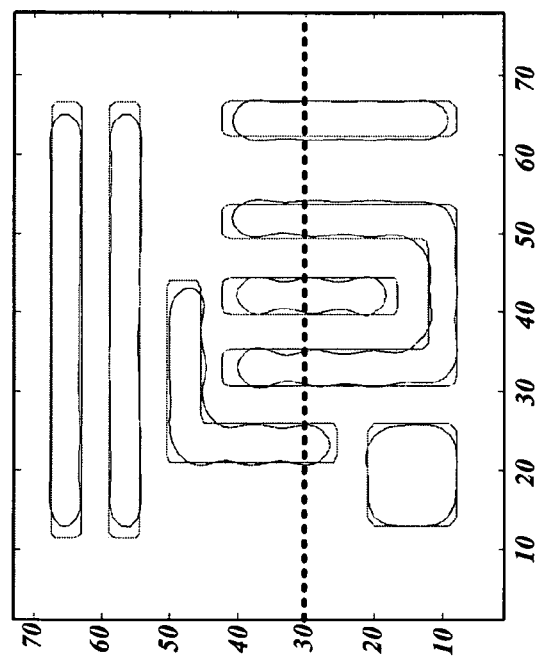

FIGS. 10A-10B demonstrate application of gradient descent to large piece of the layout with contact holes. The target holes are shown in green. The resulting mask is thresholded at the transmission level 0.5. The manufacturability of such complex masks is discussed in [33].

FIGS. 10A-10B illustrate examples of layout inversion for random logic and an SRAM cell.

We classified methods for solving inverse mask problems as linear, quadratic, and non-linear. We showed how to solve a quadratic problem for the case of spherical constraint. Such analytical solutions can be used as a first step for solving non-linear problems. In the case of the contacts, these solutions can be immediately applicable to assign contact phases and find positions of assist features. A composite objective function is proposed for the non-linear optimizations that combines objectives of image fidelity, contour fidelity, and penalized non-smooth and out of tone solutions. We applied method of local variations and a gradient descent to the non-linear problem. We proposed electrical field caching technique. Significant speedup is achieved in the descent algorithms by using analytical gradient of the objective function. This enables layout inversion on large scale as M log M operation for M pixels.

Still further mathematical detail of a method of calculating mask pixel transmission characteristics in accordance with an embodiment of the present invention is set forth in U.S. Provisional Patent Application No. 60/657,260, which is incorporated by reference herein as well as is in the paper "Solving Inverse Problems of Optical Microlithography" by Yuri Granik of Mentor Graphics Corporation, reproduced below (with slight edits).

The direct problem of microlithography is to simulate printing features on the wafer under given mask, imaging system, and process characteristics. The goal of inverse problems is to find the best mask and/or imaging system and/or process to print the given wafer features. In this study we will describe and compare solutions of inverse mask problems.

Pixel-based inverse problem of mask optimization (or "layout inversion") is harder than inverse source problem, especially for partially-coherent systems. It can be stated as a non-linear constrained minimization problem over complex domain, with large number of variables. We compare method of Nashold projections, variations of Fienap phase-retrieval algorithms, coherent approximation with deconvolution, local variations, and descent searches. We propose electrical field caching technique to substantially speedup the searching algorithms. We demonstrate applications of phase-shifted masks, assist features, and maskless printing.

We confine our study to the inverse problem of finding the best mask. Other inverse problems like non-dense mask optimization or combined source/mask optimization, however important, are not scoped. We also concentrate on the dense formulations of problems, where mask is discretized into pixels, and mostly skip the traditional edge-based OPC [25] and source optimization approaches [1].

The layout inversion goal appears to be similar or even the same as found in Optical Proximity Correction (OPC) or Resolution Enhancement Techniques (RET). However, we would like to establish the inverse mask problem as a mathematical problem being narrowly formulated, thoroughly formalized, and strictly solvable, thus differentiating it from the engineering techniques to correct ("C" in OPC) or to enhance ("E" in RET) the mask. Narrow formulation helps to focus on the fundamental properties of the problem. Thorough formalization gives opportunity to compare and advance solution techniques. Discussion of solvability establishes existence and uniqueness of solutions, and guides formulation of stopping criteria and accuracy of the numerical algorithms.

The results of pixel-based inversions can be realized by the optical maskless lithography (OML) [31]. It controls pixels of 30×30 nm (in wafer scale) with 64 gray levels. The mask pixels can also have negative real values, which enables phase-shifting.

Strict formulations of the inverse problems, relevant to the microlithography applications, first appear in pioneering studies of B. E. A. Saleh and his students S. Sayegh and K. Nashold. In [32], Sayegh differentiates image restoration from the image design (a.k.a. image synthesis). In both, the image is given and the object (mask) has to be found. However, in image restoration, it is guaranteed that the image is achieved by some object. In image design the image may not be achievable by any object, so that we have to target the image as close as possible to the desired ideal image. The difference is analogical to solving for a function zero (image restoration) and minimizing a function (image design). Sayegh proceeds to state the image design problem as an optimization problem of minimizing the threshold fidelity error $F_C$ in trying to achieve the given threshold $\theta$ at the boundary C of the target image ([32], p. 86):

$$F_C[m(x,y)] = \oint_C (I(x,y) - \theta)^n dl \to \min, \quad (1A)$$

where n=2 and n=4 options were explored; I(x, y) is image from the mask m(x, y); x, y are image and mask coordinates. Optical distortions were modeled by the linear system of convolution with a point-spread function h(x, y), so that $$I(x,y) = h(x,y) * m(x,y), \quad (2A)$$

and for the binary mask $$m(x,y) = \{0,1\}. \quad (3A)$$

Sayegh proposes algorithm of one at a time "pixel flipping". Mask is discretized, and then pixel values 0 and 1 are tried. If the error (1) decreases, then the pixel value is accepted, otherwise it is rejected, and we try the next pixel.

Nashold [22] considered a bandlimiting operator in the place of the point-spread function (2A). Such formulation facilitates application of the alternate projection techniques, widely used in image processing for the reconstruction and is usually referenced as Gerchberg-Saxton phase retrieval algorithm [7]. In Nashold formulation, one searches for a complex valued mask that is bandlimited to the support of the point-spread function, and also delivers images that are above the threshold in the bright areas B and below the threshold in the dark areas D of the target:

$$x,y \in B: I(x,y) > \theta,$$

$$x,y \in D: I(x,y) < \theta, \quad (4A)$$

Both studies [32] and [22] advanced solution of inverse problems for the linear optics. However, the partially coherent optics of microlithography is not a linear but a bilinear system [29], so that instead of (2A) the following holds:

$$I(x,y) = \int\int\int\int q(x-x_1, x-x_2, y-y_1, y-y_2) m^*(x_2,y_2) \, dx_1 dx_2 dy_1 dy_2, \quad (5A)$$

where q is a 4D kernels of the system. While the pixel flipping [32] is also applicable to the bilinear systems, Nashold technique relies on the linearity. To get around this limitation, Pati and Kailath [25] proposed to approximate bilinear operator by one coherent kernel h, the possibility that follows from Gamo results [6]:

$$I(x,y) \approx \lambda |h(x,y) * m(x,y)|^2, \quad (6A)$$

where constant $\lambda$ is the largest eigenvalue of q, and h is the correspondent eigenfunction. With this the system becomes linear in the complex amplitude A of the electrical field $$A(x,y) = \sqrt{\lambda} h(x,y) * m(x,y). \quad (7A)$$

Because of this and because h is bandlimited, the Nashold technique is applicable.

Y. Liu and A. Zakhor [19, 18] advanced along the lines started by the direct algorithm [32]. In [19] they introduced optimization objective as a Euclidean distance $\|\cdot\|_2$ between the target $I_{ideal}$ and actual wafer images $$F_I[m(x,y)] = \|I(x,y) - I_{ideal}(x,y)\|_2 \to \min. \quad (8A)$$

This was later used in (1A) as image fidelity error in source optimization. In addition to the image fidelity, the study [18] optimized image slopes in the vicinity of the target contour C:

$$F_S[m(x,y)] = \oint_{C-\epsilon} I(x,y) dl - \oint_{C+\epsilon} I(x,y) dl \to \min, \quad (9A)$$

where $C+\epsilon$ is a sized up and $C-\epsilon$ is a sized down contour C; $\epsilon$ is a small bias. This objective has to be combined with the requirement for the mask to be a passive optical element $m(x,y)m^*(x,y) \leq 1$ or, using infinity norm $\|\cdot\|_\infty = \max|\cdot|$, we can express this as $$\|m(x,y)\|_\infty \leq 1. \quad (10A)$$

In case of the incoherent illumination $$I(x,y) = h(x,y)^{2*}(m(x,y)m^*(x,y)) \quad (12A)$$

the discrete version of (9A, 10A) is a linear programming (LP) problem for the square amplitude $p_i = m_i m_i^*$ of the mask pixels, and was addressed by the "branch and bound" algorithm. When partially coherent optics (4A) is considered, the problem is complicated by the interactions $m_i m_j^*$ between pixels and becomes a quadratic programming (QP) problem. Liu [18] applied simulated annealing to solve it. Consequently, Liu and Zakhor made important contributions to the understanding of the problem. They showed that it belongs to the class of the constrained optimization problems and should be addressed as such. Reduction to LP is possible; however, the leanest relevant to microlithography and rigorous formulation must account for the partial coherence, so that the problem is intrinsically not simpler than QP. New solution methods, more sophisticated than the "pixel flipping", have also been introduced.

The first pixel-based pattern optimization software package was developed by Y.-H. Oh, J-C Lee, and S. Lim [24], and called OPERA, which stands for "Optical Proximity Effect Reducing Algorithm." The optimization objective is loosely defined as "the difference between the aerial image and the goal image," so we assume that some variant of (7A) is optimized. The solution method is a random "pixel flipping", which was first tried in [32]. Despite the simplicity of this algorithm, it can be made adequately efficient if image intensity can be quickly calculated when one pixel is flipped. The drawback is that pixel flipping can easily get stuck in the local minima, especially for PSM optimizations. In addition, the resulting patterns often have numerous disjoined pixels, so they have to be smoothed, or otherwise post-processed, to be manufacturable [23]. Despite these drawbacks, it has been experimentally proven in [17] that the resulting masks can be manufactured and indeed improve image resolution.

The study [28] of Rosenbluth, A., et al., considered mask optimization as a part of the combined source/mask inverse problem. Rosenbluth indicates important fundamental properties of inverse mask problems, such as non-convexity, which causes multiple local minima. The solution algorithm is designed to avoid local minima and is presented as an elaborate plan of sequentially solving several intermediate problems.

Inspired by the Rosenbluth paper and based on his dissertation and the SOCS decomposition [3], Socha delineated the interference mapping technique [34] to optimize contact hole patterns. The objective is to maximize sum of the electrical fields A in the centers $(x_k, y_k)$ of the contacts $k=1 \ldots N$:

$$F_B[m(x,y)] = -\sum_k A(x_k, y_k) \to \min. \tag{13A}$$

Here we have to guess the correct sign for each $A(x_k, y_k)$, because the beneficial amplitude is either a large positive or a large negative number ([34] uses all positive numbers, so that the larger A the better). When kernel h of (7A) is real (which is true for the unaberrated clear pupil), A and $F_B$ are also real-valued under approximation (7A) and for the real mask m. By substituting (7A) into (13A), we get $$-\sum_k A(x_k, y_k) = -\sum_k (h*m)\Big|_{x=x_k, y=y_k} \tag{14A}$$
$$= \sum_k (h*m) \cdot \delta(x-x_k, x-x_k)$$
$$= -(h*m) \cdot \left(\sum_k \delta(x-x_k, x-x_k)\right),$$

where the dot denotes an inner product $f \cdot g = \int\int fg\,dxdy$. Using the following relationship between the inner product, convolution*, and cross-correlation ∘ of real functions $$(f*g) \cdot p = f \cdot (g \circ p), \tag{15A}$$

we can simplify (14A) to $$-\sum_k A(x_k, y_k) = -\left(h \cdot \sum_k \delta(x-x_k, x-x_k)\right) \cdot m = -G_b \cdot m, \tag{16A}$$

where function $G_I$ is the interference map [34]. With (16A) the problem (13A) can be treated as LP with simple bounds (as defined in [8]) for the mask pixel vector $m = \{m_i\}$ $$-G_b \cdot m \to \min$$
$$-1 < m_i \leq 1$$

In an innovative approach to the joined mask/source optimization by Erdmaln, A., et al. [4], the authors apply genetic algorithms (GA) to optimize rectangular mask features and parametric source representation. GA can cope with complex non-linear objectives and multiple local minima. It has to be proven though, as for any stochastically based technique that the runtime is acceptable and quality of the solutions is adequate. Here we limit ourselves to the dense formulations and more traditional mathematical methods, so the research direction of [4] and [15] however intriguing is not pertinent to this study.

The first systematic treatment of source optimization appeared in [16]. This was limited to the radially-dependent sources and periodic mask structures, with the Michelson contrast as an optimization objective. Simulated annealing is applied to solve the problem. After this study, parametric [37], contour-based [1], and dense formulations [28], [12], [15] were introduced. In [12], the optimization is reduced to solving a non-negative least square (NNLS) problem, which belongs to the class of the constrained QP problems. The GA optimization was implemented in [15] for the pixelized source, with the objective to maximize image slopes at the important layout cutlines.

REDUCTION TO LINEAR PROBLEM

The inverse mask problem can be reduced to a linear problem, including traditional LP, using several simplification steps. The first step is to accept coherent approximation (6A, 7A). Second, we have to guess correctly the best complex amplitude $A_{ideal}$ of the electrical field from $$I_{ideal} = A_{ideal} A_{ideal}^* \tag{18A}$$

where $I_{ideal}$ is the target image. If we consider only the real masks m=Re[m] and real kernels h=Re[h], then from (7A) we conclude that A is real and thus we can set $A_{ideal}$ to be real-valued. From (18A) we get $$A_{ideal} = \pm\sqrt{I_{ideal}}, \tag{19A}$$

which means that $A_{ideal}$ is either +1 or −1 in bright areas of the target, and 0 in dark areas. If the ideal image has M bright pixels, the number of possible "pixel phase assignments" is exponentially large $2^M$. This can lead to the phase-edges in wrong places, but of course can be avoided by assigning the same value to all pixels within a bright feature: for N bright features we get $2^N$ different guesses. After we choose one of these combinations and substitute it as $A_{ideal}$ into (7A), we have to solve $$A_{ideal}(x,y) = \sqrt{\lambda} h(x,y) * m(x,y) \tag{20A}$$

for m. This is a deconvolution problem. Within the zoo of deconvolution algorithms, we demonstrate Weiner filtering, which solves (20A) in some least square sense. After applying Fourier transformation $F[\ldots]$ to (20A) and using convolution theorem $F[h*m] = F[h]F[m]$, we get $$\hat{m} = \frac{\hat{A}_{ideal}}{\sqrt{\lambda}\,\hat{h}} = \hat{A}_{ideal}\frac{\hat{h}^*}{\sqrt{\lambda}\,|\hat{h}|^2}, \tag{21A}$$

where the circumflex denotes Fourier transforms: $\hat{m}=F[m]$, $\hat{h}=F[h]$. The Wiener filter is a modification of (21A) where a relative noise power P is added to the denominator, which helps to avoid division by 0 and suppresses high harmonics:

$$\hat{m} = \hat{A}_{ideal} \frac{\hat{h}^*}{\sqrt{\lambda}|\hat{h}|^2 + P}. \quad (22A)$$

Final mask is found by the inverse Fourier transformation:

$$m = F^{-1}\left[\hat{A}_{ideal} \frac{\hat{h}^*}{\sqrt{\lambda}|\hat{h}|^2 + P}\right]. \quad (23A)$$

As the simplest choice we set P=const>0 to be large enough to satisfy mask constraint (11A). The results are presented in FIGS. 11A-11D. The imaging is simulated for annular 0.7/0.5 optical model with 0.75 NA and 193 nm lambda. The first inset on the left shows contours when mask is the same as target. The space between horizontal lines and L-shape tends to bridge, and the comb structure is pinching. The contour fidelity after deconvolution is much better (right inset), the bridging and pinching tendencies are gone. The semi-isolated line width is on target. The contrast is also improved, especially for the semi-isolated vertical line. However, the line ends and corner fidelity is not improved. The mask contours after deconvolution are shown in the right bottom inset. Positive transmission is assigned to all main features, which are canvassed with the assist features of negative transmission.

We can also directly solve (2) in the least square sense $$\|\sqrt{\lambda}h(x,y)*m(x,y) - A_{ideal}(x,y)\| \to \min \quad (24A)$$

In the matrix form $$\|Hm - A_{ideal}\| \to \min$$

$$J_{ij} = \sqrt{\lambda}h_{i-j}. \quad (25A)$$

Matrix H has multiple small eigenvalues. The problem is ill-posed. The standard technique dealing with this is to regularize it by adding norm of the solution to the minimization objective [14]:

$$\|Hm - A_{ideal}\|^2 + \alpha\|m\|^2 \to \min, \quad (26A)$$

where the regularization parameter $\alpha$ is chosen from secondary considerations. In our case we chose $\alpha$ large enough to achieve $\|mm\|_\infty \mathbin{\lower.3ex\hbox{$\buildrel<\over{\smash{\scriptstyle=}\vphantom{_x}}$}} 1$. The problem (26A) belongs to the class of unconstrained convex quadratic optimization problems, with guaranteed unique solution in non-degenerate cases. It can be solved by the methods of linear algebra, because (26) is equivalent to solving $$(H+\alpha I)m = A_{ideal} \quad (27A)$$

by the generalized inversion [12] of the matrix $H+\alpha I$. The results are presented in FIGS. 12A-12D.

This method delivers pagoda-like corrections to image corners. Some hints of hammer-heads and serifs can be seen in mask contours. Line ends are not corrected. Comparison of contrasts between the case when mask is the same as target show improved contrast, especially between the comb and semi-isolated line.

Further detailing of the problem (26A) is possible by explicitly adding mask constrains, that is we solve $$\|Hm - A_{ideal}\|^2 + \alpha\|m\|^3 \to \min$$

$$\|m\|_\infty \leq 1 \quad (28A)$$

This is a constrained quadratic optimization problem. It is convex as any linear least square problem with simple bounds. Convexity guarantees that any local minimizer is global, so that the solution method is not consequential: all proper solvers converge to the same (global) solution. We used MATLAB routine lsqlin to solve (29A). The results are presented in FIGS. 13A-13D. This solution has better contrast than the two previous ones, with more complex structure of the assist features.

Any linear functional of A is also linear by m, in particular we can form a linear objective by integrating A over some parts of the layout, as in (13A). One of the reasonable objectives to be formed by such procedure is the sum of electrical amplitudes through the region B, which consists of the all or some parts of the bright areas:

$$F_B[m(x,y)] = -\iint_B A(x,y)\,dx\,dy \to \min, \quad (28B)$$

that is we try to make bright areas as bright as possible. Using the same mathematical trick as in (14A), this is reduced to the linear objective $$-G_b \cdot m \to \min, \quad (29A)$$

where $G_b = h \circ b$, and b is a characteristic function of the bright areas. This seems to work well as the basis for the contact optimizations. It is harder to form region B for other layers. If we follow suggestion [4] to use centers of the lines, then light through the corners becomes dominant, spills over to the dark areas, and damages image fidelity. This suggests that we have to keep dark areas under control as well. Using constraints similar to (4A), we can require for each dark pixel to be of the limited brightness $\theta$ $$x,y \in D: -\theta \leq A(x,y) \leq \theta, \quad (30A)$$

or in the discrete form $$-\theta \leq H_d m \leq \theta. \quad (30B)$$

where $H_d$ is matrix H without rows correspondent to the bright regions. Though equations (28A) and (30B) form a typical constrained LP problem, MATLAB simplex and interior point algorithms failed to converge, perhaps because the matrix of constraints has large null-space.

The linearization (7A) can be augmented by the threshold operator to model the resist response. This leads to Nashold projections [22]. Nashold projections belong to the class of the image restoration techniques, rather than to the image optimizations, meaning that the method might not find the solution (because it does not exists at all), or in the case when it does converge, we cannot state that this solution is the best possible. It has been noted in [20] that the solutions depend on the initial guess and do not deliver the best phase assignment unless the algorithm is steered to it by a good initial guess. Moreover, if the initial guess has all phases set to 0, then so has the solution.

Nashold projections are based on Gerchberg-Saxton [7] phase retrieval algorithm. It updates a current mask iterate $m^k$ via $$m^{k+1} = (P_m P_s)m^k, \quad (31A)$$

where $P_s$ is a projection operator into the frequency support of the kernel h, and $P_m$ is a projection operator that forces the thresholding (4A). Gerchberg-Saxton iterations tend to stagnate. Fienap [5] proposed basic input-output (BIO) and hybrid input-output (HIO) variations that are less likely to be stuck in the local minima. These variations can be generalized in the expression $$m^{k+1} = (P_m P_s + \alpha(\gamma(P_m P_s - P_s) - P_m + I)m^k, \tag{32A}$$

where I is an identity operator; $\alpha=1$, $\gamma=0$ for BIO, $\alpha=1$, $\gamma=1$ for HIO, and $\alpha=0$, $\gamma=0$ for the Gerchberg-Saxton algorithm.

We implemented operator $P_m$ as a projection onto the ideal image $$P_m m^k = \frac{m^k}{|m^k|} \sqrt{I_{ideal}}, \tag{33A}$$

and P as a projection to the domain of the kernel h, i.e. $P_s$ zeros out all frequencies of $\hat{m}$ which are high than the frequencies of the kernel h. The iterates (32A) are very sensitive to the values of its parameters and the shape of ideal image. We were able to find solutions only when the ideal image is smoothed. We used Gaussian kernel with the diffusion length of 28 nm, which is slightly larger than the pixel size 20 nm in our examples. The behavior of iterates (32A) is not yet sufficiently understood [36], which complicates choice of $\alpha,\gamma$. We found that in our examples the convergence is achieved for $\alpha=0.9$, $\gamma=1$ after 5000 iterations. When $\alpha=0$, $\gamma=0$, which corresponds to (31), the iterations quickly stagnate converging to a non-printable mask.

As shown in FIG. 1B, Nashold projections assign alternating phases to the main features and insert assists between lines. The lines widths are on-target, but line-ends are not corrected. The solution has very good contrast. When projections stagnate, the phases alternate along the lines. This "phase entanglement" can sometimes happen in the non-linear problems (considered in a section below) when their iterations start from the random pixel assignments.

QUADRATIC PROBLEMS

In the quadratic formulations of the inverse problems, the coherent linearization (6A) is not necessarily. We can directly use bilinear integral (5A). Our goal here is to construct an objective function as is a quadratic form of mask pixels. We start with (8A) and replace Euclidean norm (norm 2) with Manhattan norm (norm 1):

$$F_I[m(x,y)] = \|I(x,y) - I_{ideal}(x,y)\|_1 \to \min. \tag{34A}$$

The next step is to assume that the ideal image is sharp, 0 in dark regions and 1 in bright regions, so that $I(x, y) \geq I_{ideal}(x, y)$ in the dark regions and $I(x, y) \leq I_{ideal}(x, y)$ in the bright regions. This lets us to remove the module operation from the integral (34A):

$$\|I(x,y) - I_{ideal}(x,y)\|_1 = \iint |I - I_{ideal}| dxdy = \iint w(x,y) - I_{ideal}(x,y))dxdy, \tag{35A}$$

where w(x,y) is 1 in dark regions and −1 in bright regions. Finally we can ignore the constant term in (35A), which leads to the objective $$F_w[m(x,y)] = \iint wI(x,y) \to \min. \tag{36A}$$

The weighting function w can be generalized to have any positive value in dark regions, any negative value in bright regions, and 0 in the regions which we choose to ignore. Proper choice of this function covers the image slope objective (9A), but not the threshold objective (1A). Informally speaking, we seek to make bright regions as bright as pos sible, and dark regions as dark as possible. Substituting (5A) into (36A), we get $$\iint wI(x,y)dxdy = \iiiint Q(x_1,y_1,x_2,y_2)m(x_1,y_1)m^*(x_2,y_2)dx_1dx_1dy_1dy_2, \tag{37A}$$

where $$Q(x_1,y_1,x_2,y_2) = \iint w(x,y)q(x-x_1,x-x_2,y-y_1,y-y_2)dxdy. \tag{38A}$$

Discretization of (37A) results to the following constrained QP $$F_w[m] = m^* Q m \to \min$$

$$\|m\|_\infty \leq 1. \tag{39A}$$

The complexity of this problem depends on the eigenvalues of matrix Q. When all eigenvalues are non-negative, then it is convex QP and any local minimizer is global. This is a very nice property, because we can use any of the numerous QP algorithms to find the global solution and do not have to worry about local minima. Moreover, it is well known that the convex QP can be solved in polynomial time. The next case is when all eigenvalues are non-positive, a concave QP. If we remove constraints, the problem becomes unbounded (no solutions). This means that the constraints play a decisive role: all solutions, either local or global, end up at some vertex of the box $\|m\|_\infty \leq 1$. In the worst case scenario, the solver has to visit all vertices to find the global solution, which means that the problem is NP-complete, i.e., it may take an exponential amount of time to arrive at the global minima. The last case is an indefinite QP when both positive and negative eigenvalues are present. This is the most complex and the most intractable case. An indefinite QP can have multiple minima, all lie on the boundary.

We conjecture that the problem (39A) belongs to the class of indefinite QP. Consider the case of the ideal coherent imaging, when Q is a diagonal matrix. Vector w lies along its diagonal. This means that eigenvalues $\mu_1, \mu_2 \ldots$ of Q are the same as components of the vector w, which are positive for dark pixels and negative for bright pixels. If there is at least one dark and one bright pixel, the problem is indefinite. Another consideration is that if we assume that (39A) is convex, then the stationary internal point m=0 where the gradient is zero $$\frac{dF_w[m]}{dm} = 2Qm = 0 \tag{40A}$$

is the only solution, which is a trivial case of mask being dark. This means that (39) is either has trivial (global) solution, or it is non-convex.

Related to (39) QP was considered by Rosenbluth [28]:

$$m^* Q_d m \to \min$$

$$m^* Q_b m \geq b \tag{41A}$$

where $Q_d$ and $Q_b$ deliver average intensities in bright and dark regions correspondingly. The objective is to keep dark regions as dark as possible while maintaining average intensity not worse than some value b in bright areas. Though the problem was stated for the special case of the off-centered point-source, the structure of (41A) is very similar to (39A). Using Lagrange multipliers, we can convert (41A) to $$m^*(Q_d - \lambda Q_b)m \to \min$$

$$\|m\|_\infty \leq 1,$$

$$\lambda \geq 0 \tag{42A}$$

which is similar to (39A).

Another metric of the complexity of (39A) is number of the variables, i.e., the pixels in the area of interest. According to Gould [10], the problems with order of 100 variables are small, more than $10^3$ are large, and more than $10^5$ are huge. Considering that the maskless lithography can control transmission of the 30 nm by 30 nm pixel [31], the QP (39A) is large for the areas larger than 1 um by 1 um, and is huge for the areas lager than 10 um by 10 um. This has important implications for the type of the applicable numerical methods: in large problems we can use factorizations of matrix Q, in huge problems factorizations are unrealistic.

For the large problems, when factorization is still feasible, a dramatic simplification is possible by replacing the infinity norm by the Euclidean norm in the constraint of (39A), which results in $$F_w[m] = m^*Qm \to \min$$

$$\|m\|_2 \leq 1. \tag{43A}$$

Here we search for the minimum inside a hyper-sphere versus a hyper-cube in (39A). This seemingly minor fix carries the problem out of the class of NP-complete to P (the class of problems that can be solved in polynomial time). It has been shown in [35] that we can find global minima of (43A) using linear algebra. This result served as a base for the computational algorithm [1] which specifically addresses indefinite QP.

The problem (43A) has the following physical meaning: we optimize the balance of making bright regions as bright as possible and dark regions as dark as possible while limiting light energy $\|m\|_2^2$ coming through the mask. To solve this problem, we use procedures outlined in [31,32]. First we form Lagrangian function of (43A)

$$L(m,\lambda) = m^*Qm + \lambda(\|m\|^2 - 1). \tag{44A}$$

From here we deduce the first order necessary optimality conditions of Karush-Kuhn-Tucker (or KKT conditions, [20]):

$$2(Q + \lambda I)m = 0$$

$$\lambda(\|m\| - 1) = 0$$

$$\lambda \geq 0$$

$$\|m\| \leq 1 \tag{45A}$$

Using Sorensen [35], we can state what that (43A) has a global solution if we can find such $\lambda$ and m that (45A) is satisfied and the matrix $Q + \lambda I$ is positive semidefinite or positively defined. Let us find this solution.

First we notice that we have to choose $\lambda$ large enough to compensate the smallest (negative) eigenvalue of Q, i.e.

$$\lambda \geq |\mu_1| > 0 \tag{46A}$$

From the second condition in (45A) we conclude that $\|m\| = 1$, that is the solution lies on the surface of hyper-sphere and not inside it. The last equation to be satisfied is the first one from (45A). It has a non-trivial $\|m\| > 0$ solution only when the Lagrange multiplier $\lambda$ equals to a negative of one of the eigenvalues $\lambda = -\mu_i$. This condition and (46A) has a unique solutions $\lambda = -\mu_1$, because other eigenvalues $\mu_2, \mu_3, \ldots$ are either positive so that $\lambda \geq 0$ does not hold, or they are negative, but with absolute value that is smaller than $\mu_1$ so that $\lambda \geq |\mu_1|$ does not hold.

After we determined that $\lambda = -\mu_1$, we can find m from $2(Q - \mu_1 I)m = 0$ as the corresponding eigenvector $m = v_2$. This automatically satisfies $\|m\| = 1$, because all eigenvectors are normalized to have a unit length. We conclude that (43A) has a global solution which corresponds to the smallest negative eigenvalue of Q. This solution is a good candidate for a starting point in solving (39A): we start from the surface of the hyper-sphere and proceed with some local minimization technique to the surface of the hyper-cube.

As we have shown, the minimum eigenvalue of Q and its eigenvector play special role in the problem by defining the global minimum. However, other negative eigenvectors are also important, because it is easy to see that any pair $$\lambda = -\mu_i > 0$$

$$m = v_i \tag{47A}$$

is a KKT point and as such defines a local minimum. The problem has as many local minima as negative eigenvalues. We may also consider starting our numerical minimization from one of these "good" minima, because it is possible that a local minimum leads to a better solution in the hyper-cube than a global minimum of the spherical problem.

FIGS. 2A, 2B and 2C show three strongest local minima of the problem (39A) for the structure of FIG. 1B. These local minima point to the beneficial interactions between layout features, suggesting alternating phase assignments. For example, the second solution suggests that the L-shape transmission should be chosen positive, while the comb has negative transmission, the dense vertical line of the comb has positive transmission, and the second horizontal line has negative transmission.

Results of the similar analysis for the case of the contact holes are displayed in FIGS. 3B, 3C and 3D. These results are much stronger, and can be used directly in applications. The method "proposes" beneficial phases for the contacts and position and phases of the assists. The most interesting solution is shown in the low right inset, where all contacts have well-defined transmissions, with 3 contacts positive and 4 contacts negative. The advantages of this method comparing to IML [3] is that this method automatically finds the best phases of the contacts and is not based of the coherent approximation.

FIGS. 3B-3D show the first three local minima for QP on a hyper-sphere for the contact holes and process conditions from Socha [3]. The third solution has the clearest phase assignments and the position of assists.

For the positive masks, in particular for the binary masks, the constraint can be tightened to $\|m - 0.5\|_\infty \leq 0.5$. Then the correspondent to (39A) problem is $$F_w[m] = m^*Qm \to \min$$

$$\|m - 0.5\|_\infty \leq 0.5. \tag{48A}$$

This is also an indefinite QP and is NP-complete. Replacing here infinity norm with Euclidean norm, we get a simpler problem $$m^*Qm \to \min$$

$$\|\Delta m\|_2 \leq 0.5$$

$$\Delta m = m - m_0, m_0\{0.5, 0.5, \ldots, 0.5\}$$

The Lagrangian can be written as $$L(m,\lambda) = m^*Qm + \lambda(\|m - m_0\|^2 - 0.25). \tag{50A}$$

The KKT point must be found from the following conditions $$(Q + \lambda I)\Delta m = -Qm_0$$

$$\lambda(\|\Delta m\|^2 - 0.25) = 0$$

$$\lambda \geq 0$$

$$\|\Delta m\| \leq 0.5 \tag{51A}$$

This is more complex problem than (45A) because the first equation is not homogeneous and the pairs $\lambda=-\mu_i$, $\Delta m=v_i$ are clearly not the solutions. We can still apply the condition of the global minimum $\lambda \leq -\mu_1 > 0$ (Sorensen [35]). From the second condition we conclude that $\|\Delta m\|^2=0.25$, meaning that all solutions lie on the hyper-sphere with the center at $m_0$. The case $\lambda=-\mu_1$ is eliminated because the first equation is not homogeneous, so that we have to consider only $\lambda > -\mu_1$. Then $Q+\lambda I$ is non-singular, we can invert it, and find the solution $$\Delta m = -(Q+\lambda I)^{-1} Q m_0. \tag{52A}$$

The last step is to find the Lagrange multiplier $\lambda$ that satisfy the constraint $\|\Delta m\|^2=0.25$, that is we have to solve $$\|(Q+\lambda I)^{-1} Q m_0\|=0.5. \tag{53A}$$

This norm monotonically increases from 0 to infinity in the interval $-\infty < \lambda < -\mu_1$, thus (53A) has to have exactly one solution in this interval. The pair $\lambda$, $\Delta m$ that solves (52A-53A) is a global solution of (49A). We conjecture that there are fewer KKT points of local minima of (49A) than in (45A) (may be there are none), but this remains to be proven by analyzing behavior of the norm (53A) when Lagrange multiplier is between negative eigenvalues. The solutions of (49A) show how to insert assist features when all contacts have the same phases.

GENERAL NON-LINEAR PROBLEMS

Consider objective (8A) of image fidelity error $$F_I[m(x,y)]=\|I(x,y)-I_{ideal}(x,y)\| \to \min. \tag{54A}$$

We can state this in different norms, Manhattan, infinity, Euclidean, etc. The simplest case is a Euclidean norm, because (54A) becomes a polynomial of the forth degree (quartic polynomial) of mask pixels. The objective function is very smooth in this case, which ease application of the gradient-descent methods. While theory of QP is well developed, the polynomial optimization is an area of growing research interest, in particular for quartic polynomials [27].

We can generalize (54A) by introducing weighting $w=w(x,y)$ to emphasize important layout targets and consider smoothing in Sobolev norms as in [12]:

$$F_w[m(x,y)]^2 = \|\sqrt{w} \cdot (I-I_{ideal})\|_2^2 + \alpha_1\|L_1 m\|_2^2 + \alpha_2\|L_2 m\|_2^2 + \alpha_3 \|m-m_0\|_2^2 \to \min, \tag{55A}$$

where $L_1$, $L_2$ are the operators of first and second derivatives, $m_0=m_0(x,y)$ is some preferred mask configuration that we want to be close to (for example, the target), and $\alpha_1, \alpha_2, \alpha_3$ are smoothing weights. The solutions of (55A) increase image fidelity; however, the numerical experiments show that the contour fidelity of the images is not adequate. To address, we explicitly add (1A) into (55A):

$$F_{wc}[m]^2 = \|\sqrt{w} \cdot (I-I_{ideal})\|_2^2 + \oint_C (I-\theta)^n dl + \alpha_1 \|L_1 m\|_2^2 + \alpha_2 \|L_2 m\|_2^2 + \alpha_3 \|m-m_0\|_2^2 \to \min \|m\|_\infty \leq 1. \tag{56A}$$

If the desired output is a two-, tri-, any other multi-level tone mask, we can add penalty for the masks with wrong transmissions. The simplest form of the penalty is a polynomial expression, so for example for the tri-tone Levenson-type masks with transmissions −1, 0, and 1, we construct the objective as $$F_{wce}[m]^2 = \tag{57A}$$
$$\|\sqrt{w} \cdot (I-I_{ideal})\|_2^2 + \oint_C (I-\theta)^n dl + \alpha_1 \|L_1 m\|_2^2 + \alpha_2 \|L_2 m\|_2^2 + \alpha_3 \|m-m_0\|_2^2 + \alpha_4 \|(m+e)m(m-e)\|_2^2 \|m\|_\infty \leq 1 \to \min,$$

where $e$ is a one-vector. Despite all the complications, the objective function is still a polynomial of the mask pixels. To optimize for the focus depth, the optimization of (57A) can be conducted off-focus, as was suggested in [16, 12]. After discretization, (55A) becomes a non-linear programming problem with simple bounds.

We expect that this problem inherits property of having multiple minima from the corresponding simpler QP, though smoothing operators of (57A) have to increase convexity of the objective. In the presence of multiple local minima the solution method and staring point are highly consequential: some solvers tend to converge to the "bad" local solutions with disjoined masks pixels and entangled phases, others better navigate solution space and chose smoother local minima. The Newton-type algorithms, which rely on the information about second derivatives, should be used with a caution, because in the presence of concavity in (57A), the Newtonian direction may not be a descent direction. The branch-and-bound global search techniques [18] are not the right choice because they are not well-suited for the large multi-dimensional optimization problems. Application of stochastic techniques of simulated annealing [24] or GA [4] seems to be an overkill, because the objective is smooth. It is also tempting to perform non-linear transformation of the variables to get rid of the constraints and convert problem to the unconstrained case, for example by using transformation $x_i=\tanh(m_i)$ or $m_i=\sin(x_i)$, however, this generally is not recommended by experts [8, p. 267].

The reasonable choices to solve (57A) are descent algorithms with starting points found from the analytical solutions of the related QP. We apply algorithms of local variations ("one variable at a time"), which is similar in spirit to the pixel flipping [32, 24], and also use a variation of the steepest descent by Frank and Wolfe [21] to solve constrained optimization problems.

In the method of local variation, we chose the step $\Delta_1$ to compare three exploratory transmissions for the pixel i: $m_i^1$, $m_i^1+\Delta_1$, and $m_i^1-\Delta_1$. If one of these values violates constraints, then it is pulled back to the boundary. The best of these three values is accepted. We try all pixels, optionally in random exhaustive or circular order, until no further improvement is possible. Then we reduce step $\Delta_2 < \Delta_1$ and repeat the process until the step is deemed sufficiently small. This algorithm is simple to implement. It naturally takes care of the simple (box) constraints and avoids the general problem of other more sophisticated techniques (like Newton), which may converge prematurely to a non-stationary point. This algorithm calculates the objective function numerous times; however, the runtime cost of its exploratory calls is very low with the electrical field caching (see the next section). Other algorithms require fewer but more costly non-exploratory calls. This makes method of local variation a legitimate tool in solving the problem.

Frank and Wolfe method is an iterative algorithm to solve constrain problems. At each step k we calculate the gradient $\nabla F^k$ of the objective and then replace the non-linear objective with its linear approximation. This reduces the problem to LP with simple bounds:

$$\nabla F^k \cdot m \to \min$$

$$\|m\|_\infty \leq 1. \tag{59A}$$

The solution of this $m = l^k$ is used to determine the descent direction $$p^k = l^k - m^{k-1}. \tag{60B}$$

Then the line search is performed in the direction of $p^k$ to minimize the objective as a function one variable $\gamma \in [0,1]$:

$$F[m^{k-1} + \gamma p^k] <\to \min. \tag{61B}$$

The solution $m^k = m^{k-1} + \gamma p^k$ is accepted as the next iterate. The iterations continue until convergence criteria are met. Electrical field caching helps to speedup the gradient calculations and line search of this procedure.

Figure 14A:
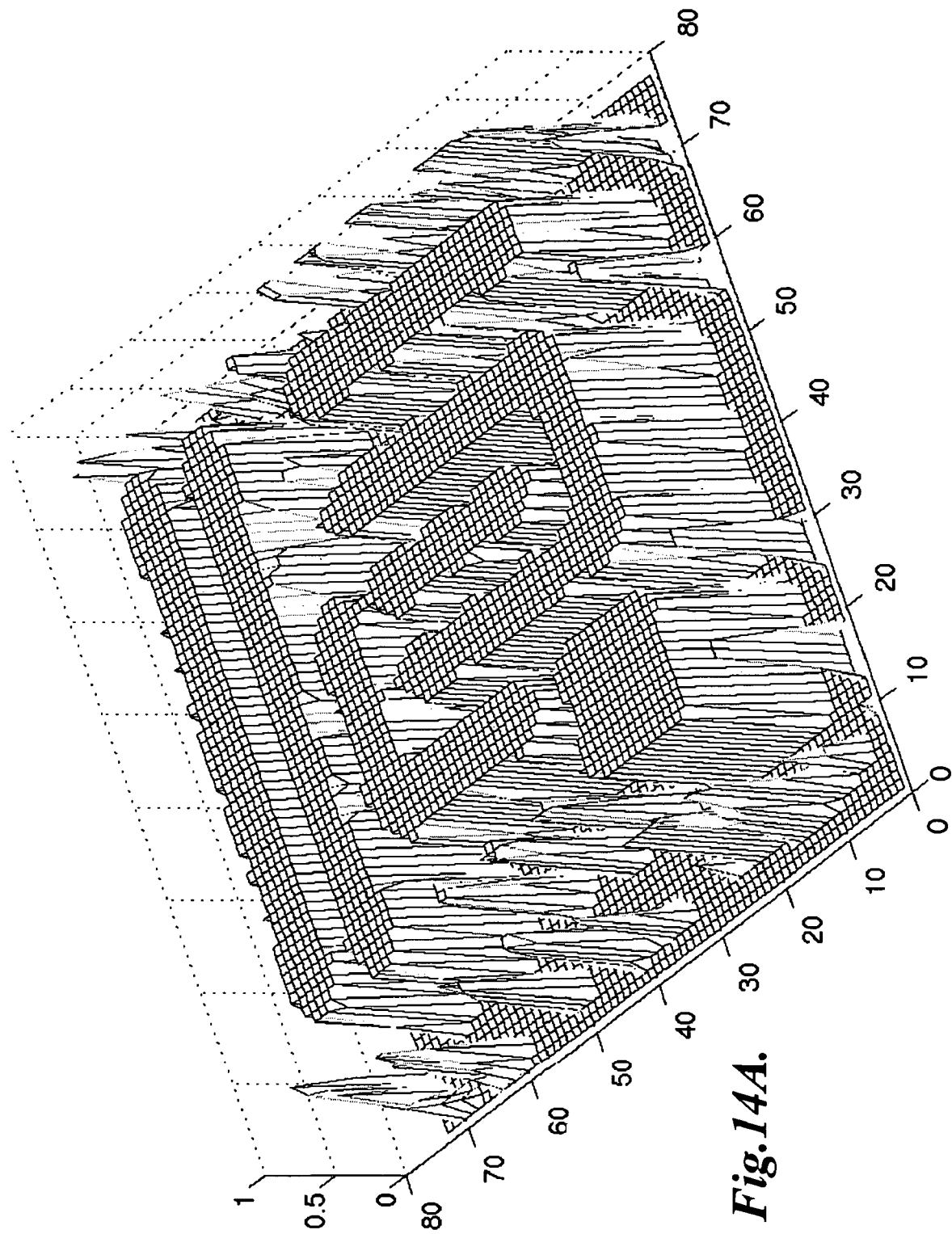
FIGS. 14A-14C illustrate a method of local variations in accordance with an embodiment of the present invention.
Figure 14C:
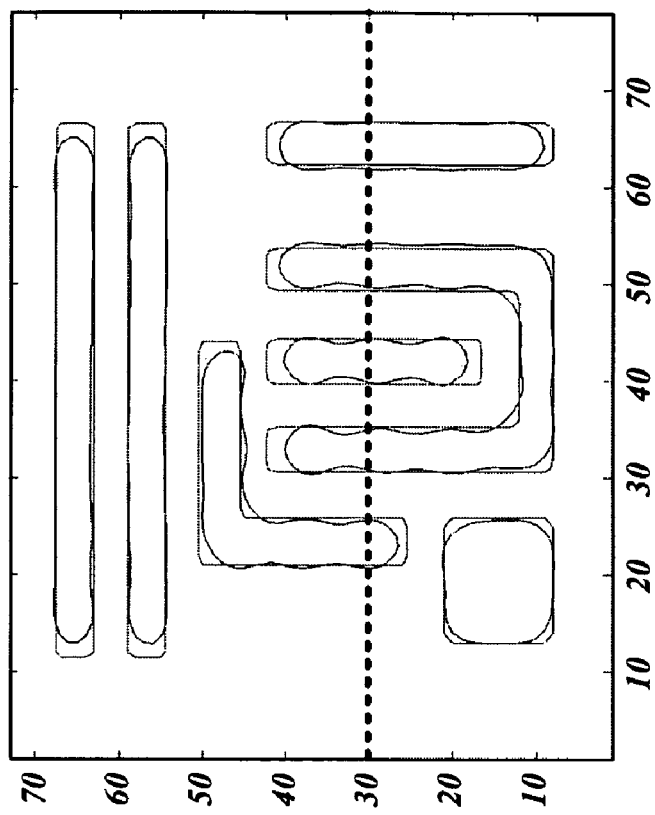
Figure 14B:
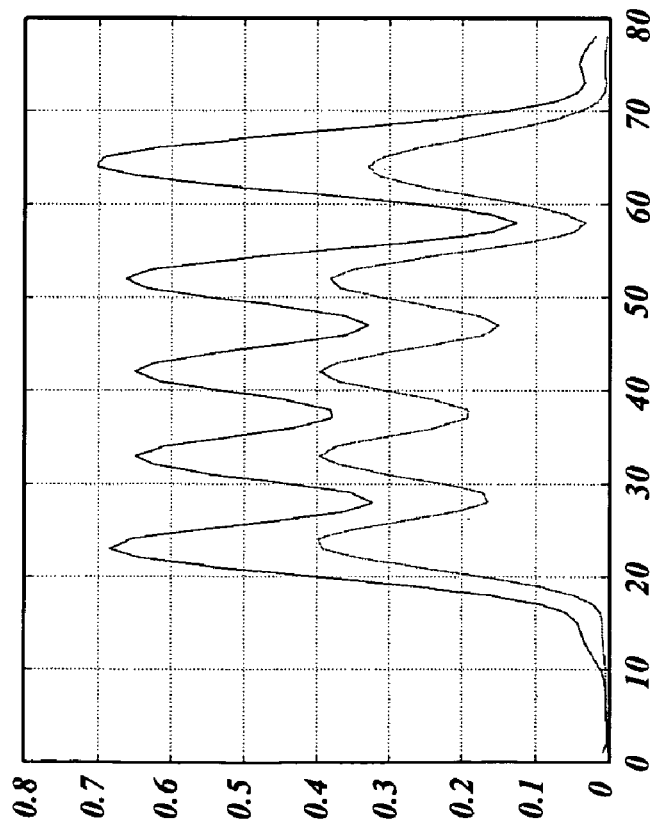

In FIGS. 14A-14C we show results of solving (55A) for the positive mask $0 \leq m \leq 1$. The assist features can be seen around main structures. However, the solution comes up very bright and the contrast is only marginally improved. This is corrected in (56A) with the introduction of the contour fidelity metric. The results are shown in FIGS. 15A-15C.

Figure 15A:
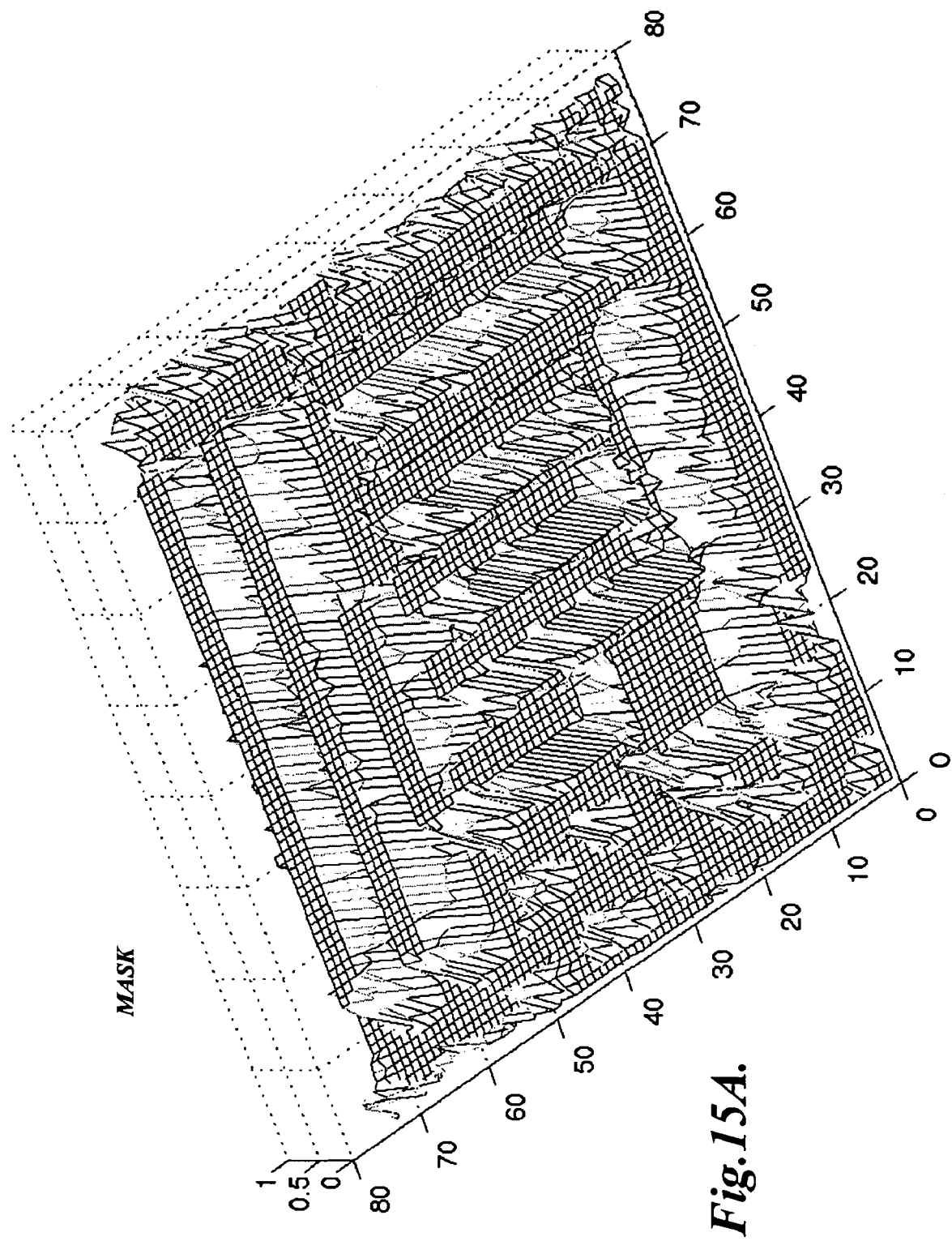
FIGS. 15A-15C illustrate a method of local variations with contour fidelity in accordance with the present invention.
Figure 15C:
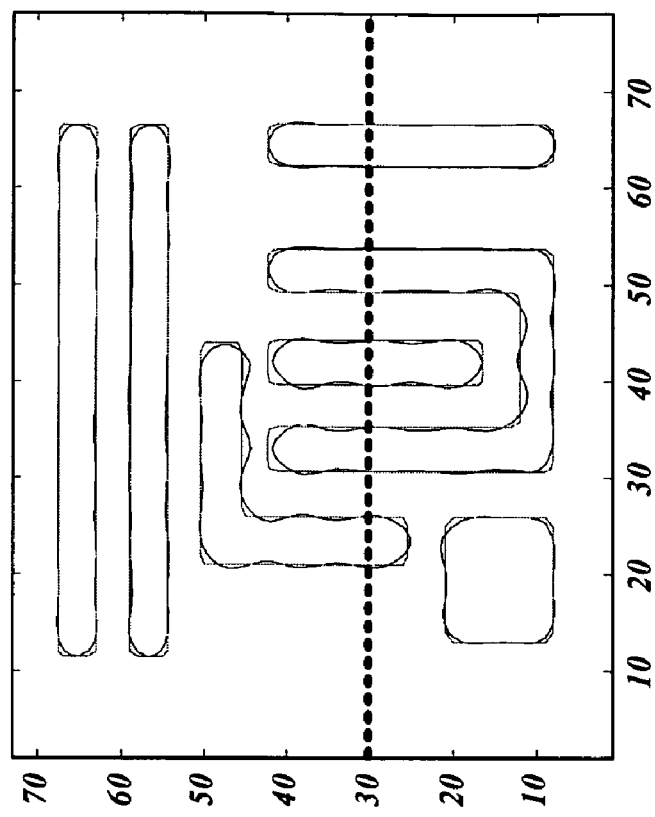
Figure 15B:
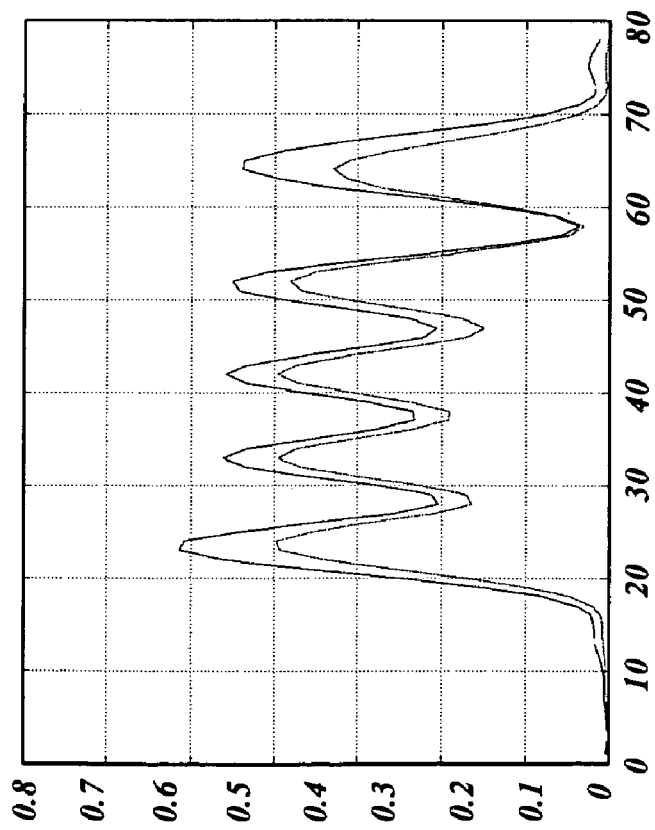

FIGS. 15A-15C illustrates a method of local variations for the objective (57A) with contour fidelity. The contours are on target almost everywhere, including line ends. The image contrast is improved. Mask has rows of assist features and serifs.

Figure 16A:
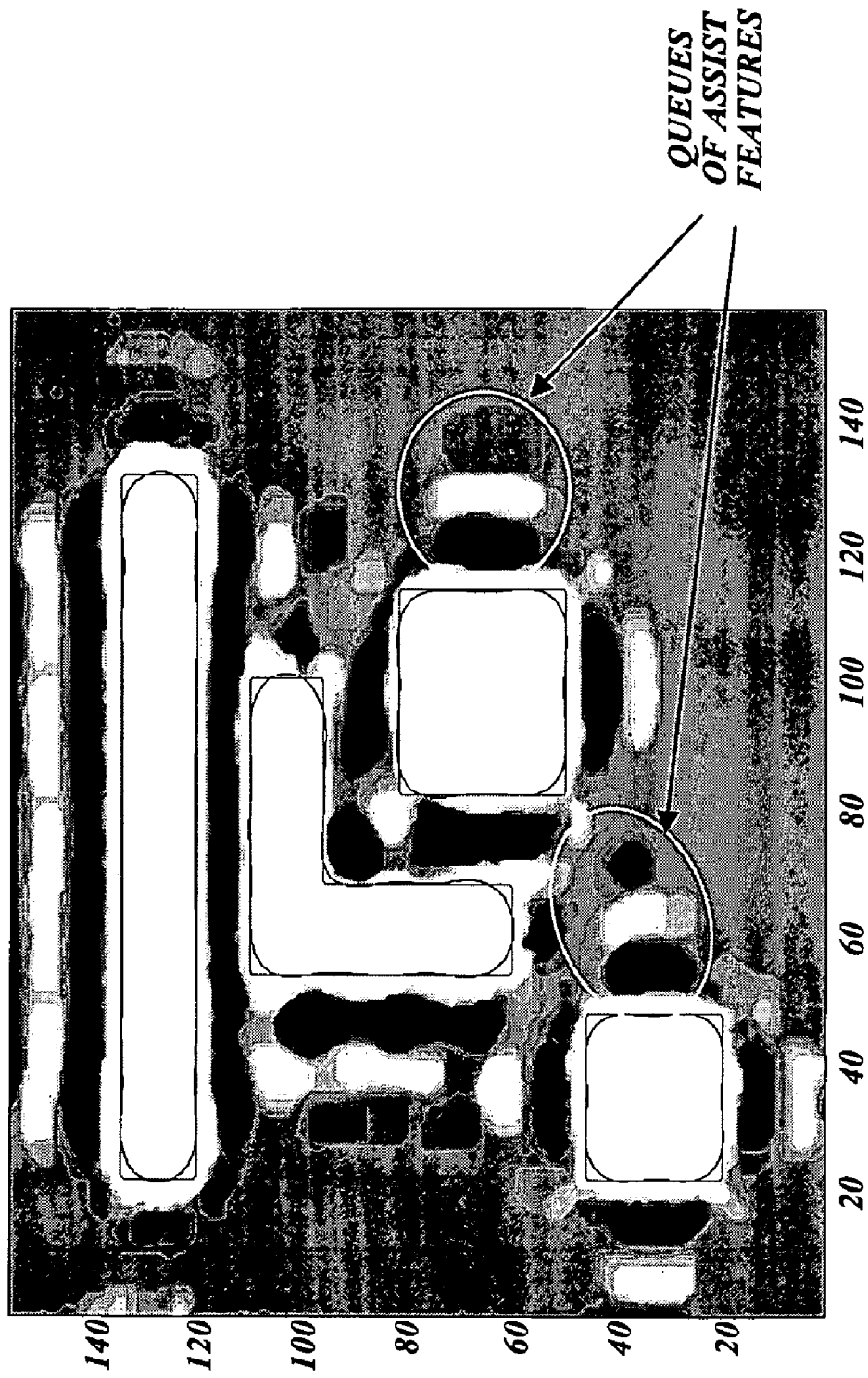
FIG. 16 illustrates a result of a local variations algorithm for a PSM mask in accordance with an embodiment of the present invention.

Result of the local variation algorithm for the PSM mask are shown in FIG. 16. The contours are on target, except some corner rounding. The main features have the same phase. Each side of the pads and lines is protected by the queue of assist features with alternating phases.

Figure 17A:
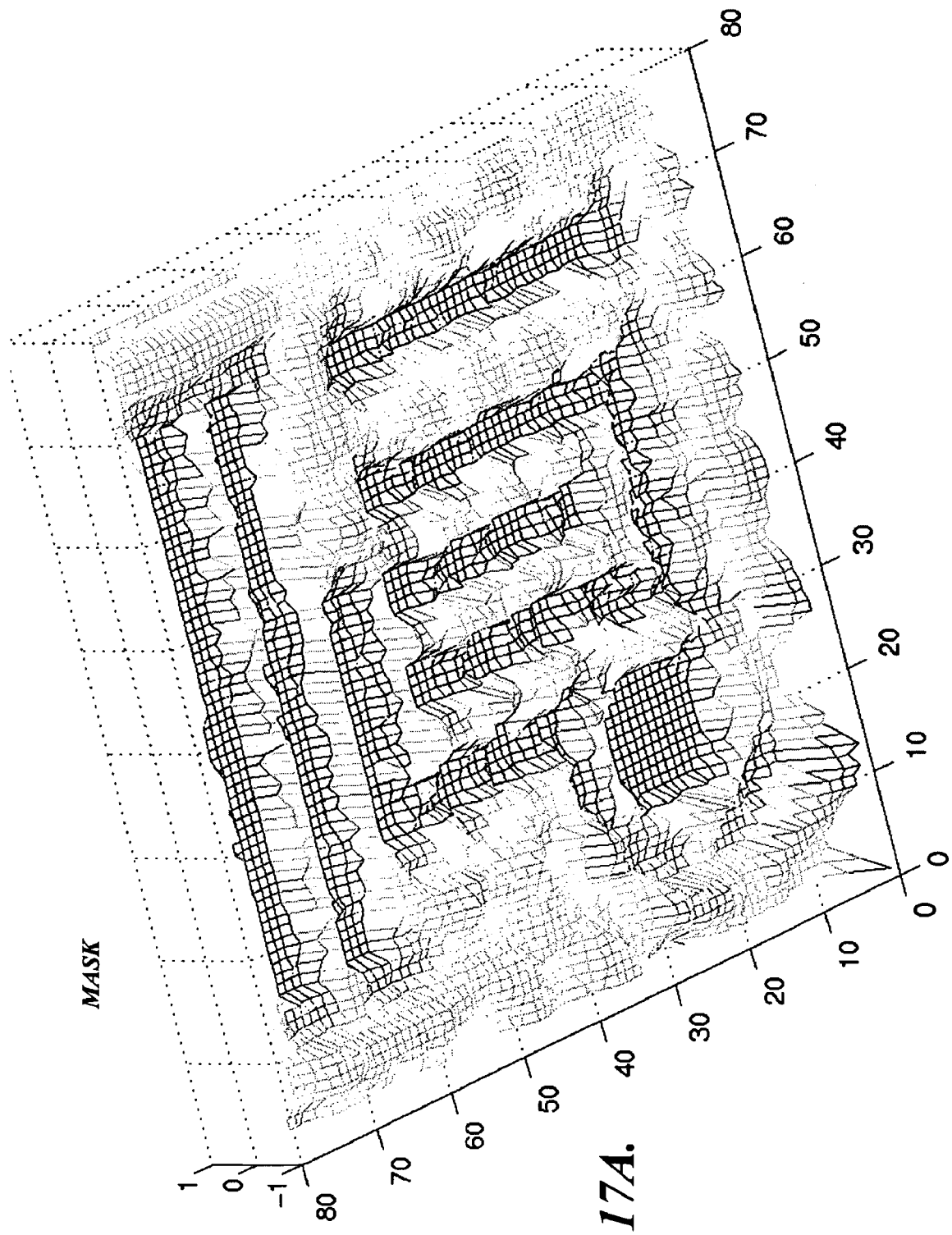
FIGS. 17A-17C illustrate a solution of phase and assist features in accordance with an embodiment of the present invention.
Figure 17C:
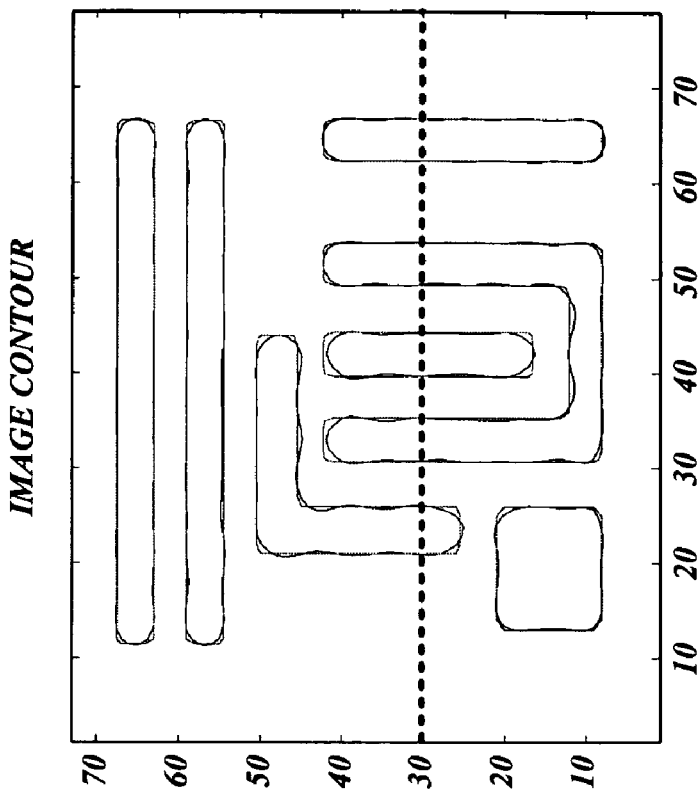
Figure 17B:
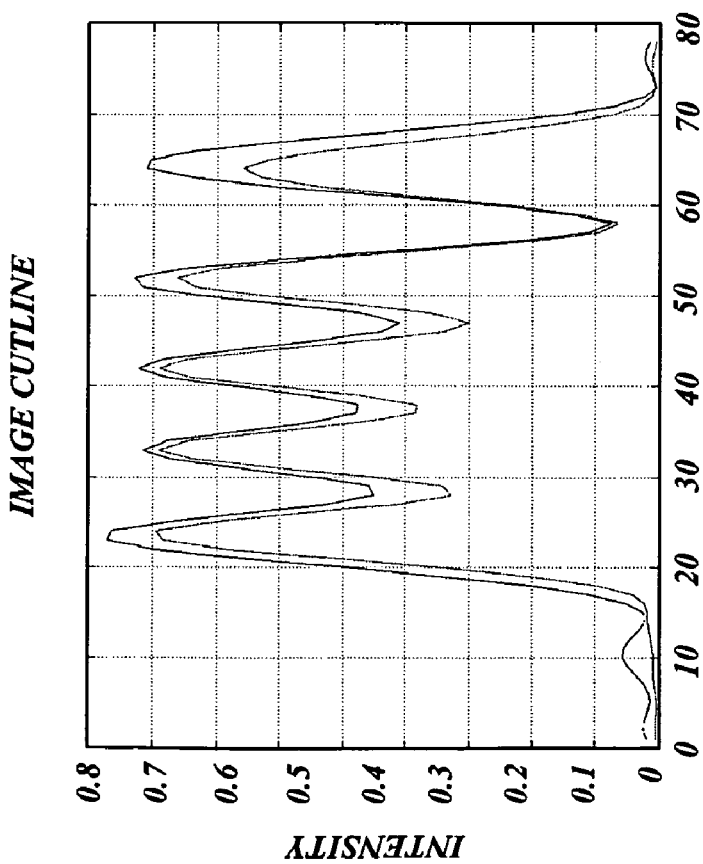
Figure 18A:
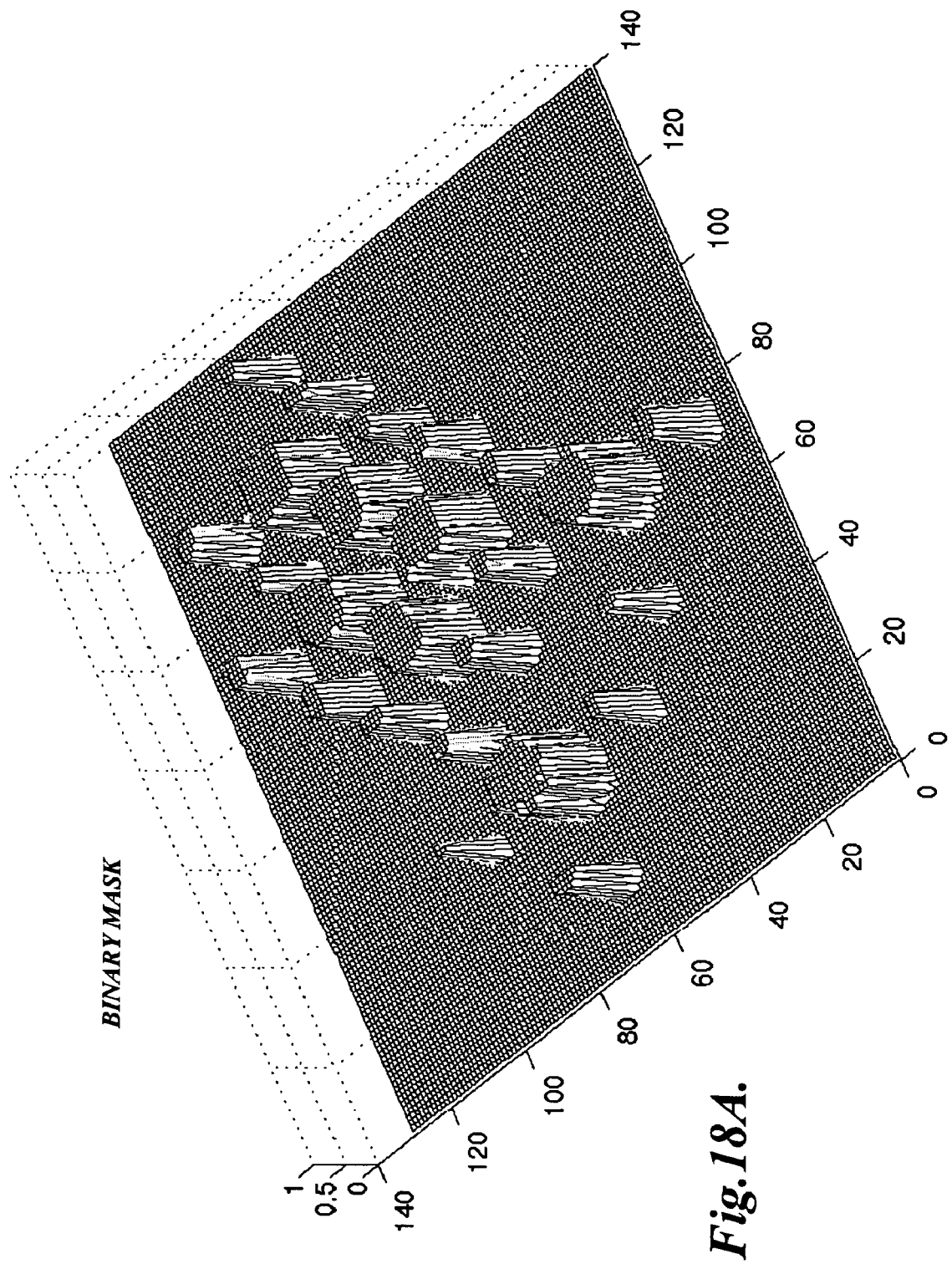
FIGS. 18A-18F illustrate an example of the present invention as applied to contact holes.
Figure 18C:
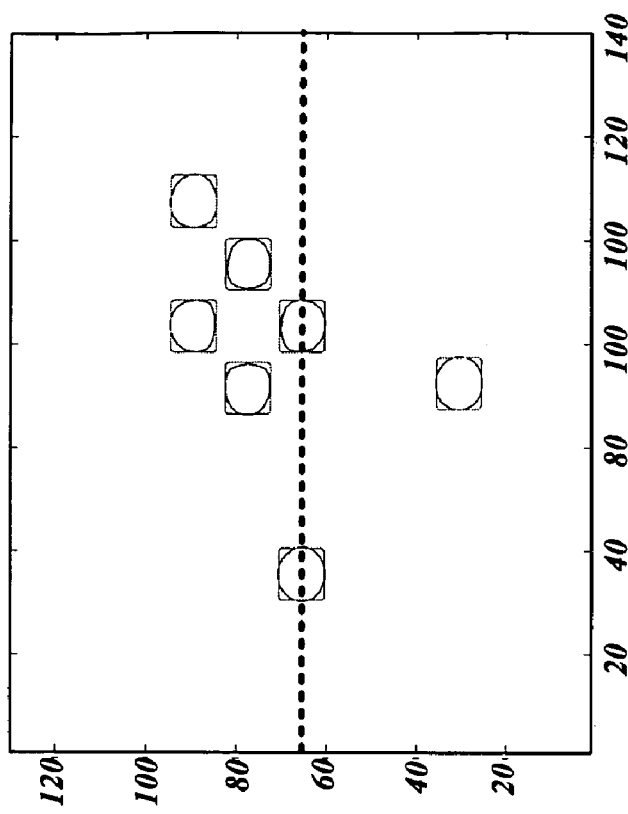
Figure 18B:
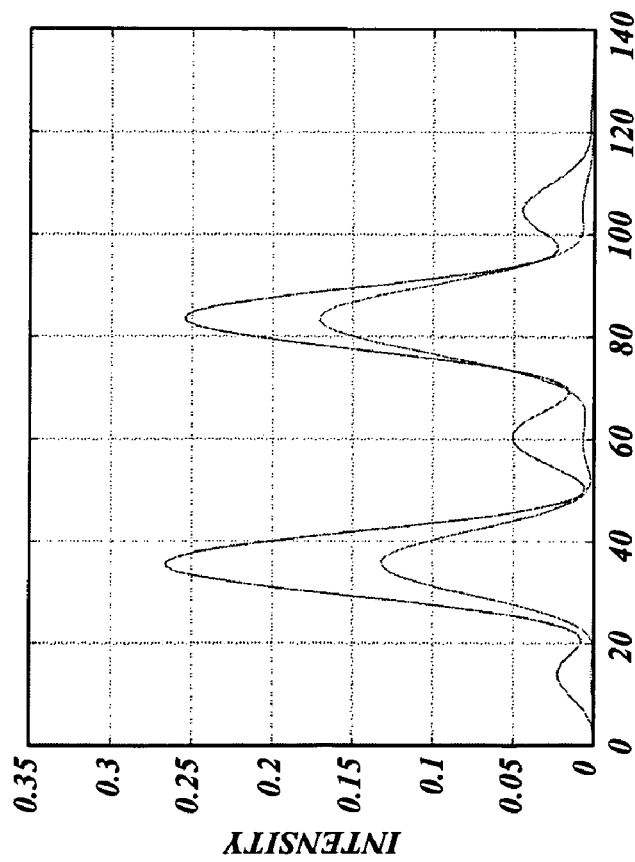
Figure 18D:
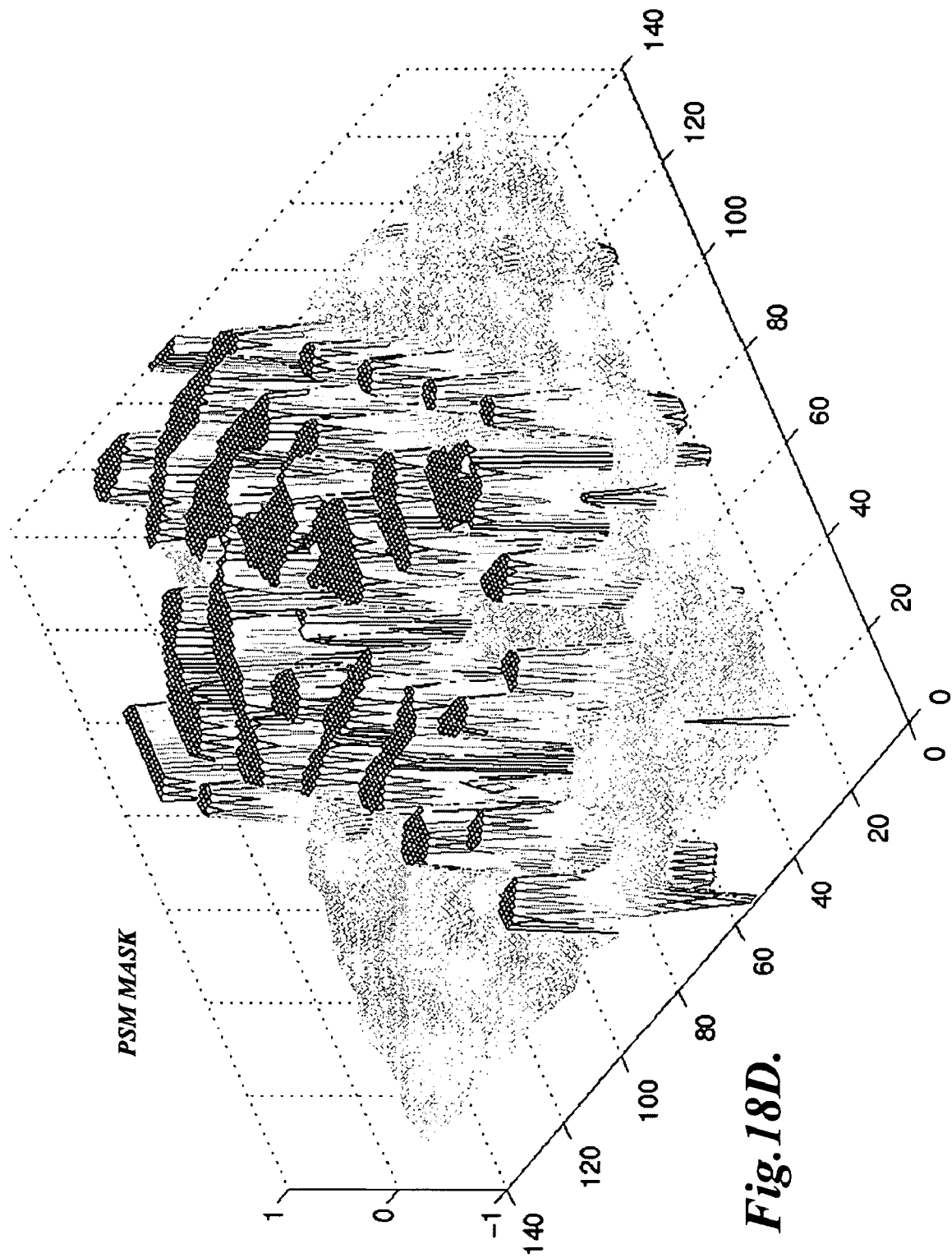
Figure 18F:
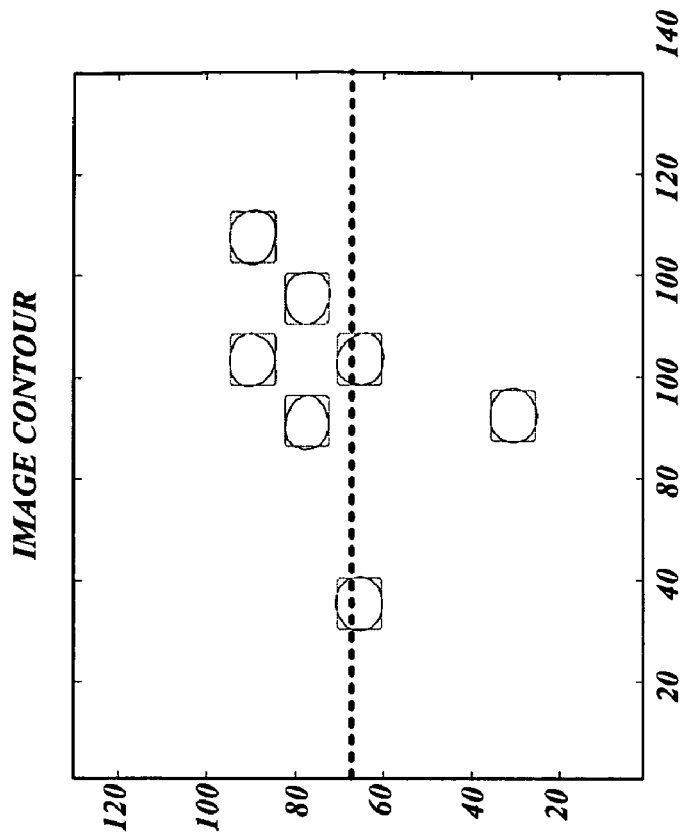
Figure 18E:
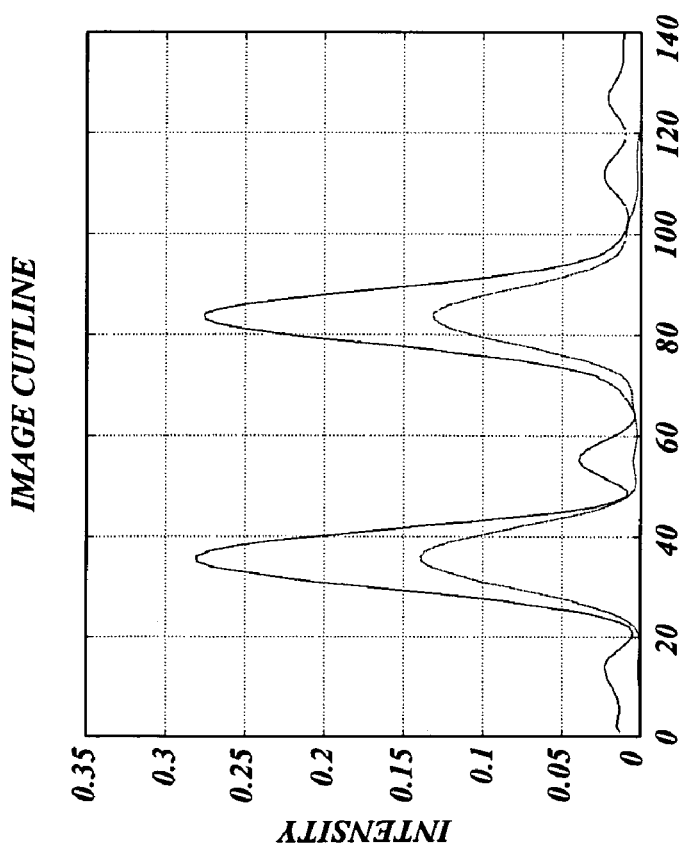

Next example demonstrate solutions when main features have the same phase and assist features can have phase shift, FIGS. 17A-17C. We observe negative transmission of the assists on the mask. The contrast along the cutline is improved in comparison to the ideal case (mask equal target). Contour fidelity is very good, the third inset. The last example is contact holes, FIGS. 18A-18C. The method is capable of inserting assist contacts and deliver complex interferometric assist features in PSM case.

FIGS. 18A-18F illustrates a contact holes example. First row shows binary mask. Small assist contact holes are inserted around main contacts. The image contrast is compared to the case when mask is the same as target. The contrast is improved significantly. Image contours are on target, the third column. Second row demonstrates PSM mask, with complex structure of assists holes, which are hard to separate from the main features. The contrast is even better than for the binary mask. Despite very complex mask, the contours are on target (lower right inset) and sidelobs do not print.

ELECTRICAL FIELD CACHING

The speed of the descent and local variation algorithms critically depends on the ability to quickly re-calculate image intensity when one or a few pixels change. We use electrical field caching procedure to speedup this process.

According to SOCS approximation [3], the image intensity is the following sum of convolutions of kernels $h_i(x, y)$ with the mask $m(x, y)$:

$$I(x, y) = \sum_{i=1}^N \lambda_i A_i(x, y) A_i^*(x, y), \tag{60C}$$

$$A_i = h_i(x, y) * m(x, y).$$

Suppose that we know the electrical fields $A_i^0$ for the mask $m^0$ and want to calculate intensity for the slightly different mask $m'$. Then $$A'_i = A_i^0 + h_i * (m' - m^0). \tag{61C}$$

These convolutions can be quickly calculated by the direct multiplication, which is $O(d \cdot M \cdot N)$ operation, where d is the number of different pixels between $m^0$ and $m'$, M is pixel count of the kernels, and N is number of kernels. This is faster than convolution by FFT when $O(d)$ is smaller than $O(\log(M))$. Constantly updating the cache $A_i^0$, we can quickly re-calculate intensities for small evolutionary mask changes. Formula (61A) is helpful in gradient calculations, because they alter one pixel at a time.

The additivity of the electrical fields can also be exploited to speedup intensity calculations in the line search (61A). If the mask $m^{k-1}$ delivers electrical fields $A_i^{k-1}$, and the mask $p^k$ delivers $B_i^k$, then the intensity from the mask $m = m^{k-1} + \gamma p^k$ can be quickly calculated through its electrical fields $A_i$:

$$A_i = A_i^{k-1} + \gamma B_i^k. \tag{62A}$$

This avoids expensive convolutions of (60C).

In one embodiment of the invention, the optimization function to be minimized in order to define the optimal mask data has the form $$\text{Min} \sum_i w_i \cdot \|I_i - I_{i,ideal}\|^2 \tag{64A}$$

where $I_i$ = image intensity evaluated at a location on the wafer corresponding to a particular pixel in the mask data. Typically $I_i$ has a value ranging between 1 (full illumination) and $\phi$ (no illumination); $I_{i,ideal}$ = the desired image intensity on the wafer at a point corresponding to the pixel and $w_i$ = a weighting factor for each pixel.

As indicated above, the ideal image intensity level for any point on the wafer is typically a binary value having an intensity level of 0 for areas where no light is desired on a wafer and 1 where a maximum amount of light is desired on the wafer. However, in some embodiments, a better result can be achieved if the maximum ideal image intensity is set to a value that is determined from experimental results, such as a test pattern for various pitches produced on a wafer with the same photolithographic processing system that will be used to produce the desired layout pattern in question. A better result can also be achieved if the maximum ideal image intensity is set to a value determined by running an image simulation of a test pattern for various pitches, which predicts intensity values that will be produced on a wafer using the photolithographic processing system that will be used in production for the layout pattern in question.

Figure 21:
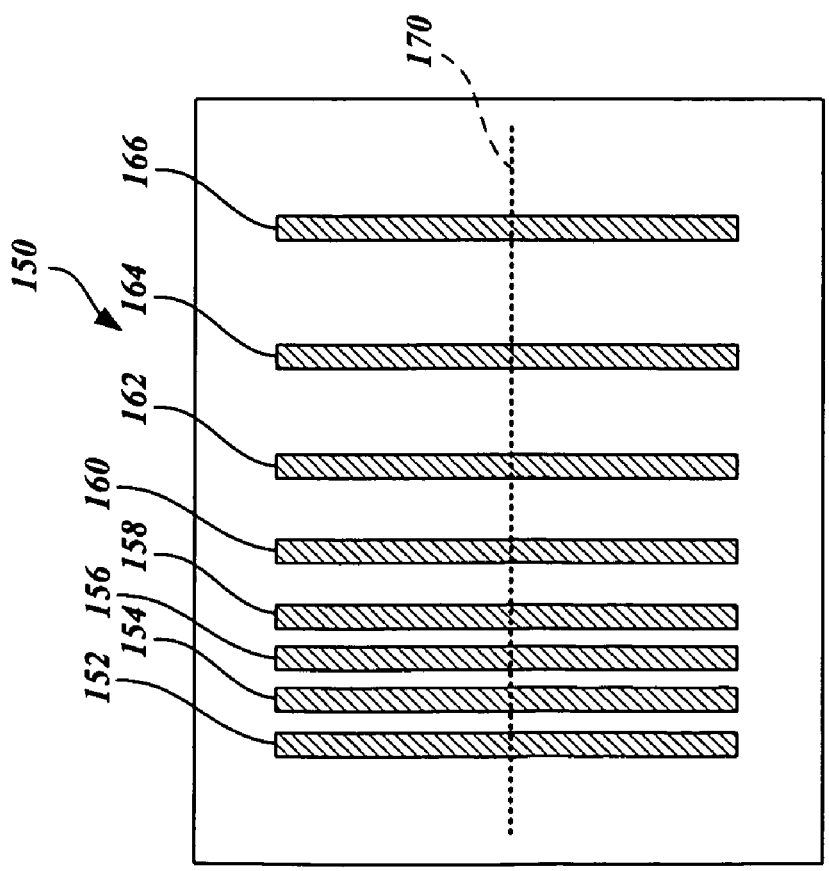
FIG. 21 illustrates one embodiment of a test pattern used to select an ideal intensity threshold in accordance with an embodiment of the present invention.

FIG. 21 illustrates a one example of a test pattern for various pitches 150 having a number of vertically aligned bars 152, 154, 156, . . . 166. As will be appreciated by those skilled in the art, photolithographic processing systems can be characterized by the tightest pattern of features that the system can reliably produce on a wafer. The test pattern for various pitches 150 includes features at this tightest pitch and features that are spaced further apart. In one embodiment of the invention, the maximum ideal image intensity $I_{ideal}$ defined for a point on a wafer is determined by simulating exposure in the photolithographic system using the test pattern 150 and determining the maximum image intensity in the area of the tightest pitch features The minimum ideal image intensity is generally selected to be below the print threshold of the resist materials to be used. Typically, the minimum ideal image intensity is set to zero.

With the maximum ideal image intensity determined using the test pattern 150, the transmission values of the pixels in the mask data that will result in the objective function (64A) being minimized are then determined. Once the transmission values of the pixels has been determined, the mask pixel data is converted to a suitable mask writing format, and provided to a mask writer that produces one or masks. In some embodiments, a desired layout is broken into one or more frames and mask pixel data is determined for each of the frames.

Figure 22:
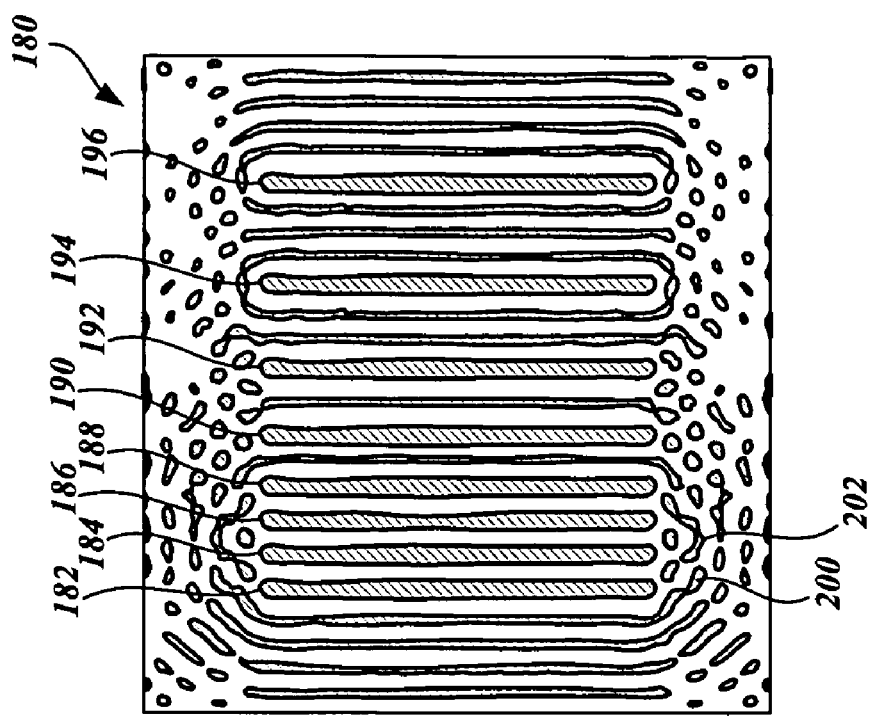
FIG. 22 illustrates one optimized mask data pattern created to produce the test pattern shown in FIG. 21.

FIG. 22 illustrates one example of an optimized mask pattern that will reproduce a desired pattern of features such as the test pattern 150 shown in FIG. 21. The optimized mask data 180 includes a number of larger mask features 182, 184, 186, . . . 196 that, when exposed, will create each of the vertical bars 152-166 in the test pattern. In addition, the optimized data 180 includes a number of additional features 200, 202, etc., surrounding the larger mask features 182-196. The additional features 200, 202 are a result of the mask pixel optimization process described above. In one embodiment of the invention, the additional features 200, 202 are simulated on a mask as subresolution assist features (SRAFs) such that they themselves will not form an image that prints in resist on a wafer when exposed during photolithographic processing.

Figure 23:
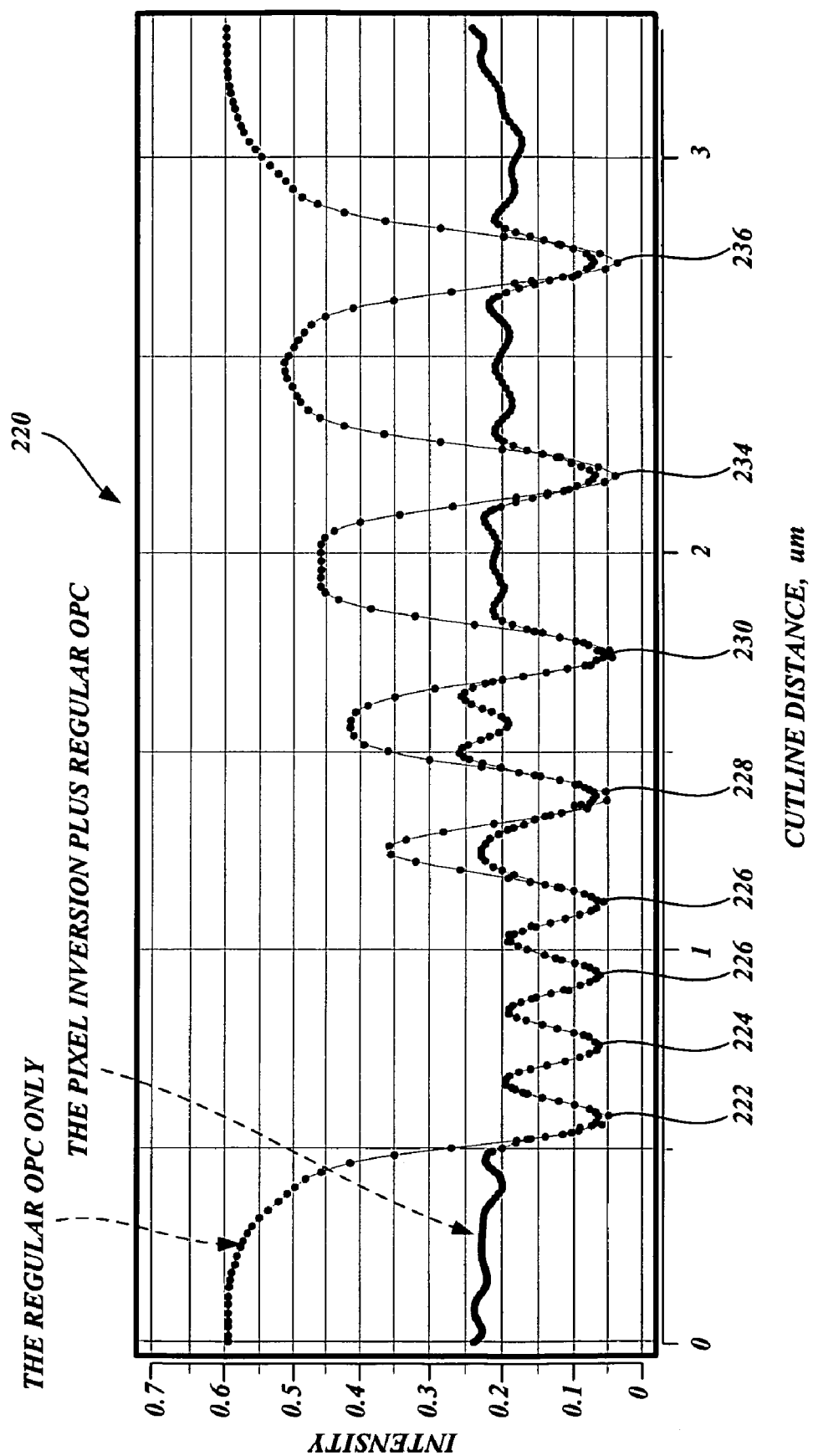
FIG. 23 illustrates the image intensity measured across a cutline of a simulated image of the test pattern shown in FIG. 21 for a conventional OPC corrected mask and an optimized mask pattern created in accordance with an embodiment of the present invention.

FIG. 23 illustrates the simulated image intensity on a wafer when exposed through a conventional mask using the test pattern 150. In addition, FIG. 23 shows a simulation of the image intensity on a wafer when exposed through a mask having optimized mask pattern data such as shown in FIG. 22. In FIG. 23, the graph includes a number of minima 222, 224, 226, . . . 236 where the image intensity is minimized corresponding to each of the vertical bars 152, 154, 156, . . . 166 in the test pattern 150 shown in FIG. 21. Outside the area of the features, the image intensity increases where more light will reach the wafer. With a conventional mask, the variations in intensity are greater and vary between approximately 0.05 and 0.6. However, when a wafer is exposed through a mask having the optimized mask data such as illustrated in FIG. 22, the variations in intensity are smaller such that image intensity varies between approximately 0.05 and approximately 0.25. As can be seen in FIG. 23, the maximum image intensity obtained from an optimized mask pattern such as that shown in FIG. 22 has a more consistent or uniform image intensity because the mask pattern mimics the closely spaced features from the test pattern.

As indicated above, each pixel in the objective function may be weighted by the weight function w. In some embodiments, the weight function is set to 1 for all pixels and no weighting is performed. In other embodiments, the weights of the pixels can be varied by, for example, allowing all pixels within a predetermined distance from the edge of a feature in the ideal image to be weighted more than pixels that are far from the edges of features. In another embodiment, pixels within a predetermined distance from designated tagged features (e.g. features tagged to be recognized as gates, or as contact holes, or as line ends, etc.) are given a different weight. Weighting functions can be set to various levels, depending on the results intended. Typically, pixels near the edge of the ideal image would have a weight w=10, while those further away would have a weight w=1. Likewise, line ends (whose images area known to be difficult to form accurately) may be given a smaller weight w=0.1, while other pixels in the image may be given a weight w=1. Both functions may also be applied (i.e. regions near line ends have a weight w=0.1, and the rest of the image has a weight w=1 except near the edges of the ideal image away from the line ends, where the weight would be w=10). Alternatively, if solutions using SRAFs are desired, and these SRAFs occur at a predetermined spacing relative to main features, weighting functions which have larger values at locations corresponding to these SRAF positions can be constructed.

It should be noted that the absolute values of weighting functions can be set to any value; it is the relative values of the weighting functions across pixels that makes them effective. Typically, distinct regions have relative values that differ by a factor of 10 or more to emphasize the different weights.

In some instances it has been found that by setting the maximum ideal image intensity for use in an objective function to the maximum image intensity for tightly spaced features of the test pattern 150, the process window of the photolithographic processing is increased.

Figures 24A, 24B:
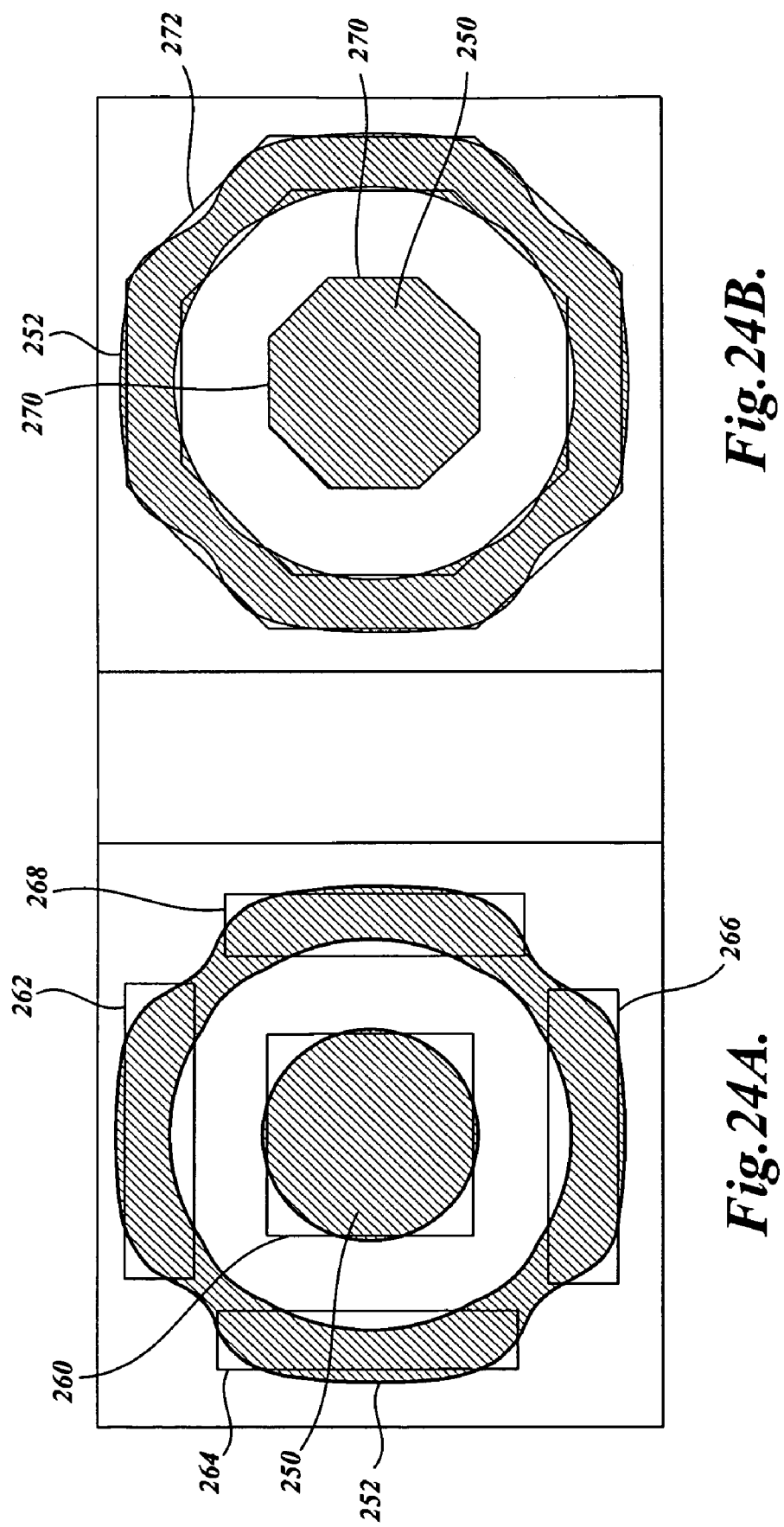
FIGS. 24A and 24B illustrate two techniques for creating mask features to correspond to the optimized mask data.

FIGS. 24A and 24B illustrate two possible techniques for generation of optimized mask data on one or more photolithographic masks. As indicated above, the optimized mask data may produce a set of mask features corresponding to desired layout features to be created on a wafer. In the example shown in FIGS. 24A and 24B, the mask data includes a feature 250 that corresponds to a square via or other small square feature to be created on a wafer. However, the group of mask pixels defining the feature 250 in the optimized mask data has a generally circular shape. Because mask writers are not generally able to easily produce curved or circular structures, the mask data for the mask feature 250 can be simulated with a generally square polygon 260. In addition, the mask data includes an additional feature 252 that is a result of the optimization process. The additional feature 252 surrounds the desired feature 250 and has a generally annular shape. Again, such a curved annular feature would be difficult to accurately produce using most mask writers. One technique for emulating the effect of the annular feature 252 is to use a number of rectangular polygons 262, 264, 266, 268 positioned in the area of the annular feature 252. Each of the polygons 262-268 has a size that is selected such that the polygons act as subresolution assist features (SRAF) and will themselves not print on a wafer.

Some mask writers are capable of producing patterns having angles other than 90°. In this case, an optimized mask data can be approximated using the techniques shown in FIG. 24B. Here the additional feature 252 is approximated by an annular octagon 270 having a number of sides positioned at 45° to each other. The size of the polygons that make up the feature 270 act as SRAFs such that they will not print on the wafer.

While illustrative embodiments have been illustrated and described, it will be appreciated that various changes can be made therein without departing from the scope of the invention as defined by the following claims and equivalents thereof.

The embodiments of the invention in which an exclusive property or privilege is claimed are defined as follows:

1. A computer-implemented method for computing mask data for the creation of one or more photolithographic masks that print a desired layout pattern on a wafer with a photolithographic printing system that is designed to print features at a predefined tightest pitch pattern, comprising:

reading all or a portion of a desired layout pattern by a computer;

defining a set of mask data having a number of pixels that are assigned a transmission value;

determining an objective function that compares a simulation of the image intensity on a wafer to an ideal image intensity;

defining a set of ideal image intensities from the desired layout pattern, wherein the maximum ideal image intensity is selected to be substantially equal to the maximum image intensity determined from a test image of features at the tightest pitch pattern produced by the photolithographic imaging system; and minimizing by the computer the objective function to determine the transmission values of the pixels in the mask data that will produce the desired layout on a wafer.

2. The method of claim 1, further comprising:

weighting the objective function with a weight defined for each mask pixel, wherein the weights are larger for pixels near the edges of features in the ideal image and smaller for other pixels.

3. The method of claim 1, further comprising:

weighting the objective function with a weight defined for each mask pixel, wherein the weights are smaller for pixels near the ends of lines in the ideal image and larger for other pixels.

4. The method of claim 1, further comprising:

computing the mask data in overlapping frames corresponding to portions of the desired layout pattern.

5. The method of claim 1, further comprising including a penalty term in the objective function to steer the minimization of the objective function to a solution that can be manufactured on a mask.

6. The method of claim 5, further comprising defining the penalty term in the objective function as a polynomial having zeroes at desired pixel transmission values.

7. The method of claim 5, wherein the maximum image intensity determined from the test image is made by measuring image intensities on a test wafer.

8. The method of claim 5, wherein the maximum image intensity determined from the test image is made by simulating the printing of the test image.

9. A computer storage medium including a number of instructions that when executed by a computer, cause the computer to perform the method of any of claims 1-8.

* * * * *